(12) United States Patent
Seo et al.

(10) Patent No.: US 12,020,759 B2
(45) Date of Patent: Jun. 25, 2024

(54) OPERATION METHOD OF NONVOLATILE MEMORY DEVICE

(71) Applicant: Samsung Electronics Co., Ltd., Suwon-si (KR)

(72) Inventors: Jun-Ho Seo, Hwaseong-si (KR); Juwon Lee, Hwaseong-si (KR); Suk-Eun Kang, Seoul (KR); Dogyeong Lee, Suwon-si (KR); Youngwook Jeong, Seoul (KR); Sang-Hyun Joo, Suwon-si (KR)

(73) Assignee: SAMSUNG ELECTRONICS CO., LTD., Suwon-si Gyeonggi-do (KR)

(*) Notice: Subject to any disclaimer, the term of this patent is extended or adjusted under 35 U.S.C. 154(b) by 137 days.

(21) Appl. No.: 17/878,019

(22) Filed: Jul. 31, 2022

(65) Prior Publication Data
US 2023/0139427 A1 May 4, 2023

(30) Foreign Application Priority Data
Nov. 4, 2021 (KR) .................. 10-2021-0150595

(51) Int. Cl.
| | |
|---|---|
| G11C 16/34 | (2006.01) |
| G06N 3/08 | (2023.01) |
| G11C 11/56 | (2006.01) |
| G11C 16/04 | (2006.01) |
| G11C 16/10 | (2006.01) |
| G11C 16/16 | (2006.01) |
| G11C 16/24 | (2006.01) |

(52) U.S. Cl.
CPC ........... *G11C 16/3459* (2013.01); *G06N 3/08* (2013.01); *G11C 11/5628* (2013.01); *G11C 11/5635* (2013.01); *G11C 11/5671* (2013.01); *G11C 16/0483* (2013.01); *G11C 16/10* (2013.01); *G11C 16/16* (2013.01); *G11C 16/24* (2013.01); *G11C 16/3495* (2013.01)

(58) Field of Classification Search
CPC .................................. G11C 16/34; G06N 3/08
USPC ..................................................... 365/185.03
See application file for complete search history.

(56) References Cited

U.S. PATENT DOCUMENTS

| | | | |
|---|---|---|---|
| 7,471,559 | B2 | 12/2008 | Shibata |
| 8,085,591 | B2 | 12/2011 | Moschiano et al. |
| (Continued) | | | |

FOREIGN PATENT DOCUMENTS

| | | |
|---|---|---|
| KR | 1020180070974 A | 6/2018 |
| KR | 1020220068541 A | 5/2022 |

*Primary Examiner* — Muna A Techane
(74) *Attorney, Agent, or Firm* — Muir Patent Law, PLLC

(57) ABSTRACT

An operation method of a nonvolatile memory device includes performing a 1-stage program step and a 1-stage verify step on a first word line, storing a first time stamp, performing the 1-stage program step and the 1-stage verify step on a second word line, storing a second time stamp, calculating a delay time based on the first time stamp and the second time stamp, determining whether the delay time is greater than a threshold value, adjusting at least one 2-stage verify voltage associated with the first word line from a first voltage level to a second voltage level based on the delay time, and performing a 2-stage program step and a 2-stage verify step on the first word line. A level of the at least one 1-stage verify voltage is lower than the second voltage level, and the second voltage level is lower than the first voltage level.

20 Claims, 34 Drawing Sheets

(56) References Cited

U.S. PATENT DOCUMENTS

| | | |
|---|---|---|
| 8,472,247 B2 | 6/2013 | Yoon et al. |
| 8,902,651 B2 | 12/2014 | Kwak et al. |
| 9,875,805 B2 | 1/2018 | Tseng et al. |
| 10,643,723 B2 | 5/2020 | Umezawa |
| 2008/0298124 A1* | 12/2008 | Wong ................ G11C 16/3459 365/185.24 |
| 2011/0103151 A1* | 5/2011 | Kim .................... G11C 11/5628 365/185.22 |
| 2016/0093384 A1* | 3/2016 | Lee ....................... G11C 16/24 365/185.12 |
| 2018/0173432 A1 | 6/2018 | Han |
| 2021/0011658 A1 | 1/2021 | Tai et al. |
| 2022/0157393 A1 | 5/2022 | Park et al. |

\* cited by examiner

FIG. 5

|     | 1-Stage Program | 2-Stage Program |
|-----|-----------------|-----------------|
| WL8 | 1               | 3               |
| WL7 | 2               | 5               |
| WL6 | 4               | 7               |
| WL5 | 6               | 9               |
| WL4 | 8               | 11              |
| WL3 | 10              | 13              |
| WL2 | 12              | 15              |
| WL1 | 14              | 16              |

FIG. 7

| R1(RT1,RT2) | | R2(RT2,RT3) | | R3(RT3,RT4) | | R4(RT4,RT5) | |
|---|---|---|---|---|---|---|---|
| VFY21 | $\triangle$VFY1_1 | VFY21 | $\triangle$VFY1_2 | VFY21 | $\triangle$VFY1_3 | VFY21 | $\triangle$VFY1_4 |
| VFY22 | $\triangle$VFY2_1 | VFY22 | $\triangle$VFY2_2 | VFY22 | $\triangle$VFY2_3 | VFY22 | $\triangle$VFY2_4 |
| VFY23 | $\triangle$VFY3_1 | VFY23 | $\triangle$VFY3_2 | VFY23 | $\triangle$VFY3_3 | VFY23 | $\triangle$VFY3_4 |
| VFY24 | $\triangle$VFY4_1 | VFY24 | $\triangle$VFY4_2 | VFY24 | $\triangle$VFY4_3 | VFY24 | $\triangle$VFY4_4 |
| VFY25 | $\triangle$VFY5_1 | VFY25 | $\triangle$VFY5_2 | VFY25 | $\triangle$VFY5_3 | VFY25 | $\triangle$VFY5_4 |
| VFY26 | $\triangle$VFY6_1 | VFY26 | $\triangle$VFY6_2 | VFY26 | $\triangle$VFY6_3 | VFY26 | $\triangle$VFY6_4 |
| VFY27 | $\triangle$VFY7_1 | VFY27 | $\triangle$VFY7_2 | VFY27 | $\triangle$VFY7_3 | VFY27 | $\triangle$VFY7_4 |

| R1(RC1,RC2) | | R2(RC2,RC3) | | R3(RC3,RC4) | | R4(RC4,RC5) | |
|---|---|---|---|---|---|---|---|
| VFY21 | △VFY1_5 | VFY21 | △VFY1_6 | VFY21 | △VFY1_7 | VFY21 | △VFY1_8 |
| VFY22 | △VFY2_5 | VFY22 | △VFY2_6 | VFY22 | △VFY2_7 | VFY22 | △VFY2_8 |
| VFY23 | △VFY3_5 | VFY23 | △VFY3_6 | VFY23 | △VFY3_7 | VFY23 | △VFY3_8 |
| VFY24 | △VFY4_5 | VFY24 | △VFY4_6 | VFY24 | △VFY4_7 | VFY24 | △VFY4_8 |
| VFY25 | △VFY5_5 | VFY25 | △VFY5_6 | VFY25 | △VFY5_7 | VFY25 | △VFY5_8 |
| VFY26 | △VFY6_5 | VFY26 | △VFY6_6 | VFY26 | △VFY6_7 | VFY26 | △VFY6_8 |
| VFY27 | △VFY7_5 | VFY27 | △VFY7_6 | VFY27 | △VFY7_7 | VFY27 | △VFY7_8 |

253_1, 253_2, 253_3, 253_4, 253

|  | PGM1 | PGM2 | PGM3 |
|---|---|---|---|
| WL3 | 4 |  |  |
| WL2 | 2 | 5 |  |
| WL1 | 1 | 3 | 6 |

OPERATION METHOD OF NONVOLATILE MEMORY DEVICE

CROSS-REFERENCE TO RELATED APPLICATION(S)

This application claims priority under 35 U.S.C. § 119 to Korean Patent Application No. 10-2021-0150595 filed on Nov. 4, 2021, in the Korean Intellectual Property Office, the disclosure of which is incorporated by reference herein in its entirety.

BACKGROUND

Embodiments of the present disclosure described herein relate to a semiconductor memory, and more particularly, relate to an operation method of a nonvolatile memory device.

Semiconductor memory devices are classified as a volatile memory device, in which stored data disappear when a power supply is turned off, such as a static random access memory (SRAM) or a dynamic random access memory (DRAM), or a nonvolatile memory device, in which stored data are retained even when a power supply is turned off, such as a flash memory device, a phase-change RAM (PRAM), a magnetic RAM (MRAM), a resistive RAM (RRAM), or a ferroelectric RAM (FRAM).

The flash memory device may perform a program operation for each page or for each word line. In general, because a program voltage is a high voltage, when memory cells of a selected word line are programmed, the degradation (e.g., the degradation due to the coupling between word lines) occurs in memory cells of a word line adjacent to the selected word line. The degradation of memory cells causes a decrease in the reliability of the flash memory device.

SUMMARY

Embodiments of the present disclosure provide an operation method of a nonvolatile memory device having improved reliability.

According to an embodiment, there is provided an operation method of a nonvolatile memory device which includes a plurality of memory blocks, wherein each of the plurality of memory blocks includes a plurality of strings connected between a bit line and a common source line, each of the plurality of strings includes a plurality of memory cells connected in series, and the plurality of memory cells are respectively connected to a plurality of word lines stacked in a direction perpendicular to a substrate. The method includes performing a 1-stage program step of a 1-stage program operation and a 1-stage verify step of the 1-stage program operation on a first word line of the plurality of word lines, wherein a program voltage is applied to the first word line in the 1-stage program step and at least one 1-stage verify voltage of a plurality of 1-stage verify voltages is applied to the first word line after performing the 1-stage program step on the first word line, storing a first time stamp indicating a time at which the 1-stage program operation for the first word line is completed, after performing the 1-stage program operation, performing the 1-stage program step of the 1-stage program operation on a second word line adjacent to the first word line and the 1-stage verify step of the 1-stage program operation on the second word line after performing the 1-stage program step on the second word line, storing a second time stamp indicating a time at which the 1-stage program operation for the second word line is completed, calculating a delay time based on the first time stamp and the second time stamp, determining whether the delay time is greater than or equal to a threshold value, adjusting at least one 2-stage verify voltage of a plurality of 2-stage verify voltages associated with the first word line from a first voltage level to a second voltage level based on the delay time, when it is determined that the delay time is greater than or equal to the threshold value, and after performing the 1-stage program operation on the second word line, performing a 2-stage program step of a 2-stage program operation on the first word line and a 2-stage verify step of the 2-stage program operation on the first word line after performing the 2-stage program step on the first word line, wherein a program voltage is applied to the first word line in the 2-stage program step and the adjusted at least one 2-stage verify voltage is applied to the first word line. A level of the at least one 1-stage verify voltage is lower than the second voltage level of the adjusted at least one 2-stage verify voltage, and the second voltage level is lower than the first voltage level.

According to an embodiment, there is provided an operation method of a nonvolatile memory device which includes a plurality of memory blocks, wherein each of the plurality of memory blocks includes a plurality of strings connected between a bit line and a common source line, each of the plurality of strings includes a plurality of memory cells connected in series, and the plurality of memory cells are respectively connected to a plurality of word lines stacked in a direction perpendicular to a substrate. The method includes performing a 1-stage program step of a 1-stage program operation and a 1-stage verify step of the 1-stage program operation on a first word line, wherein a program voltage is applied to a first word line of the plurality of word lines in the 1-stage program step and at least one 1-stage verify voltage of a plurality of 1-stage verify voltages is applied to the first word line after performing the 1-stage program step on the first word line, after performing the 1-stage program operation on the first word line, generating and storing a first cell count by performing an off-cell count operation on the first word line based on a reference voltage corresponding to an uppermost program state, after performing the 1-stage program operation on the first word line, performing the 1-stage program step of the 1-stage program operation on a second word line adjacent to the first word line and the 1-stage verify step of the 1-stage program operation on the second word line after performing the 1-stage program step on the second word line, after performing the 1-stage program operation on the second word line, generating and storing a third cell count by performing the off-cell count operation on the second word line based on the reference voltage, after performing the 1-stage program operation on the second word line, generating and storing a second cell count by performing the off-cell count operation on the first word line based on the reference voltage, calculating a cell count difference based on the first cell count and the second cell count, determining whether the cell count difference is greater than or equal to a threshold value, adjusting at least one 2-stage verify voltage of a plurality of 2-stage verify voltages associated with the first word line from a first voltage level to a second voltage level based on the cell count difference, when it is determined that the cell count difference is greater than or equal to the threshold value, and after performing the 1-stage program operation on the second word line, performing a 2-stage program step of a 2-stage program operation and a 2-stage verify step of the 2-stage program operation, wherein a program voltage is applied to the first word line in the 2-stage program step and the at least one 2-stage verify voltage is applied to the first word line after performing the 2-stage program step on the first word line. A level of the at least one 1-stage verify voltage is lower than the second voltage level of the adjusted at least one 2-stage verify voltage corresponding to the at least one 1-stage verify voltage, and the second voltage level is lower than the first voltage level.

According to an embodiment, there is provided an operation method of a nonvolatile memory device which includes a plurality of memory blocks, wherein each of the plurality of memory blocks includes a plurality of strings connected between a bit line and a common source line, each of the plurality of strings includes a plurality of memory cells connected in series, and the plurality of memory cells are respectively connected to a plurality of word lines stacked in a direction perpendicular to a substrate. The method includes performing a 1-stage program step of a 1-stage program operation on a first word line of the plurality of word lines, performing a 1-stage verify step of the 1-stage program operation on the first word line, and performing a 1-stage shallow erase step of the 1-stage program operation on the first word line, wherein a program voltage is applied to a first word line in the 1-stage program step, at least one 1-stage verify voltage of a plurality of 1-stage verify voltages is applied to the first word line after performing the 1-stage program step on the first word line, and a word line erase voltage is applied to the first word line in the 1-stage shallow erase step after performing the 1-stage verify step on the first word line, storing a first time stamp indicating a time at which the 1-stage program operation for the first word line is completed, after performing the 1-stage program operation on the first word line, performing the 1-stage program step of the 1-stage program operation on a second word line adjacent to the first word line, performing the 1-stage verify step of the 1-stage program operation on the second word line after performing the 1-stage program step on the second word line, and performing the 1-stage shallow erase step of the 1-stage program operation on the second word line after performing the 1-stage verify step on the second word line, storing a second time stamp indicating a time at which the 1-stage program operation for the second word line is completed, calculating a delay time based on the first time stamp and the second time stamp, determining whether the delay time is greater than or equal to a threshold value, adjusting at least one 2-stage verify voltage of a plurality of 2-stage verify voltages associated with the first word line from a first voltage level to a second voltage level based on the delay time, when it is determined that the delay time is greater than or equal to the threshold value, and after performing the 1-stage program operation on the second word line, performing a 2-stage program step of a 2-stage program operation and a 2-stage verify step of the 2-stage program operation, wherein a program voltage is applied to the first word line in the 2-stage program step and the at least one 2-stage verify voltage is applied to the first word line after performing the 2-stage program step on the first word line. A level of the at least one 1-stage verify voltage is lower than the second voltage level of the adjusted at least one 2-stage verify voltage corresponding to the at least one 1-stage verify voltage, and the second voltage level is lower than the first voltage level.

BRIEF DESCRIPTION OF THE FIGURES

The above and other objects and features of the present disclosure will become apparent by describing in detail embodiments thereof with reference to the accompanying drawings.

FIG. 5 is a diagram for describing a reprogram operation of a nonvolatile memory device of FIG. 1 according to example embodiments.

FIG. 7 is a diagram illustrating an example of a VVL LUT of FIG. 1 according to example embodiments.

FIG. 14 is a diagram illustrating an example of a VVL LUT of FIG. 12 according to example embodiments.

DETAILED DESCRIPTION

Below, example embodiments of the present disclosure will be described in detail and clearly to such an extent that one skilled in the art easily carries out the present disclosure.

Figure 1:
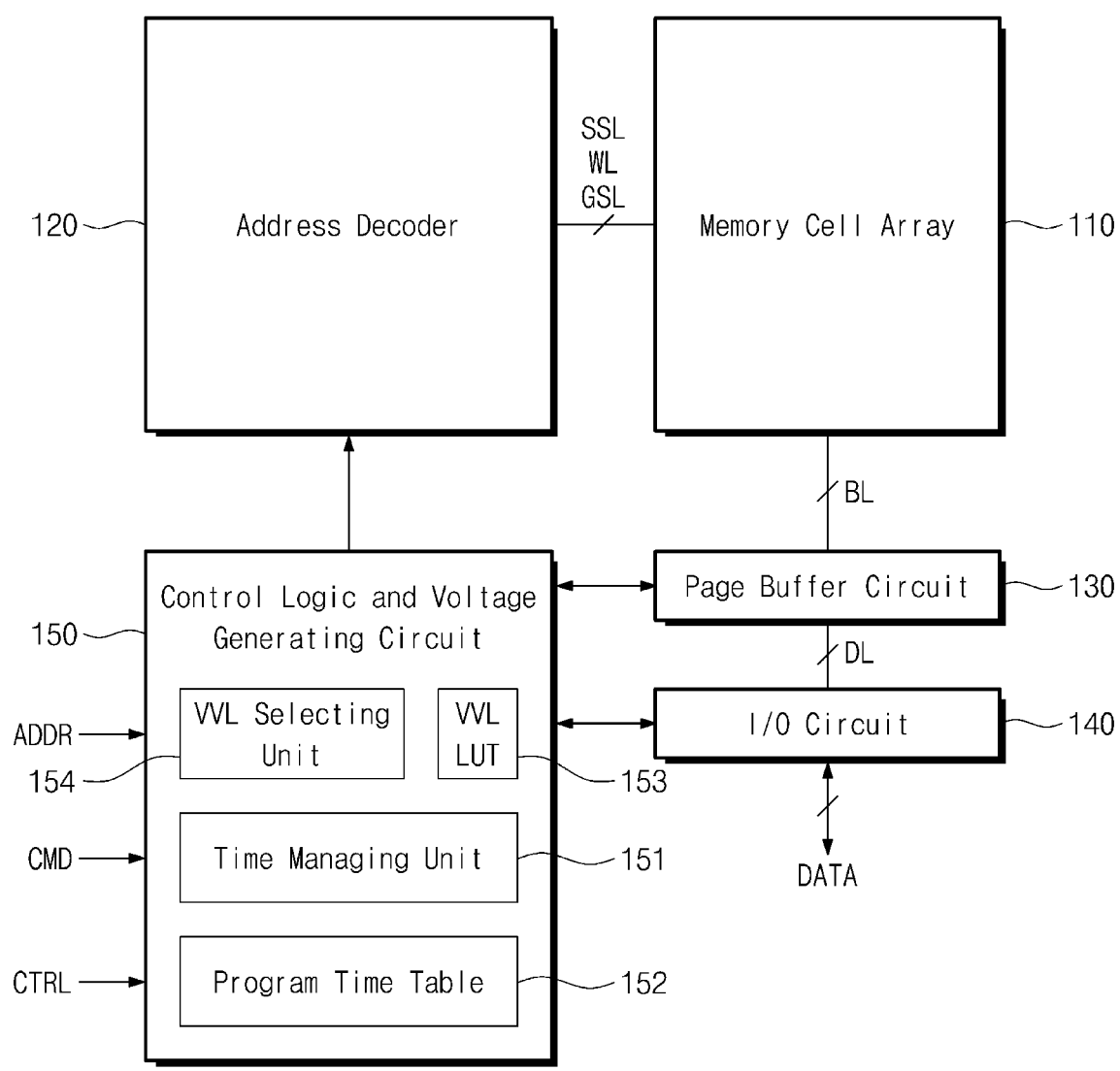
FIG. 1 illustrates a nonvolatile memory device according to an embodiment of the present disclosure.

FIG. 1 illustrates a nonvolatile memory device according to an embodiment of the present disclosure. Referring to FIG. 1, a nonvolatile memory device 100 may include a memory cell array 110, an address decoder 120, a page buffer circuit 130, an input/output circuit 140, and a control logic and voltage generating circuit 150. In an embodiment, the nonvolatile memory device 100 may be a nonvolatile memory device such as a NAND flash memory device, but the present disclosure is not limited thereto.

For example, the memory cell array 110 may be a core of the nonvolatile memory device 100, and the address decoder 120, the page buffer circuit 130, the input/output circuit 140, and the control logic and voltage generating circuit 150 may be a peripheral circuit of the nonvolatile memory device 100. The peripheral circuit may be configured to access the core. Herein, the peripheral circuit of the nonvolatile memory device 100 may include a plurality of circuits other than the memory cell array 110.

The memory cell array 110 may include a plurality of memory blocks. Each of the plurality of memory blocks may be connected to string selection lines SSL, word lines WL, ground selection lines GSL, and bit lines BL. A configuration of the plurality of memory blocks will be described in detail with reference to FIG. 2.

The address decoder 120 may receive an address ADDR from an external device (e.g., a memory controller) or the control logic and voltage generating circuit 150. The address decoder 120 may decode the address ADDR and may control or drive voltages of the string selection lines SSL, the word lines WL, and the ground selection lines GSL based on a decoding result. For example, the address decoder 120 may receive operation voltages generated by the control logic and voltage generating circuit 150 and may provide a corresponding operation voltage to each of the string selection lines SSL, the word lines WL, and the ground selection lines GSL based on the decoded result.

The page buffer circuit 130 may be connected to the memory cell array 110 through the bit lines BL. The page buffer circuit 130 may receive data "DATA" from the input/output circuit 140 and may temporarily store the received data "DATA". The page buffer circuit 130 may control voltages of the bit lines BL such that the temporarily stored data "DATA" are stored in the memory cell array 110. Alternatively, the page buffer circuit 130 may read the data "DATA" stored in the memory cell array 110 by sensing changes in voltages of the bit lines BL. The page buffer circuit 130 may provide the read data "DATA" to the input/output circuit 140.

The input/output circuit 140 may exchange the data "DATA" with the external device (e.g., a memory controller). In an embodiment, in synchronization with a data strobe signal, the input/output circuit 140 may output the data "DATA" to the external device or may receive the data "DATA" from the external device.

The control logic and voltage generating circuit 150 may generate various operation voltages (e.g., a plurality of program voltages, a plurality of verify voltages, a plurality of read voltages, and a plurality of erase voltages) necessary for the nonvolatile memory device 100 to operate. The control logic and voltage generating circuit 150 may receive a command CMD, the address ADDR, and a control signal CTRL from the external device (e.g., a memory controller). The control logic and voltage generating circuit 150 may control various components of the nonvolatile memory device 100 based on the received command CMD. Below, for convenience of description, the control logic and voltage generating circuit 150 is referred to as a "control logic circuit".

The control logic circuit 150 may include a time managing unit 151, a program time table 152, a verify voltage level look-up table (VVL LUT) 153, a verify voltage level selecting unit (hereinafter referred to as a "VVL selecting unit") 154. As used herein, a "unit" may refer to a "circuit."

In an embodiment, the nonvolatile memory device 100 according to the present disclosure may store the data "DATA" in the memory cell array 110 through a reprogram manner. For example, the reprogram manner may indicate repeatedly programming a plurality of pages at a selected word line. According to the reprogram manner, after an operation of receiving a plurality of pages and an operation of repeatedly programming the plurality of pages are repeatedly performed as much as the given number of times (e.g., two times), it may be possible to read the plurality of pages. The reprogram manner according to the present disclosure may include a 1-stage program operation and a 2-stage program operation. The reprogram manner will be described in detail with reference to FIG. 3.

In the case where a delay is present between the 1-stage program operation and the 2-stage program operation, the nonvolatile memory device 100 may adjust a verify voltage (hereinafter referred to as a "2-stage verify voltage") that is used in a verify step of the 2-stage program operation. As such, the reliability of the nonvolatile memory device 100 may be improved.

In an embodiment, the time managing unit 151 may manage various times according to a physical characteristic of the nonvolatile memory device 100. For example, the time managing unit 151 may manage program times (e.g., a 1-stage program step time and a 2-stage program step time) and a delay time associated with a plurality of memory cells, a plurality of pages, a plurality of word lines, a plurality of memory blocks, etc. included in the nonvolatile memory device 100. For example, a 1-stage program time 1-SPT indicates a time point at which the 1-stage program operation of each of the plurality of word lines is completed. In other words, the 1-stage program time 1-SPT indicates a time point when a 1-stage verify step is completed after a 1-stage program step starts. A delay time DT indicates a time period from a point in time when the 1-stage program operation for a k-th word line is completed to a point in time when the 2-stage program operation for the k-th word line starts. Alternatively, the delay time DT indicates a time period from a point in time when the 1-stage program operation for a k-th word line is completed to a point in time when the 1-stage program operation for a (k−1)-th word line being a word line adjacent to the k-th word line is completed.

For example, the time managing unit 151 may include a timer (not illustrated). The timer may count a clock to generate a current time. The clock may be an external clock received from the outside or an internal clock generated in the nonvolatile memory device 100. The current time may be an absolute time. Alternatively, the current time may be a relative time to a reference time. The time managing unit 151 may manage various times by using the current time generated by the timer.

In an embodiment, the time managing unit 151 may store the 1-stage program time 1-SPT. For example, the time managing unit 151 may store the 1-stage program time 1-SPT in a peripheral circuit or the memory cell array 110 of the nonvolatile memory device 100.

In an embodiment, the time managing unit 151 may store the 1-stage program time 1-SPT by using the program time table 152. For example, the time managing unit 151 may manage the 1-stage program time 1-SPT in units of word line, but the present disclosure is not limited thereto. For example, the time managing unit 151 may manage the 1-stage program time 1-SPT for each page, for each word line, for each sub-block, for each memory block, or for each plane.

In an embodiment, the time managing unit 151 may calculate the delay time DT. For example, the time managing unit 151 may calculate the delay time DT with reference to the program time table 152. For example, the time managing unit 151 may calculate the delay time DT based on time stamps stored in the program time table 152. For example, the time managing unit 151 may calculate a difference between a 1-stage program time of the k-th word line and a 1-stage program time of the (k−1)-th word line as the delay time DT. The time managing unit 151 may provide the delay time DT to the VVL selecting unit 154.

The program time table 152 may include the 1-stage program time 1-SPT of each of a plurality of word lines. The program time table 152 will be described in detail with reference to FIG. 6.

The VVL LUT 153 may include mapping information about 2-stage verify voltage level differences according to the delay times DT. For example, the VVL LUT 153 may be managed in units of memory block. The VVL LUT 153 may be determined in advance or updated depending on the number of program/erase cycles of a memory block and a characteristic of a memory block. For example, the VVL LUT 153 may be managed in units of word line. The VVL LUT 153 may be determined in advance or updated depending on a location of a word line. Alternatively, the VVL LUT 153 may be managed in units of plural verify voltages. The VVL LUT 153 may be determined in advance or updated with respect to each of a plurality of verify voltages. The VVL LUT 153 may be managed based on a combination of the above embodiments. The VVL LUT 153 may be determined in advance or updated based on a combination of the above embodiments. The VVL LUT 153 will be described in detail with reference to FIG. 7.

The VVL selecting unit 154 may select a 2-stage verify voltage level based on the delay time DT. The VVL selecting unit 154 may receive the delay time DT from the time managing unit 151. The VVL selecting unit 154 may refer to verify voltage level difference information of the VVL LUT 153 for the purpose of selecting the 2-stage verify voltage level. The VVL selecting unit 154 may adjust 2-stage verify voltage levels. The VVL selecting unit 154 may output a new verify voltage, the voltage level of which is adjusted. The VVL selecting unit 154 may be implemented in the form of hardware.

In the case where the delay time DT increases after the 1-stage program operation is completed, a threshold voltage distribution may be changed. As such, in the case where the 2-stage verify step of memory cells is performed by using a given verify voltage (or a default verify voltage), a final distribution of the memory cells may be different from an intended distribution. For example, the final distribution of the memory cells may be shifted in a direction in which a threshold voltage increases. To solve this issue, the nonvolatile memory device 100 may adjust the 2-stage verify voltage level. How to adjust a verify voltage level will be described in detail with reference to the following drawings.

Figure 2:
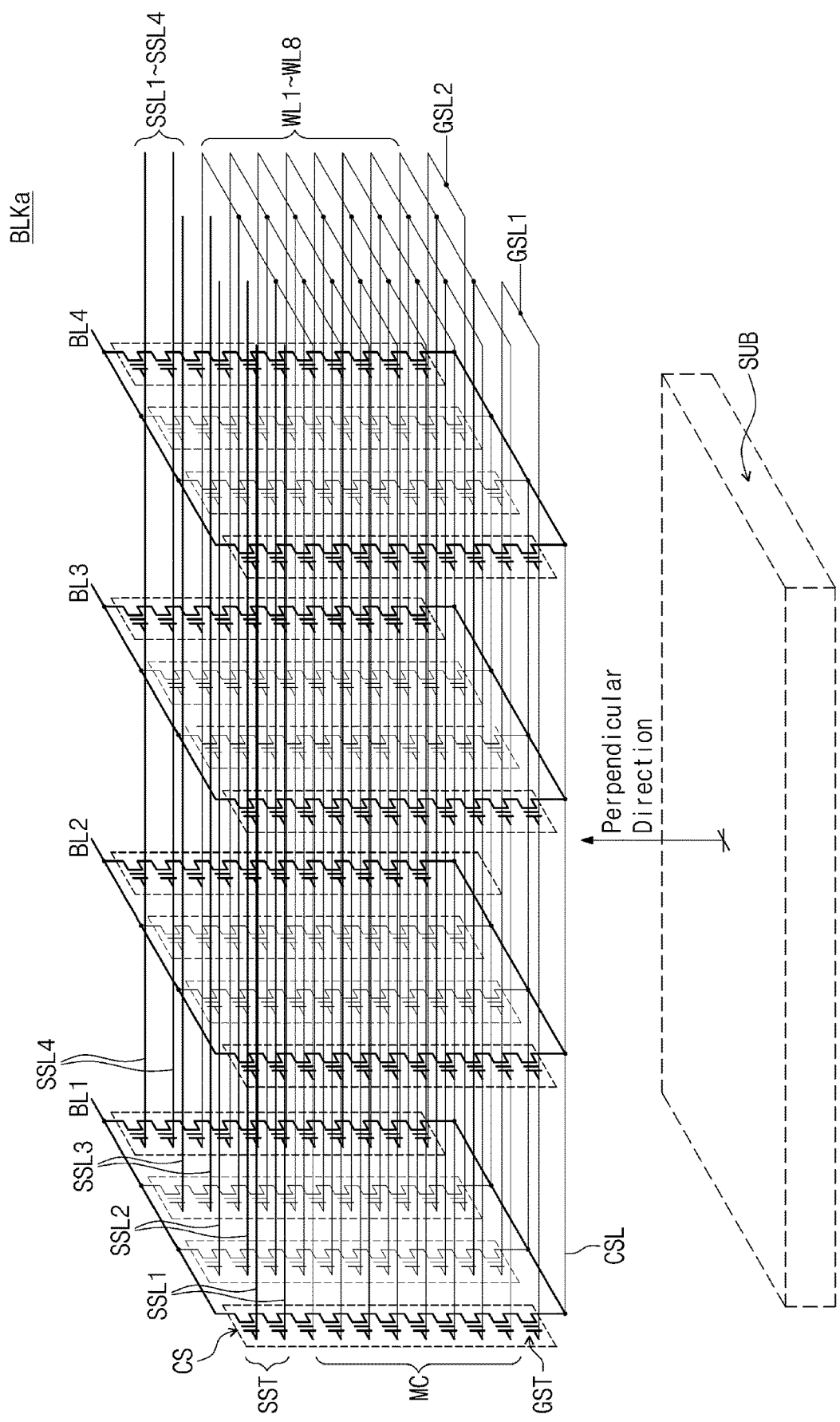
FIG. 2 is a circuit diagram of an example of one memory block of memory blocks of FIG. 1 according to example embodiments.

FIG. 2 is a circuit diagram of an example of one memory block BLKa of memory blocks of FIG. 1 according to example embodiments. Referring to FIGS. 1 and 2, a plurality of cell strings CS may be arranged on a substrate SUB in rows and columns. The plurality of cell strings CS may be connected in common to a common source line CSL formed on (or in) the substrate SUB. In FIG. 2, a location of the substrate SUB is depicted as an example for better understanding of the structure of the memory block BLKa.

An example in the common source line CSL is connected to lower ends of the cell strings CS is illustrated in FIG. 2. However, it is sufficient if the common source line CSL is electrically connected to the lower ends of the cell strings CS, and the present disclosure is not limited to the case that the common source line CSL is physically located at the lower ends of the cell strings CS. An example in which the cell strings CS are arranged in a 4×4 matrix is illustrated in FIG. 2, but the number of cell strings CS in the memory block BLKa may increase or decrease.

Cell strings in each row may be connected in common to a ground selection line GSL1 or GSL2. For example, cell strings in first and second rows may be connected in common to the first ground selection line GSL1, and cell strings in third and fourth rows may be connected in common to the second ground selection line GSL2.

The cell strings in each row may be connected in common to corresponding string selection lines of first to fourth string selection lines SSL1 to SSL4. Cell strings in each column may be connected to a corresponding bit line of first to fourth bit lines BL1 to BL4. To prevent a drawing from being complicated, the cell strings CS connected to the second and third string selection lines SSL2 and SSL3 are depicted to be blurred.

Each cell string may include at least one ground selection transistor GST connected to the ground selection line GSL1 or GSL2, a plurality of memory cells MC1 to MC8 respectively connected to a plurality of word lines WL1 to WL8, and string selection transistors SST respectively connected to the string selection lines SSL1, SSL2, SSL3, or SSL4. For example, the memory cell MC1 is disposed adjacent to the ground selection line GSL1 or GSL2 and memory cell MC8 is disposed adjacent to the string selection lines of first to fourth string selection lines SSL1 to SSL4.

In each cell string, the ground selection transistor GST, the memory cells MC1 to MC8, and the string selection transistors SST may be connected in series along a direction perpendicular to the substrate SUB and may be sequentially stacked along the direction perpendicular to the substrate SUB. In each cell string, at least one of the memory cells MC1 to MC8 may be used as a dummy memory cell. The dummy memory cell may not be programmed (e.g., may be program-inhibited) or may be programmed differently from the remaining memory cells of the memory cells MC1 to MC8 other than the dummy memory cell.

In an embodiment, memory cells of cell strings, which belong to each row and are located at the same height, may form one physical page. Memory cells constituting one physical page may be connected to one sub-word line. Sub-word lines of physical pages located at the same height may be connected in common with one word line.

In an embodiment, sub-word lines of physical pages placed at the same height may be connected to each other at a height at which the sub-word lines are formed. As another example, sub-word lines of physical pages placed at the same height may be indirectly connected to each other in any other layer, which has a height different from a height at which the sub-word lines are formed, such as a metal layer.

In an embodiment, when the memory block BLKa is implemented in a three-dimensional structure, characteristics of the memory cells MC may be differently implemented depending on heights of the memory cells MC. For example, sizes of the memory cells MC may change depending on heights of the memory cells MC.

Figure 3:
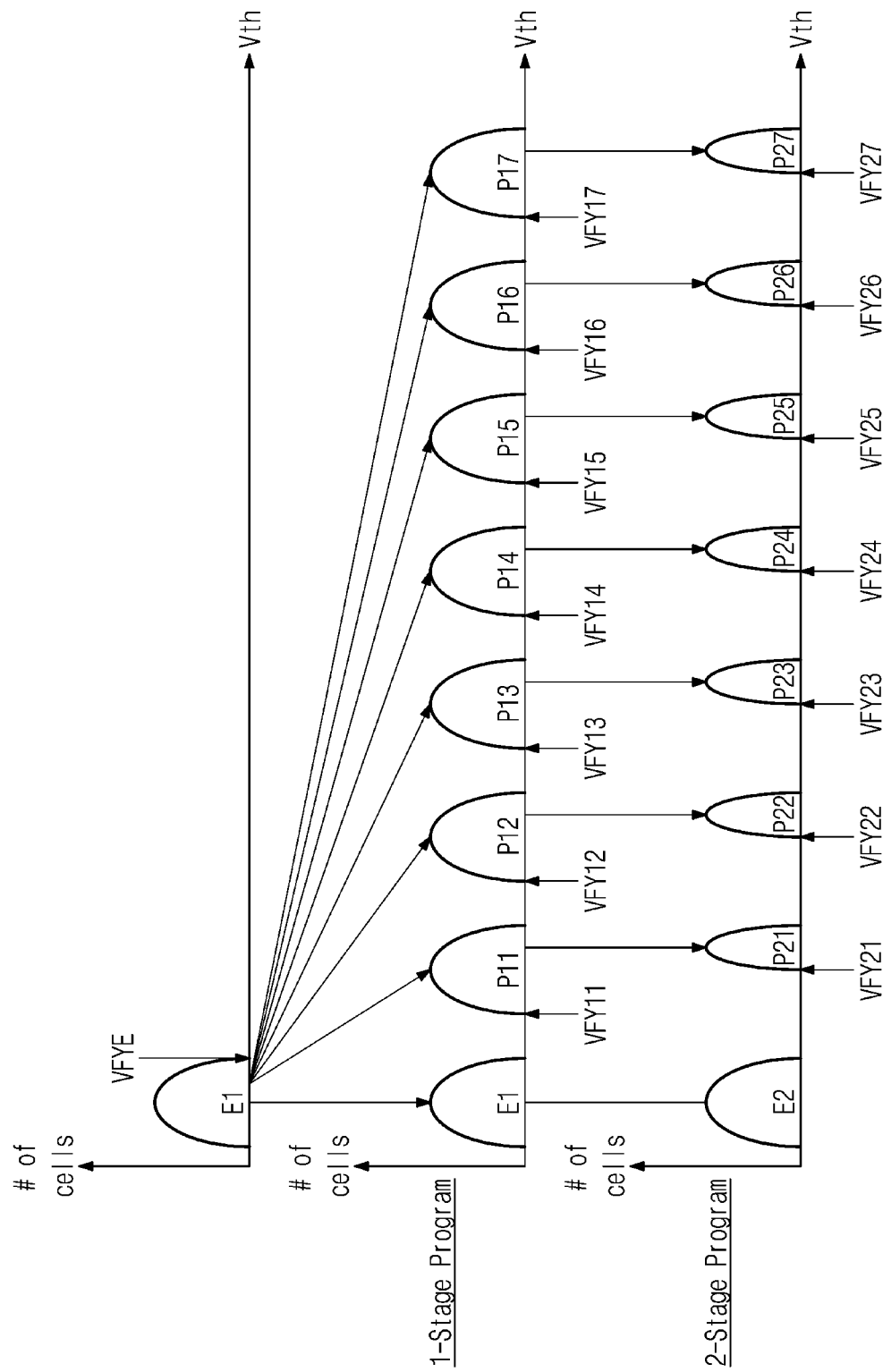
FIG. 3 illustrates distribution diagrams for describing a program operation of a nonvolatile memory device of FIG. 1 according to example embodiments.

FIG. 3 illustrates distribution diagrams for describing a program operation of a nonvolatile memory device of FIG. 1 according to example embodiments. In an embodiment, in the distribution diagrams of FIG. 3, a horizontal axis represents a threshold voltage Vth of a memory cell, and a vertical axis represents the number of memory cells. In an embodiment, a change in threshold voltages when three bits are written in each memory cell is illustrated in FIG. 3.

Referring to FIGS. 1 and 3, the nonvolatile memory device 100 may store or program data in memory cells by changing threshold voltages of a plurality of memory cells MC included in the memory cell array 110.

For example, the nonvolatile memory device 100 may perform the program operation on the memory cells based on data to be stored such that memory cells of an erase state "E" have one of the erase state "E" and a plurality of program states P21 to P27. In an embodiment, the program operation may be performed in units of word line or in units of page.

The nonvolatile memory device 100 according to the present disclosure may perform a multi-step program operation according to the reprogram manner. In an embodiment, it is assumed that the program operation according to the reprogram manner includes the 1-stage program operation and the 2-stage program operation. However, the present disclosure is not limited thereto. For example, the number of stages of the program operation may be variously changed or modified.

In an embodiment, the reprogram manner indicates an operation of performing the 1-stage program operation on a k-th word line WLk such that a distribution of memory cells is primarily formed and performing the 2-stage program operation on the k-th word line WLk after the 1-stage program operation for a (k−1)-th word line WLk−1 such that the interference between word lines WL (i.e., WLk and WLk−1) is reflected.

For example, in the 1-stage program operation on the k-th word line WLk, the nonvolatile memory device 100 may perform the program operation on memory cells such that memory cells of the erase state "E" have one of the erase state "E" and a plurality of program states P11 to P17.

In the 1-stage program operation, verify voltages VFY11 to VFY17 may be used. Herein, for convenience of description, the terms of the verify voltages VFY11 to VFY17 and 1-stage verify voltages VFY11 to VFY17 may be used interchangeably. For example, memory cells to be programmed to the program state P11 may be programmed to have a threshold voltage higher than the verify voltage VFY11. The remaining program states P12 to P17 are similar to the above description, and thus, additional description will be omitted to avoid redundancy.

In the 2-stage program operation, the nonvolatile memory device 100 may perform the program operation on the memory cells such that memory cells have one of the erase state "E" and the plurality of program states P21 to P27. For example, the nonvolatile memory device 100 may perform the program operation on the memory cells such that memory cells of the program state P11 have the program state P21. In the 2-stage program operation, verify voltages VFY21 to VFY27 may be used. For example, memory cells to be programmed to the program state P21 may be programmed to have a threshold voltage higher than the verify voltage VFY21. The remaining program states P22 to P27 are similar to the above description, and thus, additional description will be omitted to avoid redundancy.

Distribution widths of the plurality of program states P21 to P27 associated with the 2-stage program operation may be narrower than distribution widths of the plurality of program states P11 to P17 associated with the 1-stage program operation. Levels of the verify voltages VFY21 to VFY27 used in the 2-stage program operation may be higher than levels of the verify voltages VFY11 to VFY17 corresponding thereto used in the 1-stage program operation.

As the erase operation is performed, threshold voltages of the memory cells MC may be changed to the erase state "E" from the erase state "E" and the plurality of program states P21 to P27. The erase operation may be performed by using an erase verify voltage VFYE. In the erase operation, the memory cells MC may be erased to have threshold voltages lower than the erase verify voltage VFYE.

Figure 4:
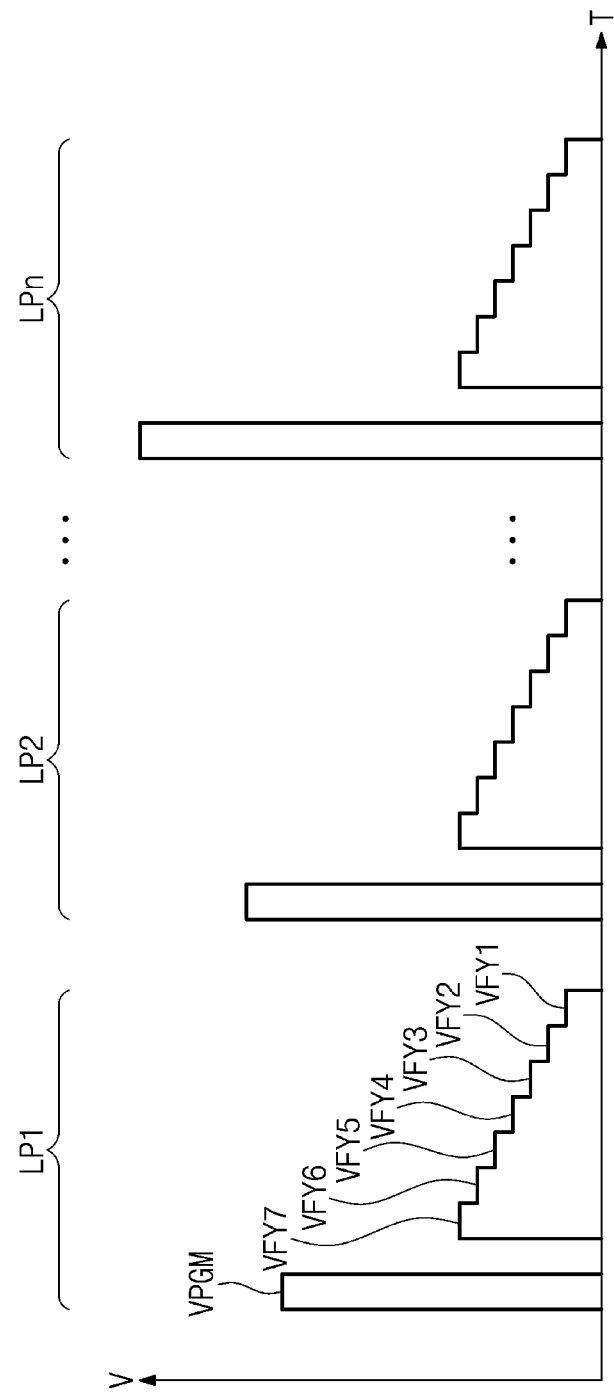
FIG. 4 is a timing diagram for describing a program operation of a nonvolatile memory device of FIG. 1 according to example embodiments.

FIG. 4 is a timing diagram for describing a program operation of a nonvolatile memory device of FIG. 1 according to example embodiments. In FIG. 4, a horizontal axis represents a time "T", and a vertical axis represents a voltage "V". An example of voltages that are applied to a word line selected from the word lines WL in the program operation is illustrated in FIG. 4. In an embodiment, the nonvolatile memory device 100 may perform the 1-stage program operation and the 2-stage program operation based on an incremental step pulse programming (ISPP) scheme.

Referring to FIGS. 1 and 4, the program operation may include a plurality of program loops LP1 to LPn. For example, each of the 1-stage program operation and the 2-stage program operation may include the plurality of program loops LP1 to LPn. The program operation may be performed by repeating program loops. When a program loop is completed (or repeated), a level of a program voltage VPGM may increase.

Each of the plurality of program loops LP1 to LPn may include a program step in which the program voltage VPGM is applied and a verify step in which the first to seventh verify voltages VFY1 to VFY7 are applied.

In the program step, voltages of the bit lines BL may be set up. For example, the bit lines BL may be connected to selected memory cells connected to a selected word line (i.e., memory cells targeted for the program operation). A program voltage (e.g., a power supply voltage or a voltage higher than the power supply voltage) may be applied to the selected word line and a ground voltage or a voltage similar to the ground voltage may be applied to bit lines connected to memory cells, the threshold voltages of which are to be increased (or which are to be programmed), from among the selected memory cells. A program-inhibit voltage (e.g., a power supply voltage) may be applied to bit lines connected to memory cells, the threshold voltages of which are to be maintained (or which are to be program-inhibited), from among the selected memory cells.

A pass voltage VPASS may be applied to word lines (or unselected word lines) WL. The pass voltage VPASS may turn on memory cells connected to the word lines WL. Afterwards, the program voltage VPGM may be applied to the selected word line. The program voltage VPGM may increase threshold voltages of the memory cells to be programmed.

In the verify step, the verify voltages VFY1 to VFY7 may be applied to the selected word line. For example, when three bits are programmed in one memory cell, through the program operation, a threshold voltage of the memory cell may be adjusted to one of an erase state and seven program states or may be maintained. The verify voltages VFY1 to VFY7 may be seven voltages corresponding to seven program states.

For example, when "n" bits (n being a positive integer) are programmed in one memory cell, through the program operation, a threshold voltage of the memory cell may be adjusted to one of the erase state and (2n−1) program states or may be maintained. Verification voltages may include (2n−1) voltages respectively corresponding to ($2^n$−1) program states.

An example in which the verify voltages VFY1 to VFY7 are applied in descending order from highest to lowest voltage levels is illustrated in FIG. 4. However, the order in which the verify voltages VFY1 to VFY7 are applied may not be associated with the levels of the verify voltages VFY1 to VFY7. Alternatively, the verify voltages VFY1 to VFY7 may be applied in ascending order from lowest to highest voltage levels.

FIG. 5 is a diagram for describing a reprogram operation of a nonvolatile memory device of FIG. 1 according to example embodiments. Referring to FIGS. 1, 2, and 5, the nonvolatile memory device 100 may perform the program operation on the first to eighth word lines WL1 to WL8 in the reprogram manner. In an embodiment, the nonvolatile memory device 100 may perform the program operation on the first to eighth word lines WL1 to WL8 sequentially through first to sixteenth steps.

For example, the nonvolatile memory device 100 may receive data to be stored at the eighth word line WL8 and may perform the 1-stage program operation on the eighth word line WL8 based on the received data at the first step. After the 1-stage program operation for the eighth word line WL8 is completed, the nonvolatile memory device 100 may receive data to be stored at the seventh word line WL7 and may perform the 1-stage program operation on the seventh word line WL7 based on the received data at the second step. After the 1-stage program operation for the seventh word line WL7 is completed, the nonvolatile memory device 100 may perform the 2-stage program operation on the eighth word line WL8 at the third step.

After the 2-stage program operation for the eighth word line WL8 is completed, the nonvolatile memory device 100 may receive data to be stored at the sixth word line WL6 and may perform the 1-stage program operation on the sixth word line WL6 based on the received data at the fourth step. After the 1-stage program operation for the sixth word line WL6 is completed, the nonvolatile memory device 100 may perform the 2-stage program operation on the seventh word line WL7 at the fifth step. The remaining steps, that is, the sixth to sixteenth steps are similar to the above description, and thus, additional description will be omitted to avoid redundancy.

The program operation for the eighth word line WL8 is completed after both the 1-stage program operation for the eighth word line WL8 and the 2-stage program operation for the eighth word line WL8 are performed. For example, the program operation for the eighth word line WL8 may be completed after all of the first to third steps are performed. As such, in the case where an input of data for the seventh word line WL7 is delayed, the 2-stage program operation for the eighth word line WL8 may also be delayed.

In the case where the 2-stage program operation is delayed after the 1-stage program operation is completed, an initial verify shift (IVS) may occur. As such, after the 2-stage program operation is completed, a distribution of threshold voltages of memory cells may be unintentionally changed. For example, a threshold voltage distribution may be shifted in a direction in which a threshold voltage increases. As a time from a point in time when the 1-stage program operation is completed to a point in time when the 2-stage program operation starts increases, the degree to which a threshold voltage distribution is shifted may increase. As a time from a point in time when the 1-stage program operation for the k-th word line is completed to a point in time when the 2-stage program operation for the (k−1)-th word line starts increases, the degree to which a threshold voltage distribution is shifted may increase.

Figure 6:
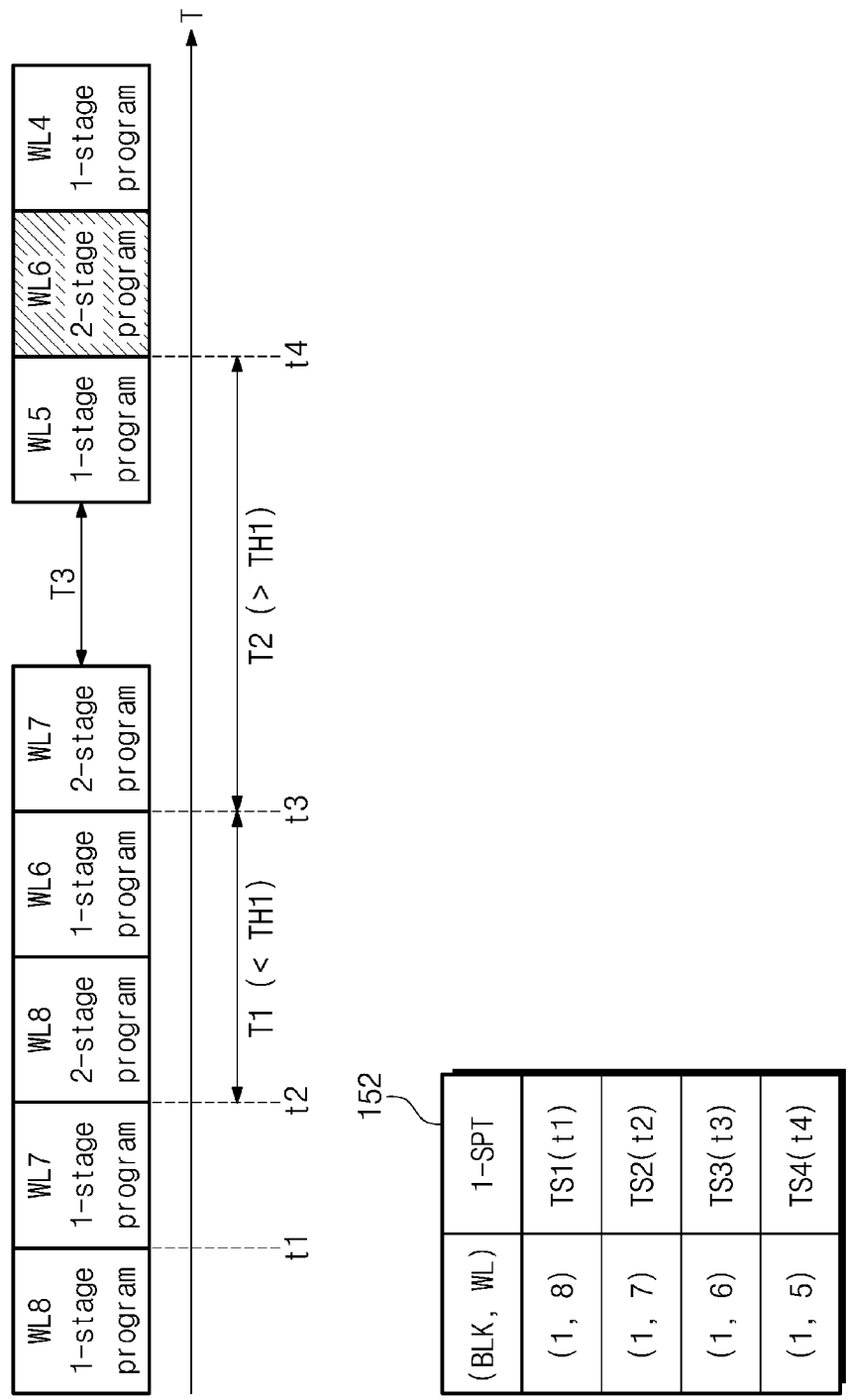
FIG. 6 is a diagram for describing a program operation of a nonvolatile memory device of FIG. 1 according to example embodiments.

FIG. 6 is a diagram for describing a program operation of a nonvolatile memory device of FIG. 1 according to example embodiments. The delay time DT and a program time table 152 will be described with reference to FIG. 6. For convenience of description, the program operation according to the present disclosure will be described based on the memory block BLKa of FIG. 2. It is assumed that the program time table 152 is managed in units of word line. The program time table 152 may include the 1-stage program time 1-SPT corresponding to a word line.

Figure 31A:
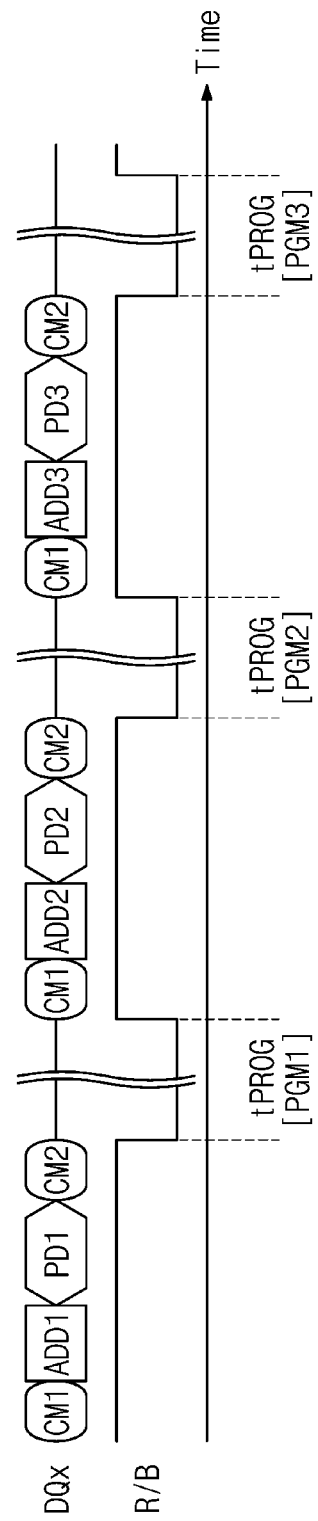
FIGS. 31A to 31D are diagrams for describing a program method of a nonvolatile memory device according to an embodiment of the present disclosure.

Referring to FIGS. 1, 2, 5, and 6, the nonvolatile memory device 100 may perform the program operation based on the sequence described with reference to FIG. 5. For example, the nonvolatile memory device 100 may perform the 1-stage program operation on the eighth word line WL8. For example, the nonvolatile memory device 100 may receive a first command, a first address, first data, and a second command. The first address may indicate a physical address (i.e., the eighth word line WL8) for the first data. The first and second commands may be a command set for the reprogram operation. In an embodiment, the first and second commands may include information indicating whether to perform the 1-stage program operation or the 2-stage program operation. After the first command, the first address, the first data, and the second command are received, during a program time (tPROG) (refer to FIG. 31A), the nonvolatile memory device 100 may perform the 1-stage program operation on the eighth word line WL8.

Afterwards, the nonvolatile memory device 100 may receive the first command, a second address, second data, and the second command. The second address may indicate a physical address (i.e., the seventh word line WL7) for the second data. The nonvolatile memory device 100 may perform the 1-stage program operation on the seventh word line WL7 during the program time (tPROG) in response to the received signals.

Afterwards, the nonvolatile memory device 100 may receive the first command, the first address, the first data, and the second command. The nonvolatile memory device 100 may perform the 2-stage program operation on the eighth word line WL8 during the program time in response to the received signals. Afterwards, the nonvolatile memory device 100 may receive the first command, a third address, third data, and the second command. The third address may indicate a physical address (i.e., the sixth word line WL6) for the third data. The nonvolatile memory device 100 may perform the 1-stage program operation on the sixth word line WL6 during the program time in response to the received signals. Afterwards, the nonvolatile memory device 100 may receive the first command, the second address, the second data, and the second command. The nonvolatile memory device 100 may perform the 2-stage program operation on the seventh word line WL7 during the program time in response to the received signals.

After the 2-stage program operation for the seventh word line WL7 is completed and a third time period T3 passes, the nonvolatile memory device 100 may perform the 1-stage program operation on the fifth word line WL5. For example, the nonvolatile memory device 100 may receive the first command, a fourth address, fourth data, and the second command. The fourth address may indicate a physical address (i.e., the fifth word line WL5) for the fourth data. The nonvolatile memory device 100 may perform the 1-stage program operation on the fifth word line WL5 during the program time in response to the received signals. Afterwards, the nonvolatile memory device 100 may receive the first command, the third address, the third data, and the second command. The nonvolatile memory device 100 may perform the 2-stage program operation on the sixth word line WL6 during the program time in response to the received signals. Afterwards, the nonvolatile memory device 100 may receive the first command, a fifth address, fifth data, and the second command. The fifth address may indicate a physical address (i.e., the fourth word line WL4) for the fifth data. The nonvolatile memory device 100 may perform the 1-stage program operation on the fourth word line WL4 during the program time in response to the received signals.

A first time period T1 may be taken from a point in time when the 1-stage program operation for the seventh word line WL7 is completed to a point in time when the 1-stage program operation for the sixth word line WL6 is completed, or from a point in time when the 1-stage program operation for the seventh word line WL7 is completed to a point in time when the 2-stage program operation for the seventh word line WL7 is started. For example, the delay time DT of the seventh word line WL7 may be the first time period T1. Because the first time period T1 is smaller than a first threshold value TH1, the nonvolatile memory device 100 may not adjust 2-stage verify voltages for the seventh word line WL7. The nonvolatile memory device 100 may perform a 2-stage verify step for the seventh word line WL7 by using a default 2-stage verify voltage.

In contrast, as an input of data to be stored at the fifth word line WL5 is delayed during the third time period T3, a second time period T2 may be taken from a point in time when the 1-stage program operation for the sixth word line WL6 is completed to a point in time when the 1-stage program operation for the fifth word line WL5 is completed, or from a point in time when the 1-stage program operation for the sixth word line WL6 is completed to a point in time when the 2-stage program operation for the sixth word line WL6 starts. For example, the delay time DT of the sixth word line WL6 may be the second time period T2. Because the second time period T2 is greater than the first threshold value TH1, the nonvolatile memory device 100 may adjust 2-stage verify voltages for the sixth word line WL6. The nonvolatile memory device 100 may perform the 2-stage program operation for the sixth word line WL6 by using the adjusted 2-stage verify voltages.

The 1-stage program operation for the eighth word line WL8 may be completed at a first point in time t1. The 1-stage program operation for the seventh word line WL7 may be completed at a second point in time t2. The 1-stage program operation for the sixth word line WL6 may be completed at a third point in time t3. The 1-stage program operation for the fifth word line WL5 may be completed at a fourth point in time t4.

The time managing unit 151 may manage 1-stage program times 1-SPT of the fifth to eighth word lines WL5 to WL8 by using the program time table 152. It is assumed that the 1-stage program time 1-SPT indicates a time point at which the 1-stage program operation is completed. However, the present disclosure is not limited thereto. For example, the 1-stage program time 1-SPT may indicate various time points such as a start time point of the 1-stage program operation and a completion time point of the 1-stage program operation.

For example, the 1-stage program time 1-SPT of the eighth word line WL8 may be a first time stamp TS1 including a current time of the first point in time t1; the 1-stage program time 1-SPT of the seventh word line WL7 may be a second time stamp TS2 including a current time of the second point in time t2; the 1-stage program time 1-SPT of the sixth word line WL6 may be a third time stamp TS3 including a current time of the third point in time t3; the 1-stage program time 1-SPT of the fifth word line WL5 may be a fourth time stamp TS4 including a current time of the fourth point in time t4.

For example, the time managing unit 151 may generate the first time stamp TS1 and may store the first time stamp TS1 in the program time table 152 in association with the eighth word line WL8. The time managing unit 151 may generate the second time stamp TS2 and may store the second time stamp TS2 in the program time table 152 in association with the seventh word line WL7. The time managing unit 151 may generate the third time stamp TS3 and may store the third time stamp TS3 in the program time table 152 in association with the sixth word line WL6. The time managing unit 151 may generate the fourth time stamp TS4 and may store the fourth time stamp TS4 in the program time table 152 in association with the fifth word line WL5.

FIG. 7 is a diagram illustrating an example of the VVL LUT of FIG. 1 according to example embodiments. Referring to FIGS. 1 and 7, the nonvolatile memory device 100 may include the VVL LUT 153. The VVL LUT 153 may include mapping information about 2-stage verify voltage level differences according to the delay times DT.

For example, the VVL LUT 153 is a table for adjusting verify voltages associated with pages of triple level cells (TLC). However, the present disclosure is not limited thereto. For example, information included in the VVL LUT

153 may vary depending on the number of bits capable of being stored at a page of the nonvolatile memory device 100. The VVL LUT 153 may include a plurality of tables 153_1 to 153_4. Each of the plurality of tables 153_1 to 153_4 stores mapping information of a plurality of 2-stage verify voltages VFY21 to VFY27 and a plurality of verify voltage level differences. The plurality of 2-stage verify voltages VFY21 to VFY27 may be default 2-stage verify voltages that are applied when the delay time DT is smaller than or equal to the first threshold value TH1.

The first VVL LUT 153_1 may include mapping information of the plurality of 2-stage verify voltages VFY21 to VFY27 and a plurality of verify voltage level differences $\Delta$VFY1_1 to $\Delta$VFY7_1 in the case where the delay time DT is in a first range R1 (e.g., the delay time DT is greater than or equal to a first reference time RT1 and is smaller than a second reference time RT2). For example, each of the plurality of 2-stage verify voltages VFY21 to VFY27 may decrease by a corresponding one of the plurality of verify voltage level differences $\Delta$VFY1_1 to $\Delta$VFY7_1 in the first range R1. In detail, at least one of the 2-stage verify voltages VFY21 to VFY27 may change as much as a value of a corresponding one of the plurality of 2-stage verify voltage level differences $\Delta$VFY1_1 to $\Delta$VFY7_1.

The second VVL LUT 153_2 may include mapping information of the plurality of 2-stage verify voltages VFY21 to VFY27 and a plurality of verify voltage level differences $\Delta$VFY1_2 to $\Delta$VFY7_2 in the case where the delay time DT is in a second range R2 (e.g., the delay time DT is greater than or equal to the second reference time RT2 and is smaller than a third reference time RT3). For example, each of the plurality of 2-stage verify voltages VFY21 to VFY27 may decrease by a corresponding one of the plurality of verify voltage level differences $\Delta$VFY1_2 to $\Delta$VFY7_2 in the second range R2. In detail, at least one of the 2-stage verify voltages VFY21 to VFY27 may change as much as a value of a corresponding one of the plurality of 2-stage verify voltage level differences $\Delta$VFY1_2 to $\Delta$VFY7_2.

The third VVL LUT 153_3 may include mapping information of the plurality of 2-stage verify voltages VFY21 to VFY27 and a plurality of verify voltage level differences $\Delta$VFY1_3 to $\Delta$VFY7_3 in the case where the delay time DT is in a third range R3 (e.g., the delay time DT is greater than or equal to the third reference time RT3 and is smaller than a fourth reference time RT4). For example, each of the plurality of 2-stage verify voltages VFY21 to VFY27 may decrease by a corresponding one of the plurality of verify voltage level differences $\Delta$VFY1_3 to $\Delta$VFY7_3 in the third range R3. In detail, at least one of the 2-stage verify voltages VFY21 to VFY27 may change as much as a value of a corresponding one of the plurality of 2-stage verify voltage level differences $\Delta$VFY1_3 to $\Delta$VFY7_3.

The fourth VVL LUT 153_4 may include mapping information of the plurality of 2-stage verify voltages VFY21 to VFY27 and a plurality of verify voltage level differences $\Delta$VFY1_4 to $\Delta$VFY7_4 in the case where the delay time DT is in a fourth range R4 (e.g., the delay time DT is greater than or equal to the fourth reference time RT4 and is smaller than a fifth reference time RT5). For example, each of the plurality of 2-stage verify voltages VFY21 to VFY27 may decrease by a corresponding one of the plurality of verify voltage level differences $\Delta$VFY1_4 to $\Delta$VFY7_4 in the fourth range R4. In detail, at least one of the 2-stage verify voltages VFY21 to VFY27 may change as much as a value of a corresponding one of the plurality of 2-stage verify voltage level differences $\Delta$VFY1_4 to $\Delta$VFY7_4.

Figure 8A:
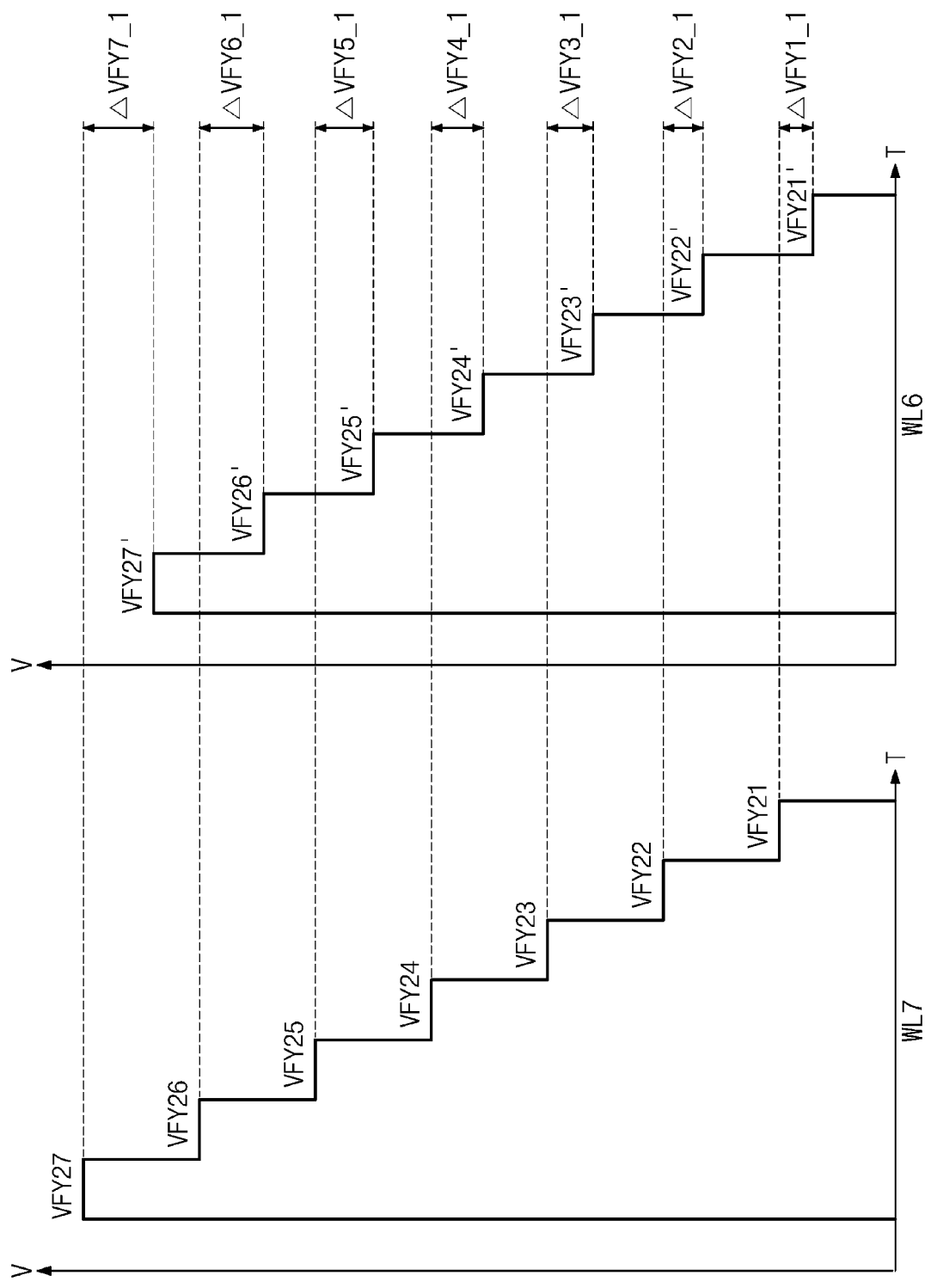
FIG. 8A is a diagram illustrating an example of 2-stage verify voltages according to an embodiment of the present disclosure.

FIG. 8A is a diagram illustrating an example of 2-stage verify voltages according to an embodiment of the present disclosure. In FIG. 8A, a horizontal axis represents a time "T", and a vertical axis represents a voltage "V". Referring to FIGS. 6 to 8A, it is assumed that the delay time DT (e.g., the first time period T1) of the seventh word line WL7 is smaller than the first threshold value TH1 and the delay time DT (e.g., the second time period T2) of the sixth word line WL6 is greater than the first threshold value TH1. Also, it is assumed that the second time period T2 is greater than or equal to the first reference time RT1 and is smaller than the second reference time RT2.

For example, each of the plurality of verify voltage level differences $\Delta$VFY1_1 to $\Delta$VFY7_1 may have a negative value. An absolute value of the verify voltage level difference $\Delta$VFY1_1 may be equal to an absolute value of the verify voltage level difference $\Delta$VFY2_1; an absolute value of the verify voltage level difference $\Delta$VFY3_1 may be greater than the absolute value of the verify voltage level difference $\Delta$VFY2_1; an absolute value of the verify voltage level difference $\Delta$VFY4_1 may be equal to an absolute value of the verify voltage level difference $\Delta$VFY3_1; an absolute value of the verify voltage level difference $\Delta$VFY5_1 may be equal to the absolute value of the verify voltage level difference $\Delta$VFY4_1; an absolute value of the verify voltage level difference $\Delta$VFY6_1 may be greater than the absolute value of the verify voltage level difference $\Delta$VFY5_1; an absolute value of the verify voltage level difference $\Delta$VFY7_1 may be equal to the absolute value of the verify voltage level difference $\Delta$VFY6_1 (i.e., $|\Delta$VFY1_1$|=|\Delta$VFY2_1$|<|\Delta$VFY3_1$|=|\Delta$VFY4_1$|=|\Delta$VFY5_1$|<|\Delta$VFY6_1$|=|\Delta$VFY7_1$|$). However, the present disclosure is not limited thereto. For example, each of the plurality of verify voltage level differences $\Delta$VFY1_1 to $\Delta$VFY7_1 may change depending on how a distribution is shifted (i.e., a distribution shift tendency).

Because the delay time DT (e.g., the first time period T1) of the seventh word line WL7 is smaller than the first threshold value TH1, the VVL selecting unit 154 may output the default 2-stage verify voltages VFY21 to VFY27. In contrast, because the delay time DT (e.g., the second time period T2) of the sixth word line WL6 is greater than the first threshold value TH1, the VVL selecting unit 154 may output new 2-stage verify voltages VFY21' to VFY27' whose voltage levels are adjusted.

For example, because the second time period T2 belongs to the first range R1, the VVL selecting unit 154 may refer to the first VVL LUT 153_1. The VVL selecting unit 154 may output the new verify voltage VFY21' (=VFY21+$\Delta$VFY1_1) that is obtained by adding the first verify voltage level difference $\Delta$VFY1_1 to the first verify voltage VFY21. The new verify voltage VFY21' thus output may be used as a 2-stage verify voltage for data stored in memory cells of the memory cell array 110. The remaining new verify voltages VFY22' to VFY27' are similar to the above description, and thus, additional description will be omitted to avoid redundancy.

As illustrated in FIG. 8A, as a level of a verify voltage becomes greater, an absolute value of a verify voltage level difference may become greater or may be maintained (e.g., $|\Delta$VFY1_1$|=|\Delta$VFY2_1$|<|\Delta$VFY3_1$|=|\Delta$VFY4_1$|=|\Delta$VFY5_1$|<|\Delta$VFY6_1$|=|\Delta$VFY7_1$|$). This is only an embodiment of the present disclosure. Depending on a level of a verify voltage, verify voltage level differences may be determined to be equal to each other, or all the verify voltage level differences may be determined to be different from each other.

Figure 8B:
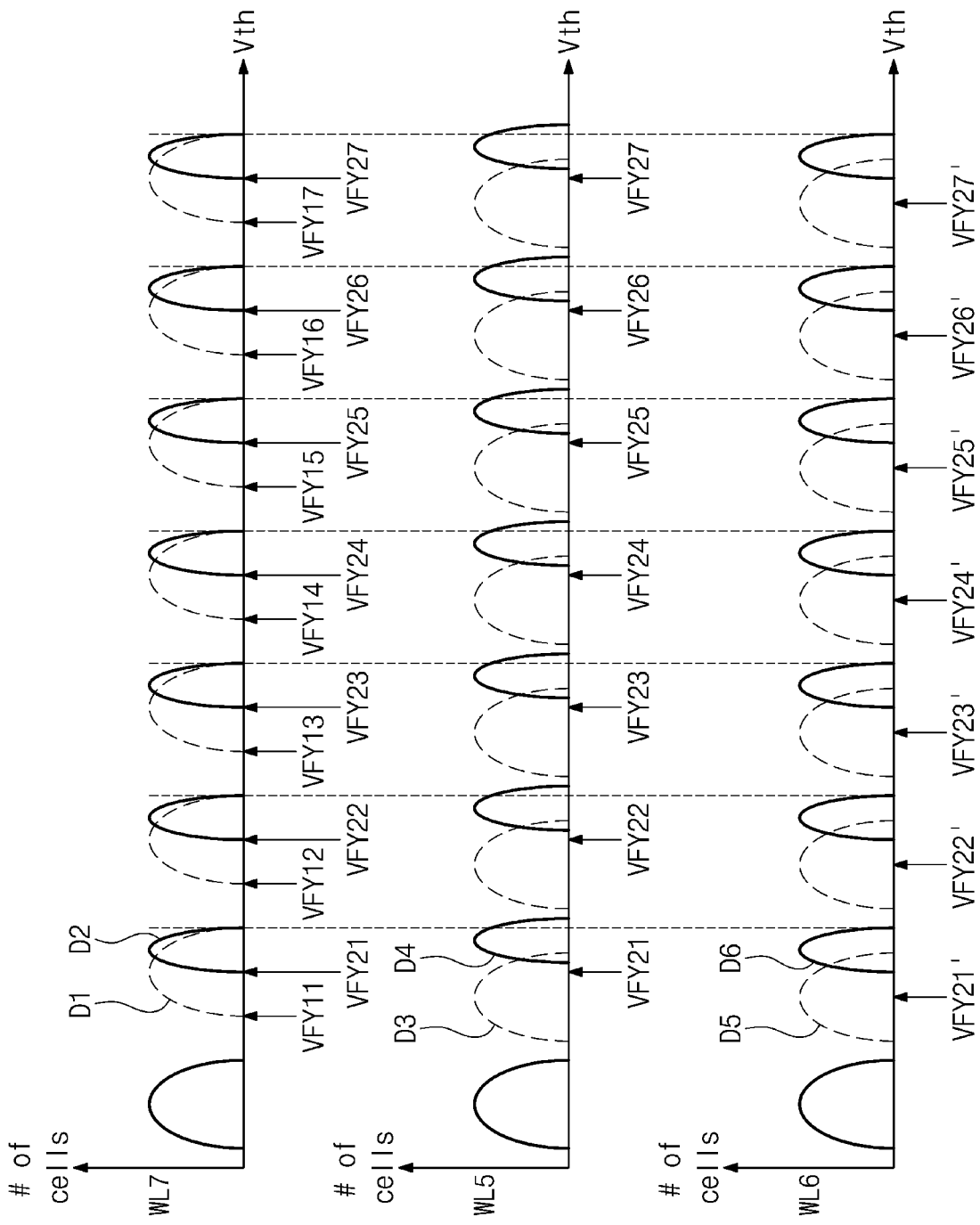
FIG. 8B illustrates distribution diagrams for describing a program operation of a nonvolatile memory device of FIG. 1 according to example embodiments.

FIG. 8B illustrates distribution diagrams for describing a program operation of a nonvolatile memory device of FIG. 1 according to example embodiments. In the distribution diagrams of FIG. 8B, a horizontal axis represents a threshold voltage Vth of a memory cell, and a vertical axis represents the number of memory cells. It is assumed that the delay time DT of the seventh word line WL7 is smaller than the first threshold value TH1 and the delay times DT of the fifth and sixth word lines WL5 and WL6 are greater than the first threshold value TH1.

In FIG. 8B, a dotted line indicates a state before the 2-stage program operation, and a solid line indicates a state after the 2-stage program operation. A first distribution D1 indicates a distribution of memory cells of the seventh word line WL7 before the 2-stage program operation; a second distribution D2 indicates a distribution of the memory cells of the seventh word line WL7 after the 2-stage program operation; a third distribution D3 indicates a distribution of memory cells of the fifth word line WL5 before the 2-stage program operation; a fourth distribution D4 indicates a distribution of the memory cells of the fifth word line WL5 after the 2-stage program operation; a fifth distribution D5 indicates a distribution of memory cells of the sixth word line WL6 before the 2-stage program operation; a sixth distribution D6 indicates a distribution of the memory cells of the sixth word line WL6 after the 2-stage program operation.

The nonvolatile memory device 100 may apply the 1-stage verify voltages VFY11 to VFY17 to the fifth to seventh word lines WL5 to WL7 in the 1-stage program operation. For convenience of description, it is assumed that the nonvolatile memory device 100 applies, to the sixth word line WL6, the new 2-stage verify voltages VFY21' to VFY27' whose voltage levels are adjusted and applies the default 2-stage verify voltages VFY21 to VFY27 to the fifth and seventh word lines WL5 and WL7.

In an embodiment, a level of the new 2-stage verify voltage VFY21' may be smaller than a level of the default 2-stage verify voltage VFY21 corresponding thereto, and levels of the remaining new 2-stage verify voltages VFY22' to VFY27' may be smaller than levels of the default 2-stage verify voltages VFY22 to VFY27 corresponding thereto. A level of the new 2-stage verify voltage VFY21' may be greater than a level of the 1-stage verify voltage VFY11 corresponding thereto, and levels of the remaining new 2-stage verify voltages VFY22' to VFY27' may be greater than levels of the 1-stage verify voltages VFY12 to VFY17 corresponding thereto.

Because the delay time DT of the fifth word line WL5 is greater than the first threshold value TH1, the nonvolatile memory device 100 has to adjust 2-stage verify voltages of the fifth word line WL5. To describe a distribution when the delay time DT is greater than the first threshold value TH1 but verify voltage levels are not adjusted, in FIG. 8B, it is assumed that a default 2-stage verify voltage is applied to the fifth word line WL5.

Because the delay time DT of the seventh word line WL7 is smaller than the first threshold value TH1, the nonvolatile memory device 100 may apply the default 2-stage verify voltages VFY21 to VFY27 to the seventh word line WL7. The second distribution D2 may be formed as intended.

Because the delay time DT of the fifth word line WL5 is greater than the first threshold value TH1, the third distribution D3 may be shifted in a direction in which a threshold voltage decreases, compared to the first distribution D1. In this state, when the default 2-stage verify voltages VFY21 to VFY27 are applied, the fourth distribution D4 may be shifted in a direction in which a threshold voltage increases, compared to the second distribution D2.

Because the delay time DT of the sixth word line WL6 is greater than the first threshold value TH1, like the third distribution D3, the fifth distribution D5 may be shifted in the direction in which a threshold voltage decreases, compared to the first distribution D1. The nonvolatile memory device 100 may apply, to the sixth word line WL6, the new 2-stage verify voltages VFY21' to VFY27' whose voltage levels are adjusted. As such, like the second distribution D2, the sixth distribution D6 may be formed as intended. In other words, the delay time DT of the sixth word line WL6 may be greater than the first threshold value TH1 like the fifth word line WL5, but unlike the fourth distribution D4, the sixth distribution D6 may be formed as intended.

As described above, even though a delay time occurs between the 1-stage program operation and the 2-stage program operation, the nonvolatile memory device 100 may adjust levels of 2-stage verify voltages such that a final distribution of memory cells is formed as intended.

Figure 9:
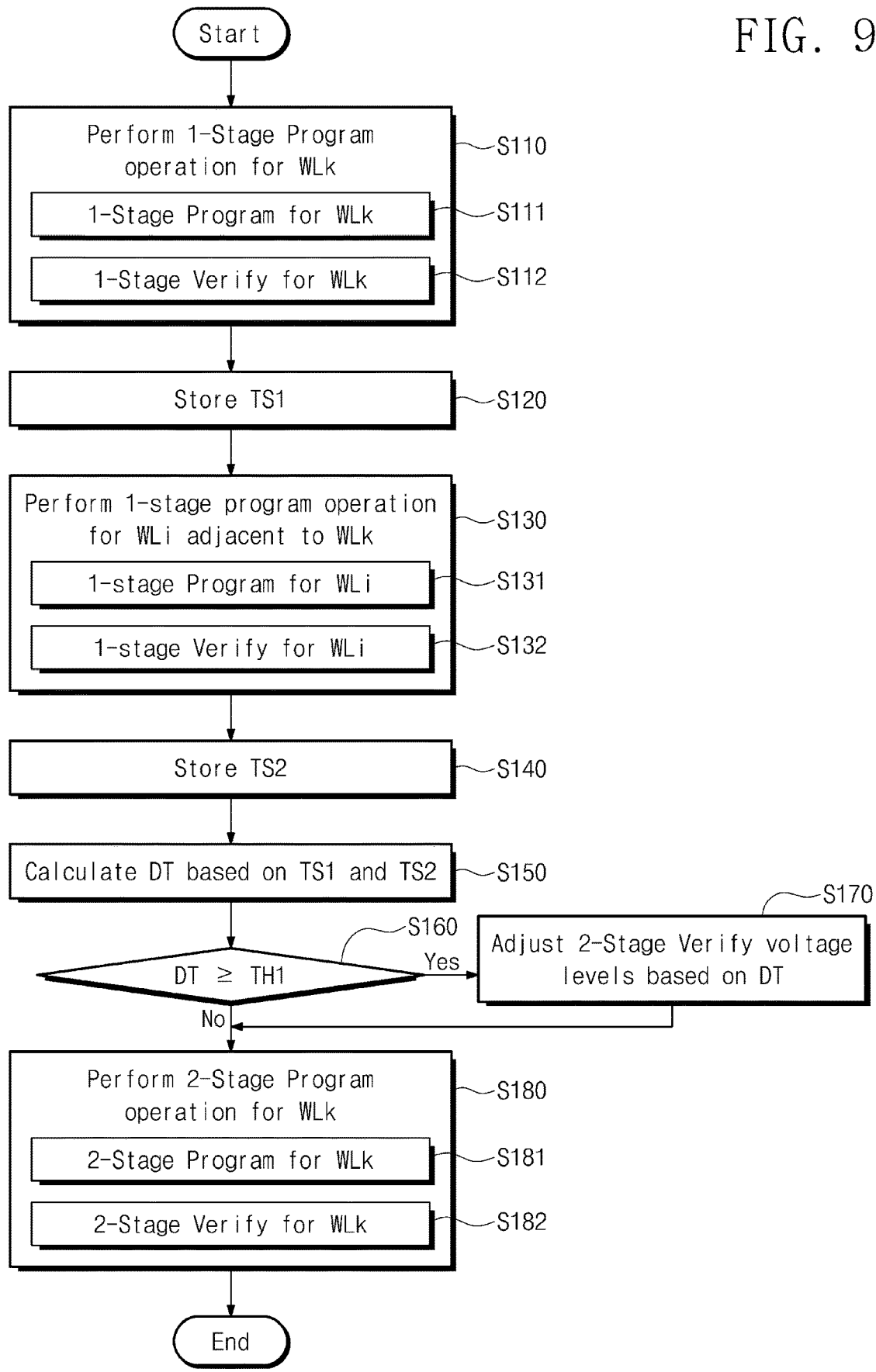
FIG. 9 is a flowchart illustrating an example of a program method of a nonvolatile memory device of FIG. 1 according to example embodiments.

FIG. 9 is a flowchart illustrating an example of a program method of a nonvolatile memory device of FIG. 1 according to example embodiments. Referring to FIGS. 1 and 9, in operation S110, the nonvolatile memory device 100 may perform the 1-stage program operation on the k-th word line WLk. For example, in operation S111, the nonvolatile memory device 100 may perform a 1-stage program step on the k-th word line WLk. In operation S112, the nonvolatile memory device 100 may perform a 1-stage verify step on the k-th word line WLk.

In operation S120, the nonvolatile memory device 100 may generate and store the 1-stage program time 1-SPT of the k-th word line WLk as the first time stamp TS1. For example, the time managing unit 151 may check a time corresponding to a point in time when the 1-stage program operation for the k-th word line WLk is completed. Alternatively, after the 1-stage program operation for the k-th word line WLk is completed, the time managing unit 151 may generate a time stamp including a current time. For example, the time managing unit 151 may generate the first time stamp TS1 corresponding to a point in time when the 1-stage program operation for the k-th word line WLk is completed. The time managing unit 151 may store the first time stamp TS1 in the program time table 152 in association with the k-th word line WLk.

In operation S130, the nonvolatile memory device 100 may perform the 1-stage program operation on at least one word line WL1 (e.g., the (k−1)-th word line WLk−1) adjacent to the k-th word line WLk. For example, in operation S131, the nonvolatile memory device 100 may perform the 1-stage program step on the word line WL1. In operation S132, the nonvolatile memory device 100 may perform the 1-stage verify step on the word line WL1.

In operation S140, the nonvolatile memory device 100 may generate and store the 1-stage program time 1-SPT of the word line WL1 as the second time stamp TS2. For example, the time managing unit 151 may check a time corresponding to a point in time when the 1-stage program operation for the word line WL1 is completed. Alternatively, after the 1-stage program operation for the word line WL1 is completed, the time managing unit 151 may generate a time stamp including a current time. For example, the time managing unit 151 may generate the second time stamp TS2 corresponding to a point in time when the 1-stage program operation for the word line WL1 is completed. The time managing unit 151 may store the second time stamp TS2 in the program time table 152 in association with the word line WL1.

In operation S150, the nonvolatile memory device 100 may calculate the delay time DT based on the first and second time stamps TS1 and TS2. For example, the time managing unit 151 may load the first time stamp TS1 being the 1-stage program time 1-SPT of the k-th word line WLk and the second time stamp TS2 being the 1-stage program time 1-SPT of the word line WL1 with reference to the program time table 152. The time managing unit 151 may calculate a difference between the first time stamp TS1 and the second time stamp TS2 as the delay time DT.

In operation S160, the nonvolatile memory device 100 may compare the delay time DT with the first threshold value TH1. For example, the time managing unit 151 may determine whether the delay time DT is greater than or equal to the first threshold value TH1. When it is determined that the delay time DT is greater than or equal to the first threshold value TH1, the nonvolatile memory device 100 perform operation S170; when it is determined that the delay time DT is smaller than the first threshold value TH1, the nonvolatile memory device 100 performs operation S180.

In operation S170, the nonvolatile memory device 100 may adjust 2-stage verify voltage levels based on the delay time DT. For example, the VVL selecting unit 154 may receive the delay time DT from the time managing unit 151. The VVL selecting unit 154 may refer to verify voltage level difference information of the VVL LUT 153 based on the delay time DT. The VVL selecting unit 154 may adjust the 2-stage verify voltage levels based on the verify voltage level difference information.

In operation S180, the nonvolatile memory device 100 may perform the 2-stage program operation on the k-th word line WLk. In operation S181, the nonvolatile memory device 100 may perform a 2-stage program step on the k-th word line WLk. In operation S182, the nonvolatile memory device 100 may perform a 2-stage verify step on the k-th word line WLk.

For example, when the delay time DT is equal to or smaller than the first threshold value TH1, the VVL selecting unit 154 may output default 2-stage verify voltages. As such, the nonvolatile memory device 100 may perform the 2-stage verify step based on the default 2-stage verify voltages. When the delay time DT is greater than the first threshold value TH1, the VVL selecting unit 154 may output new 2-stage verify voltages whose voltage levels are adjusted. As such, the nonvolatile memory device 100 may perform the 2-stage verify step based on the new 2-stage verify voltages whose voltage levels are adjusted.

As described above, the nonvolatile memory device 100 may adjust the 2-stage verify voltage levels based on the delay time DT. As such, a nonvolatile memory device with improved reliability is provided.

Figure 10:
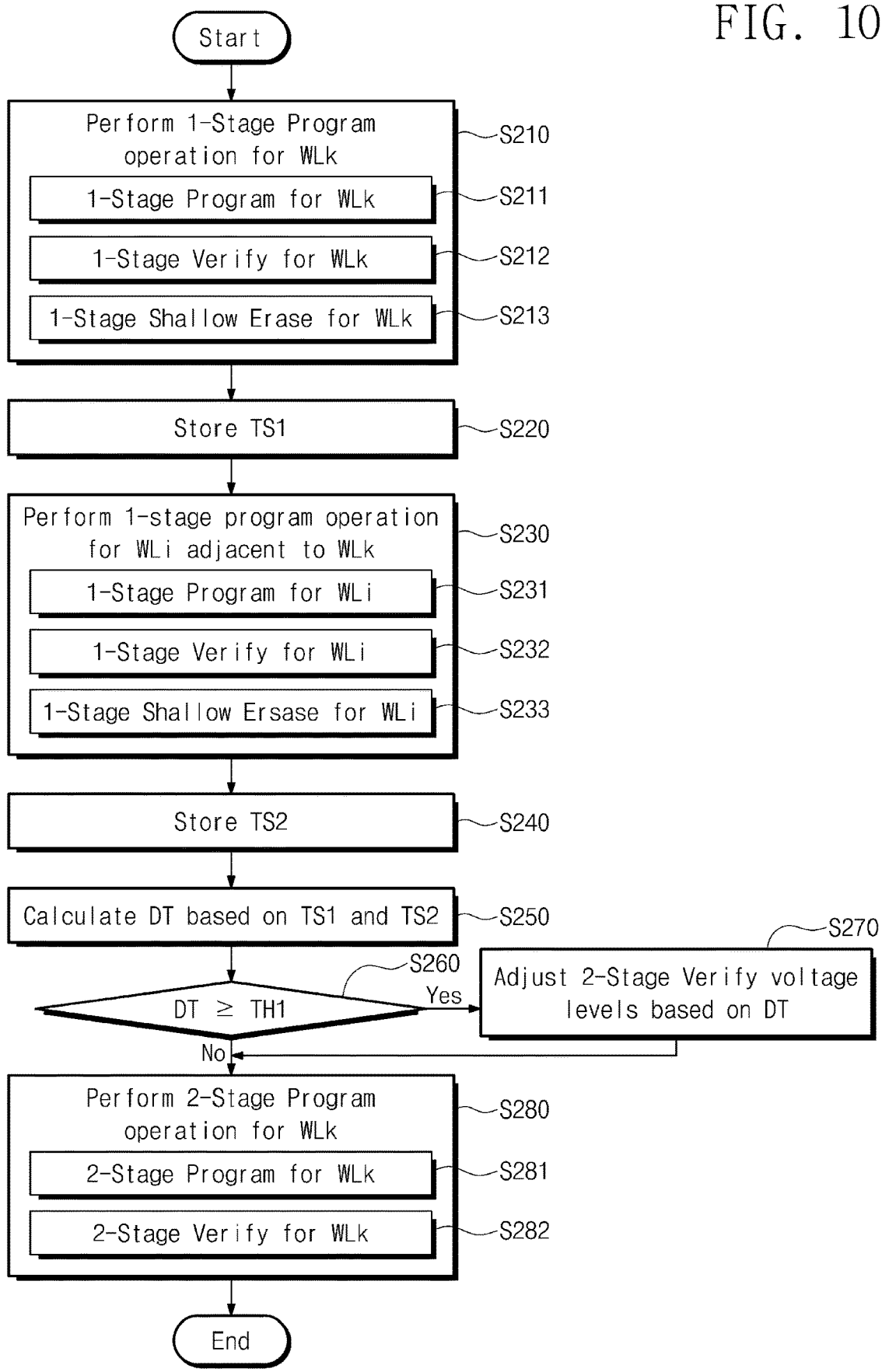
FIG. 10 is a flowchart illustrating an example of a program method of a nonvolatile memory device of FIG. 1 according to example embodiments.
Figure 11:
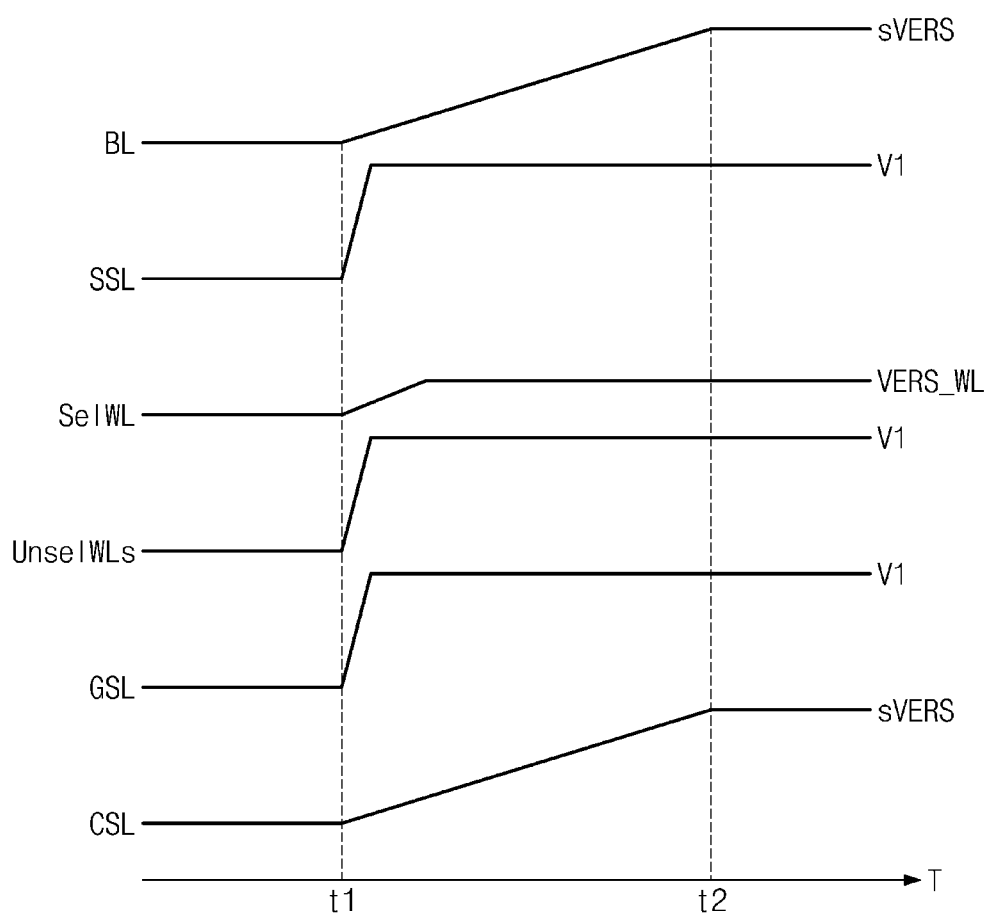
FIG. 11 is a timing diagram illustrating an example of a shallow erase step of a nonvolatile memory device of FIG. 1 according to example embodiments.

FIG. 10 is a flowchart illustrating an example of a program method of a nonvolatile memory device of FIG. 1 according to example embodiments. FIG. 11 is a timing diagram illustrating an example of a shallow erase step of a nonvolatile memory device of FIG. 1 according to example embodiments. Referring to FIGS. 1, 3, and 10, in operation S210, the nonvolatile memory device 100 may perform the 1-stage program operation on the k-th word line WLk. For example, in operation S211, the nonvolatile memory device 100 may perform the 1-stage program step on the k-th word line WLk. In operation S212, the nonvolatile memory device 100 may perform the 1-stage verify step on the k-th word line WLk. In operation S213, the nonvolatile memory device 100 may perform a 1-stage shallow erase step on the k-th word line WLk.

For example, the shallow erase step may be different from an erase operation in which the memory cells MC are erased to have threshold voltages lower than the erase verify voltage VFYE. The shallow erase step may indicate an operation of discharging charges of a shallow trap level for the purpose of solving an initial verify shift (IVS) phenomenon. Alternatively, the shallow erase step may indicate an operation in which voltages are applied as illustrated in FIG. 11.

Referring to FIG. 11, the nonvolatile memory device 100 may perform the shallow erase step on a selected word line SelWL (e.g., the k-th word line WLk). For example, at a first point in time t1, the nonvolatile memory device 100 may start to apply a shallow erase voltage sVERS through the bit line BL and the common source line CSL. The shallow erase voltage sVERS may be smaller than an erase voltage VERS used in a normal erase operation. The shallow erase voltage sVERS may be about 6 to 7 V. Voltages of the bit line BL and the common source line CSL may increase to the shallow erase voltage sVERS from the first point in time t1 to the second point in time t2.

The nonvolatile memory device 100 may float the string selection line SSL at the first point in time t1. As the string selection line SSL is floated, at the first point in time t1, a voltage of the string selection line SSL may increase to a first voltage V1. For example, the first voltage V1 may correspond to the shallow erase voltage sVERS.

The nonvolatile memory device 100 may apply a word line erase voltage VERS_WL to the selected word line SelWL (e.g., the k-th word line WLk). For example, the word line erase voltage VERS_WL may be about 0 to 2 V. The nonvolatile memory device 100 may float unselected word lines UnselWLs at the first point in time t1. As the unselected word lines UnselWLs are floated, at the first point in time t1, voltages of the unselected word lines UnselWLs may increase to the first voltage V1.

The nonvolatile memory device 100 may float the ground selection line GSL at the first point in time t1. As the ground selection line GSL is floated, at the first point in time t1, a voltage of the ground selection line GSL may increase to the first voltage V1.

As described above, the shallow erase step may be performed in units of word line. The shallow erase step may be performed after the 1-stage program step and the 1-stage verify step are performed. In an embodiment, the shallow erase step may be performed only in the 1-stage program operation and may not be performed in the 2-stage program operation.

In operation S220, the nonvolatile memory device 100 may generate and store the 1-stage program time 1-SPT of the k-th word line WLk as the first time stamp TS1. Operation S220 is similar to operation S120 of FIG. 9, and thus, additional description will be omitted to avoid redundancy.

In operation S230, the nonvolatile memory device 100 may perform the 1-stage program operation on at least one word line WL1 (e.g., the (k–1)-th word line WLk–1) adjacent to the k-th word line WLk. For example, in operation S231, the nonvolatile memory device 100 may perform the 1-stage program step on the word line WL1. In operation S232, the nonvolatile memory device 100 may perform the 1-stage verify step on the word line WL1. In operation S233, the nonvolatile memory device 100 may perform the 1-stage shallow erase step on the word line WL1.

Afterwards, operation S240 to operation S270 may be performed. Operation S240 to operation S270 are similar to operation S140 to operation S170 of FIG. 9, and thus, additional description will be omitted to avoid redundancy.

In operation S280, the nonvolatile memory device 100 may perform the 2-stage program operation on the k-th word line WLk. In operation S281, the nonvolatile memory device 100 may perform a 2-stage program step on the k-th word line WLk. In operation S282, the nonvolatile memory device 100 may perform the 2-stage verify step on the k-th word line WLk. Unlike the 1-stage program operation, the 2-stage program operation may not include the shallow erase step.

Figure 12:
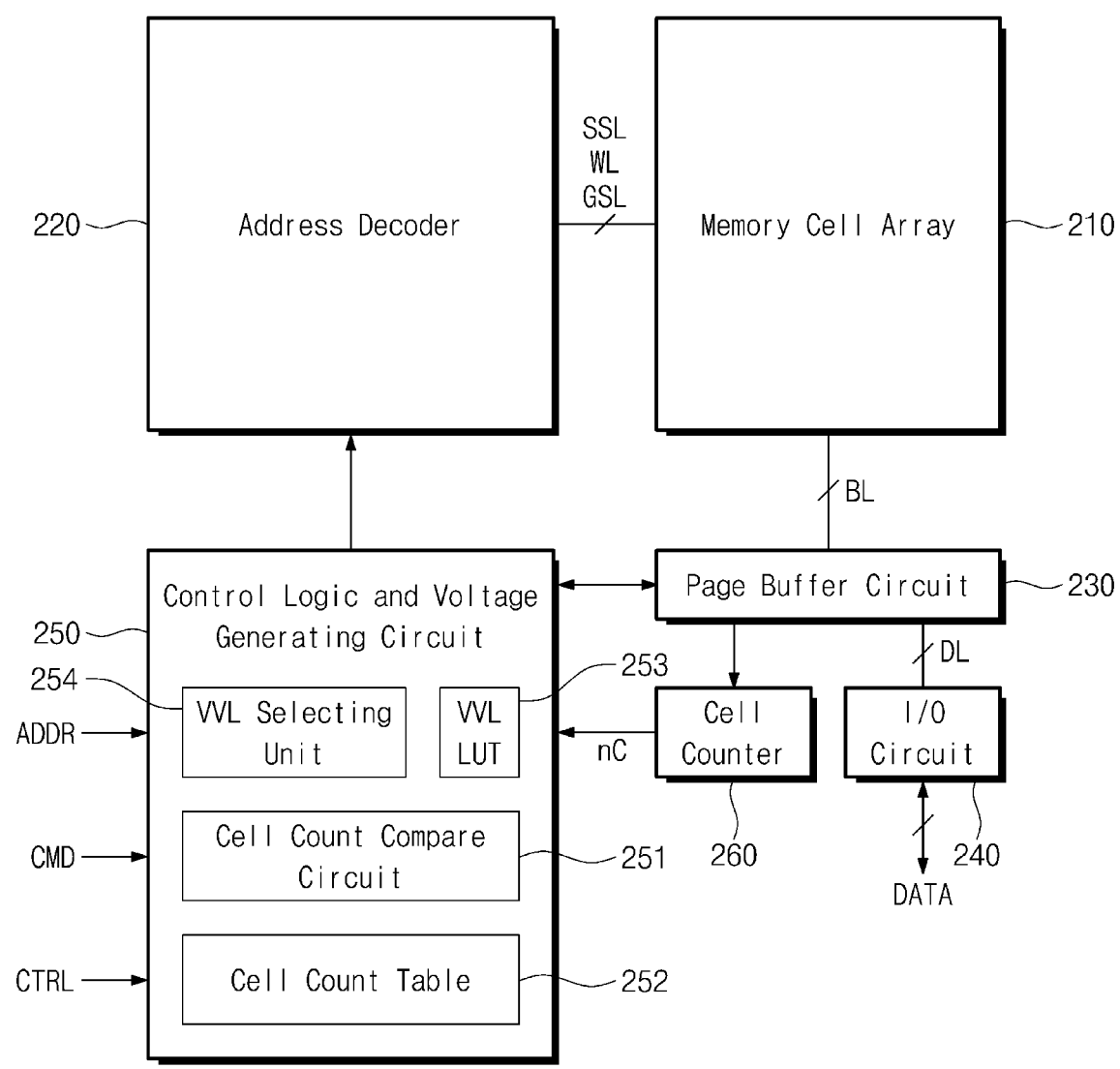
FIG. 12 illustrates a nonvolatile memory device according to an embodiment of the present disclosure.

FIG. 12 illustrates a nonvolatile memory device according to an embodiment of the present disclosure. Referring to FIG. 12, a nonvolatile memory device 200 may include a memory cell array 210, an address decoder 220, a page buffer circuit 230, an input/output circuit 240, a control logic and voltage generating circuit (hereinafter referred to as a "control logic circuit") 250, and a cell counter 260.

For example, the memory cell array 210 may be a core of the nonvolatile memory device 200, and the address decoder 220, the page buffer circuit 230, the input/output circuit 240, the control logic circuit 250, and the cell counter 260 may be a peripheral circuit of the nonvolatile memory device 200. The peripheral circuit may be configured to access the core. The nonvolatile memory device 200 illustrated in FIG. 12 may be similar to or the same as the nonvolatile memory device 100 of FIG. 1. For convenience of description, additional description associated with the components described above will be omitted to avoid redundancy.

In an embodiment, the cell counter 260 may perform a cell count operation. In detail, the cell counter 260 may count memory cells (i.e., on cells), each of which forms a current path at a channel in response to a read voltage (or verify voltage) at a specific point in time. The cell counter 260 may count memory cells (i.e., off cells), each of which blocks (or does not form) a current path at a channel in response to the read voltage at the specific point in time. For example, during one read operation of a plurality of read operations, the cell counter 260 may count memory cells each forming a current path at a channel in response to the read voltage or memory cells each blocking a current path at a channel in response to the read voltage. The cell counter 260 provides a cell count nC to the control logic circuit 250.

For example, a result of counting memory cells each forming a current path at a channel in response to the read voltage of the nonvolatile memory device 200 indicates an on-cell count, or a result of counting memory cells each blocking a current path at a channel in response to the read voltage indicates an off-cell count.

The control logic circuit 250 may include a cell count compare circuit 251, a cell count table 252, a VVL LUT 253, and a VVL selecting unit 254. In an embodiment, the control logic circuit 250 may manage the cell count table 252. For example, the control logic circuit 250 may manage a cell count by using the cell count table 252. The cell count table 252 may include a cell count of each of a plurality of word lines.

The cell count compare circuit 251 may receive the cell count nC from the cell counter 260 after the 1-stage program operation is completed. The cell count compare circuit 251 manages a cell count in units of word line, but the present disclosure is not limited thereto. For example, the cell count compare circuit 251 may manage a cell count for each page, for each word line, for each sub-block, for each memory block, or for each plane.

In an embodiment, the control logic circuit 250 may perform a cell count compare operation. The cell count compare operation may indicate an operation of comparing cell counts of two specific points in time. For example, the cell count compare operation may indicate comparing a first cell count CC1 with a second cell count CC2. The first cell count CC1 may indicate an off-cell count of the k-th word line, which is based on a voltage corresponding to the uppermost state after the 1-stage program operation of the k-th word line. The second cell count CC2 may indicate an off-cell count of the k-th word line, which is based on the voltage corresponding to the uppermost state after the 1-stage program operation of the k-th word line. Alternately, the second cell count CC2 may indicate an off-cell count of the k-th word line, which is based on the voltage corresponding to the uppermost state when the 2-stage program operation of the k-th word line is started.

The cell count compare circuit 251 may refer to the cell count table 252. For example, the cell count compare circuit 251 may compare the first cell count CC1 stored in the cell count table 252 with the second cell count CC2 received from the cell counter 260. The cell count compare circuit 251 may provide a comparison result (e.g., a difference CCD between the first cell count CC1 and the second cell count CC2 (hereinafter referred to as "cell count difference")) to the VVL selecting unit 254.

The VVL LUT 253 may include mapping information about 2-stage verify voltage level differences according to the cell count differences CCD. For example, the VVL LUT 253 may be managed in units of memory block. The VVL LUT 253 may be determined in advance or updated depending on the number of program/erase cycles of a memory block and a characteristic of a memory block. For example, the VVL LUT 253 may be managed in units of word line. The VVL LUT 253 may be determined in advance or updated depending on a location of a word line. Alternatively, the VVL LUT 253 may be managed in units of plural verify voltages. The VVL LUT 253 may be determined in advance or updated with respect to each of a plurality of verify voltages. The VVL LUT 253 may be managed based on a combination of the above embodiments. The VVL LUT 253 may be determined in advance or updated based on a combination of the above embodiments. The VVL LUT 253 will be described in detail with reference to FIG. 14.

For example, the VVL selecting unit 254 may select a verify voltage level through the comparison result (i.e., the cell count difference CCD). The VVL selecting unit 254 may refer to verify voltage level difference information of the VVL LUT 253 for the purpose of selecting a verify voltage level. The VVL selecting unit 254 may adjust levels of 2-stage verify voltages. The VVL selecting unit 254 may output a new verify voltage, the voltage level of which is adjusted. The cell count compare circuit 251 and the VVL selecting unit 254 may be implemented in the form of hardware.

As described above, the nonvolatile memory device 100 may adjust the 2-stage verify voltage levels based on the cell count difference CCD, not the delay time DT.

Figure 13:
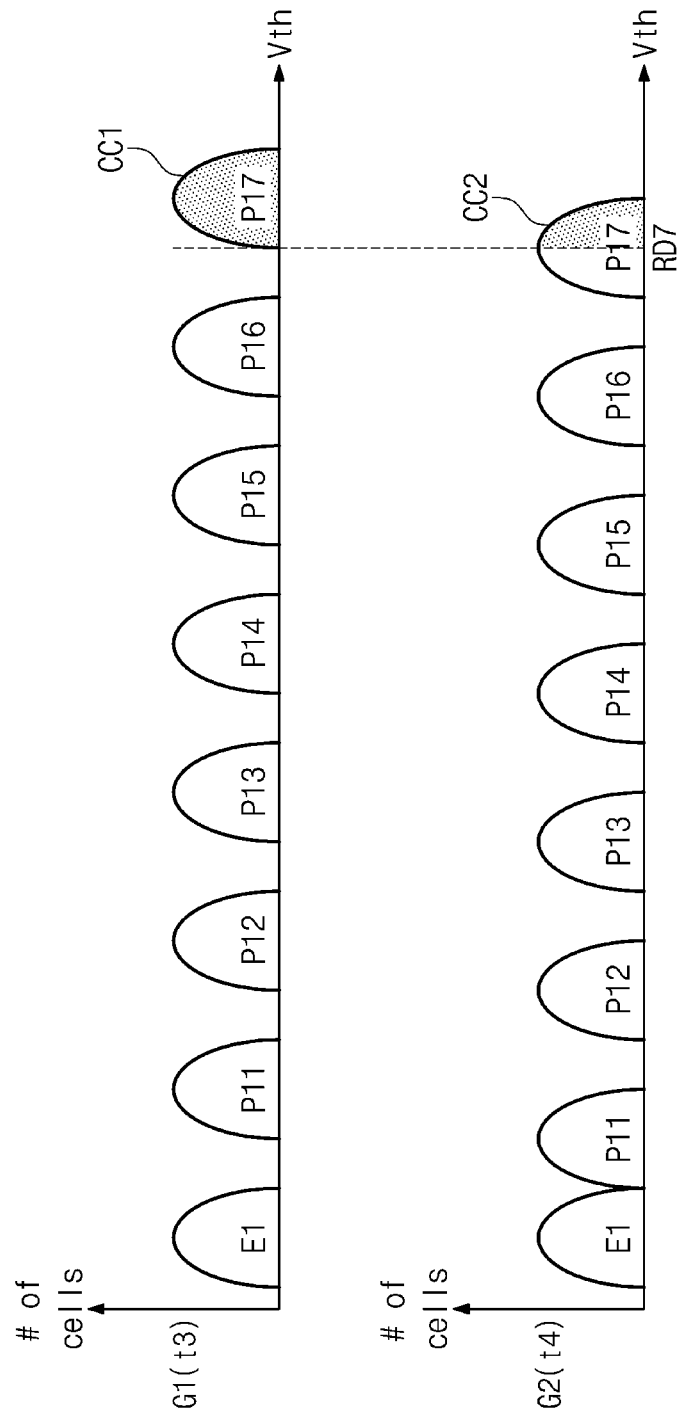
FIG. 13 illustrates distribution diagrams for describing a cell count compare operation of a nonvolatile memory device of FIG. 12.

FIG. 13 illustrates distribution diagrams for describing a cell count compare operation of a nonvolatile memory device of FIG. 12. In the distribution diagrams of FIG. 13, a horizontal axis represents a threshold voltage Vth of a memory cell, and a vertical axis represents the number of memory cells. In an embodiment, a change in threshold voltages when three bits are written in each memory cell is illustrated in FIG. 13.

Referring to FIGS. 6, 12, and 13, a first graph G1 shows a distribution diagram of memory cells of the sixth word line WL6 at the third point in time t3, and a second graph G2 shows a distribution diagram of the memory cells of the sixth word line WL6 at the fourth point in time t4. As the delay time DT increases, the distribution diagram at the third point in time t3 may change like the distribution diagram at the fourth point in time t4. That is, because trapped charges are discharged over time, threshold voltages of memory cells may be changed. As such, even though the cell count operations are performed by using the same voltage, cell counts may be different.

The nonvolatile memory device 200 may perform the cell count operation at the third point in time t3. For example, the cell counter 260 may perform an off-cell count operation by using a seventh read voltage RD7. An off-cell count (i.e., the first cell count CC1) of the sixth word line WL6 obtained by using the seventh read voltage RD7 at the third point in time t3 may be a first value VAL1. The cell counter 260 may provide the first cell count CC1 having the first value VAL1 to the cell count compare circuit 251. The cell count compare circuit 251 may store the first cell count CC1 in the cell count table 252 in association with the sixth word line WL6.

The cell counter 260 may perform the cell count operation at the fourth point in time t4. The cell counter 260 may perform the off-cell count operation by using the seventh read voltage RD7. An off-cell count (i.e., the second cell count CC2) of the sixth word line WL6 obtained by using the seventh read voltage RD7 at the fourth point in time t4 may be a second value VAL2. The second value VAL2 may be smaller than the first value VAL1. The cell counter 260 may provide the second cell count CC2 having the second value VAL2 to the cell count compare circuit 251.

The cell count compare circuit 251 may perform the cell count compare operation. The cell count compare circuit 251 may load the first cell count CC1 associated with the sixth word line WL6 from the cell count table 252. The cell count compare circuit 251 may calculate a difference between the first cell count CC1 and the second cell count CC2 and may output a comparison result to the VVL selecting unit 254. That is, the cell count compare circuit 251 may provide the cell count difference CCD between the first cell count CC1 and the second cell count CC2 (e.g., a third value VAL3 (=VAL1−VAL2)) so as to be provided to the VVL selecting unit 254.

FIG. 14 is a diagram illustrating an example of a VVL LUT of FIG. 12 according to example embodiments. Referring to FIGS. 12 and 14, the nonvolatile memory device 200 may include the VVL LUT 253. The VVL LUT 253 may include mapping information about 2-stage verify voltage level differences according to the cell count differences CCD.

For example, the VVL LUT 253 is a table for adjusting verify voltages associated with pages of triple level cells (TLC). However, the present disclosure is not limited thereto. For example, information included in the VVL LUT 253 may vary depending on the number of bits capable of being stored at a page of the nonvolatile memory device 200. The VVL LUT 253 may include a plurality of tables 253_1 to 253_4. Each of the plurality of tables 253_1 to 253_4 stores mapping information of a plurality of 2-stage verify voltages VFY21 to VFY27 and a plurality of verify voltage level differences. The plurality of 2-stage verify voltages VFY21 to VFY27 may be default 2-stage verify voltages that are applied when the cell count difference CCD is smaller than or equal to a second threshold value TH2.

The first VVL LUT 253_1 may include mapping information of the plurality of 2-stage verify voltages VFY21 to VFY27 and a plurality of verify voltage level differences ΔVFY1_5 to ΔVFY7_5 in the case where the cell count difference CCD is in a first range R1 (e.g., the cell count difference CCD is greater than or equal to a first reference count RC1 and is smaller than a second reference count RC2). For example, each of the plurality of 2-stage verify voltages VFY21 to VFY27 may decrease by a corresponding one of the plurality of verify voltage level differences ΔVFY1_5 to ΔVFY7_5 in the first range R1.

The second VVL LUT 253_2 may include mapping information of the plurality of 2-stage verify voltages VFY21 to VFY27 and a plurality of verify voltage level differences ΔVFY1_6 to ΔVFY7_6 in the case where the cell count difference CCD is in a second range R2 (e.g., the cell count difference CCD is greater than or equal to the second reference count RC2 and is smaller than a third reference count RC3). For example, each of the plurality of 2-stage verify voltages VFY21 to VFY27 may decrease by a corresponding one of the plurality of verify voltage level differences ΔVFY1_6 to ΔVFY7_6 in the second range R2.

The third VVL LUT 253_3 may include mapping information of the plurality of 2-stage verify voltages VFY21 to VFY27 and a plurality of verify voltage level differences ΔVFY1_7 to ΔVFY7_7 in the case where the cell count difference CCD is in a third range R3 (e.g., the cell count difference CCD is greater than or equal to the third reference count RC3 and is smaller than a fourth reference count RC4). For example, each of the plurality of 2-stage verify voltages VFY21 to VFY27 may decrease by a corresponding one of the plurality of verify voltage level differences ΔVFY1_7 to ΔVFY7_7 in the third range R3.

The fourth VVL LUT 253_4 may include mapping information of the plurality of 2-stage verify voltages VFY21 to VFY27 and a plurality of verify voltage level differences ΔVFY1_8 to ΔVFY7_8 in the case where the cell count difference CCD is in a fourth range R4 (e.g., the cell count difference CCD is greater than or equal to the fourth reference count RC4 and is smaller than a fifth reference count RC5). For example, each of the plurality of 2-stage verify voltages VFY21 to VFY27 may decrease by a corresponding one of the plurality of verify voltage level differences ΔVFY1_8 to ΔVFY7_8 in the fourth range R4.

It is assumed that the cell count difference CCD of the seventh word line WL7 is smaller than the second threshold value TH2 and the cell count difference CCD (e.g., the third value VAL3) of the sixth word line WL6 is greater than the second threshold value TH2. Also, it is assumed that the cell count difference CCD of the sixth word line WL6 is greater than or equal to the first reference count RC1 and is smaller than the second reference count RC2.

Because the cell count difference CCD of the seventh word line WL7 is smaller than the second threshold value TH2, the VVL selecting unit 254 may not adjust 2-stage verify voltages. The VVL selecting unit 254 may perform the 2-stage verify step based on the default 2-stage verify voltages.

In contrast, because the cell count difference CCD of the sixth word line WL6 is greater than the second threshold value TH2, the VVL selecting unit 254 may adjust 2-stage verify voltages. The VVL selecting unit 254 may output new 2-stage verify voltages whose voltage levels are adjusted. For example, because the cell count difference CCD of the sixth word line WL6 belongs to the first range R1, the VVL selecting unit 254 may refer to the first VVL LUT 253_1. The VVL selecting unit 254 may output the new verify voltage VFY21' (=VFY21+ΔVFY1_5) that is obtained by adding the first verify voltage level difference ΔVFY1_5 from the first verify voltage VFY21. The new first verify voltage VFY21' thus output may be used as a verify voltage for data stored in memory cells of the memory cell array 210. The remaining new verify voltages VFY22' to VFY27' are similar to the above description, and thus, additional description will be omitted to avoid redundancy.

Figure 15:
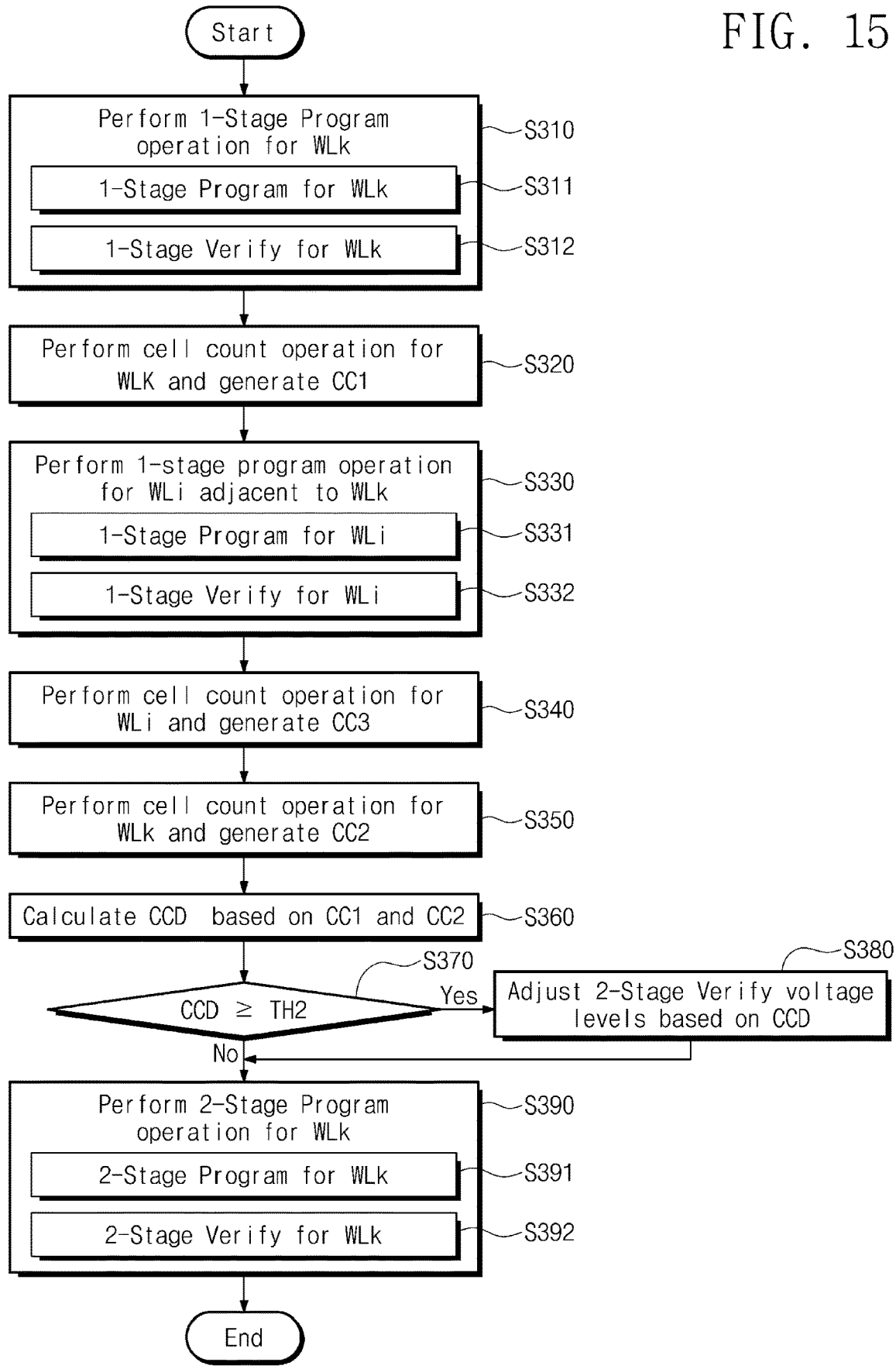
FIG. 15 is a flowchart illustrating an example of a program method of a nonvolatile memory device of FIG. 12 according to example embodiments.

FIG. 15 is a flowchart illustrating an example of a program method of a nonvolatile memory device of FIG. 12 according to example embodiments. Referring to FIGS. 12 and 15, in operation S310, the nonvolatile memory device 200 may perform the 1-stage program operation on the k-th word line WLk. For example, in operation S311, the nonvolatile memory device 200 may perform the 1-stage program step on the k-th word line WLk. In operation S312, the nonvolatile memory device 200 may perform the 1-stage verify step on the k-th word line WLk.

In operation S320, the nonvolatile memory device 200 may perform the cell count operation on the k-th word line WLk to generate the first cell count CC1. For example, after the 1-stage program operation for the k-th word line WLk is completed, the cell counter 260 may perform the off-cell count operation on the k-th word line WLk based on the uppermost read voltage (i.e., the seventh read voltage RD7) or a read voltage corresponding to the uppermost program state (e.g., a seventh program state P17). The cell counter 260 may output the first cell count CC1, which is the off-cell count for the k-th word line WLk obtained based on the uppermost read voltage, to the cell count compare circuit 251. The cell count compare circuit 251 may receive the first cell count CC1. The cell count compare circuit 251 may store the first cell count CC1 in the cell count table 252 in association with the k-th word line WLk.

In operation S330, the nonvolatile memory device 200 may perform the 1-stage program operation on at least one word line WL1 (e.g., the (k−1)-th word line WLk−1) adjacent to the k-th word line WLk. For example, in operation S331, the nonvolatile memory device 200 may perform the 1-stage program step on the word line WL1. In operation S332, the nonvolatile memory device 200 may perform the 1-stage verify step on the word line WL1.

In operation S340, the nonvolatile memory device 200 may perform the cell count operation on the adjacent word line WL1 to generate a third cell count CC3. For example, after the 1-stage program operation for the adjacent word line WL1 is completed, the cell counter 260 may perform the off-cell count operation on the adjacent word line WL1 based on the uppermost read voltage (i.e., the seventh read voltage RD7) or the read voltage corresponding to the uppermost program state (e.g., the seventh program state P17). The cell counter 260 may output the third cell count CC3, which is the off-cell count for the adjacent word line WL1 obtained based on the uppermost read voltage, to the cell count compare circuit 251. The cell count compare circuit 251 may receive the third cell count CC3. The cell count compare circuit 251 may store the third cell count CC3 in the cell count table 252 in association with the adjacent word line WL1.

In operation S350, the nonvolatile memory device 200 may perform the cell count operation on the k-th word line WLk to generate the second cell count CC2. For example, after the 1-stage program operation for the adjacent word line WL1 is completed, the cell counter 260 may perform the off-cell count operation on the k-th word line WLk based on the uppermost read voltage (i.e., the seventh read voltage RD7) or a read voltage corresponding to the uppermost program state (e.g., the seventh program state P17). The cell counter 260 may output the second cell count CC2, which is the off-cell count for the k-th word line WLk obtained based on the uppermost read voltage, to the cell count compare circuit 251. The cell count compare circuit 251 may receive the second cell count CC2. The cell count compare circuit 251 may store the second cell count CC2 in the cell count table 252 in association with the k-th word line WLk.

In operation S360, the nonvolatile memory device 200 may calculate the cell count difference CCD based on the first cell count CC1 and the second cell count CC2. The cell count compare circuit 251 may load the first and second cell counts CC1 and CC2 associated with the k-th word line WLk from the cell count table 252. The cell count compare circuit 251 may perform the cell count compare operation. The cell count compare circuit 251 may calculate a difference between the first cell count CC1 and the second cell count CC2 to generate the cell count difference CCD.

In operation S370, the nonvolatile memory device 200 may compare the cell count difference CCD with the second threshold value TH2. For example, the cell count compare circuit 251 may determine whether the cell count difference CCD is greater than or equal to the second threshold value TH2. When it is determined that the cell count difference CCD is greater than or equal to the second threshold value TH2, the nonvolatile memory device 200 perform operation S380; when it is determined that the cell count difference CCD is smaller than the second threshold value TH2, the nonvolatile memory device 200 performs operation S390.

In operation S380, the nonvolatile memory device 200 may adjust 2-stage verify voltage levels based on the cell count difference CCD. For example, the VVL selecting unit 254 may receive the cell count difference CCD from the cell count compare circuit 251. The VVL selecting unit 254 may refer to verify voltage level difference information of the VVL LUT 253 based on the cell count difference CCD. The VVL selecting unit 254 may adjust the 2-stage verify voltage levels based on the verify voltage level difference information.

In operation S390, the nonvolatile memory device 200 may perform the 2-stage program operation on the k-th word line WLk. In operation S391, the nonvolatile memory device 200 may perform a 2-stage program step on the k-th word line WLk. In operation S392, the nonvolatile memory device 200 may perform the 2-stage verify step on the k-th word line WLk.

For example, when the cell count difference CCD is equal to or smaller than the second threshold value TH2, the VVL selecting unit 254 may output default 2-stage verify voltages. As such, the nonvolatile memory device 200 may perform the 2-stage verify step based on the default 2-stage verify voltages. When the cell count difference CCD is greater than the second threshold value TH2, the VVL selecting unit 254 may output new 2-stage verify voltages whose voltage levels are adjusted. As such, the nonvolatile memory device 200 may perform the 2-stage verify step based on the new 2-stage verify voltages whose voltage levels are adjusted.

As described above, the nonvolatile memory device 200 may adjust the 2-stage verify voltage levels based on the cell count difference CCD. As such, a nonvolatile memory device with improved reliability is provided.

Figure 16:
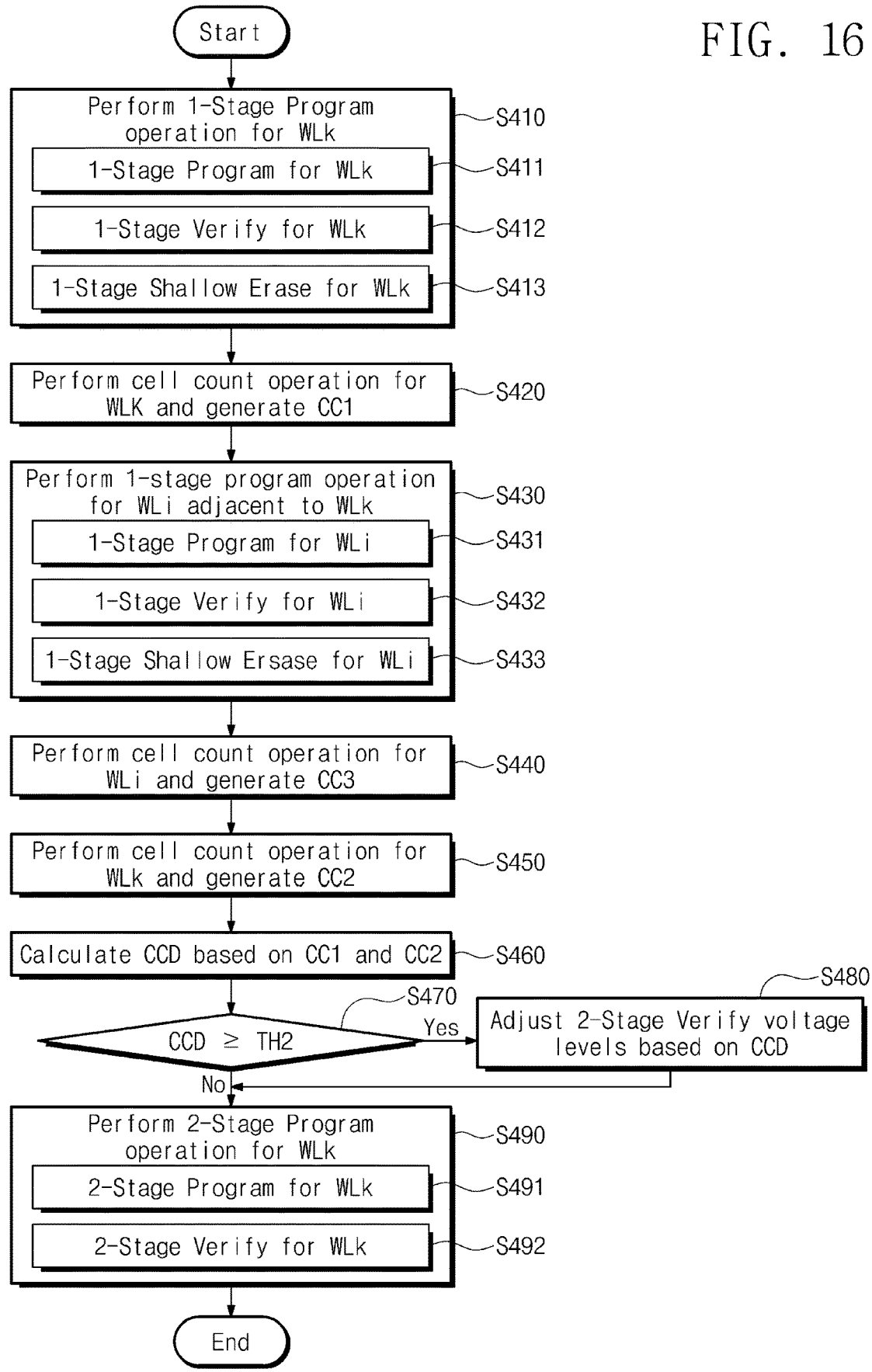
FIG. 16 is a flowchart illustrating an example of a program method of a nonvolatile memory device of FIG. 12 according to example embodiments.

FIG. 16 is a flowchart illustrating an example of a program method of a nonvolatile memory device of FIG. 12 according to example embodiments. Referring to FIGS. 12 and 16, in operation S410, the nonvolatile memory device 200 may perform the 1-stage program operation on the k-th word line WLk. For example, in operation S411, the nonvolatile memory device 200 may perform the 1-stage program step on the k-th word line WLk. In operation S412, the nonvolatile memory device 200 may perform the 1-stage verify step on the k-th word line WLk. In operation S413, the nonvolatile memory device 200 may perform the 1-stage shallow erase step on the k-th word line WLk. Operation S411 to operation S413 are similar to operation S211 to operation S213 of FIG. 10, and thus, a detailed description thereof will not be repeated here.

In operation S420, the nonvolatile memory device 200 may perform the cell count operation on the k-th word line WLk to generate the first cell count CC1. Operation S420 is similar to operation S320 of FIG. 15, and thus, additional description will be omitted to avoid redundancy.

In operation S430, the nonvolatile memory device 200 may perform the 1-stage program operation on at least one word line WL1 (e.g., the (k−1)-th word line WLk−1) adjacent to the k-th word line WLk. For example, in operation S431, the nonvolatile memory device 200 may perform the 1-stage program step on the word line WL1. In operation S432, the nonvolatile memory device 200 may perform the 1-stage verify step on the word line WL1. In operation S433, the nonvolatile memory device 200 may perform the 1-stage shallow erase step on the word line WL1. Operation S431 to operation S433 are similar to operation S231 to operation S233 of FIG. 10, and thus, a detailed description thereof will not be repeated here.

Afterwards, operation S440 to operation S480 may be performed. Operation S440 to operation S480 are similar to operation S340 to operation S380 of FIG. 15, and thus, additional description will be omitted to avoid redundancy.

In operation S490, the nonvolatile memory device 200 may perform the 2-stage program operation on the k-th word line WLk. In operation S491, the nonvolatile memory device 200 may perform a 2-stage program step on the k-th word line WLk. In operation S492, the nonvolatile memory device 200 may perform the 2-stage verify step on the k-th word line WLk. Unlike the 1-stage program operation, the 2-stage program operation may not include the shallow erase step.

Figure 17:
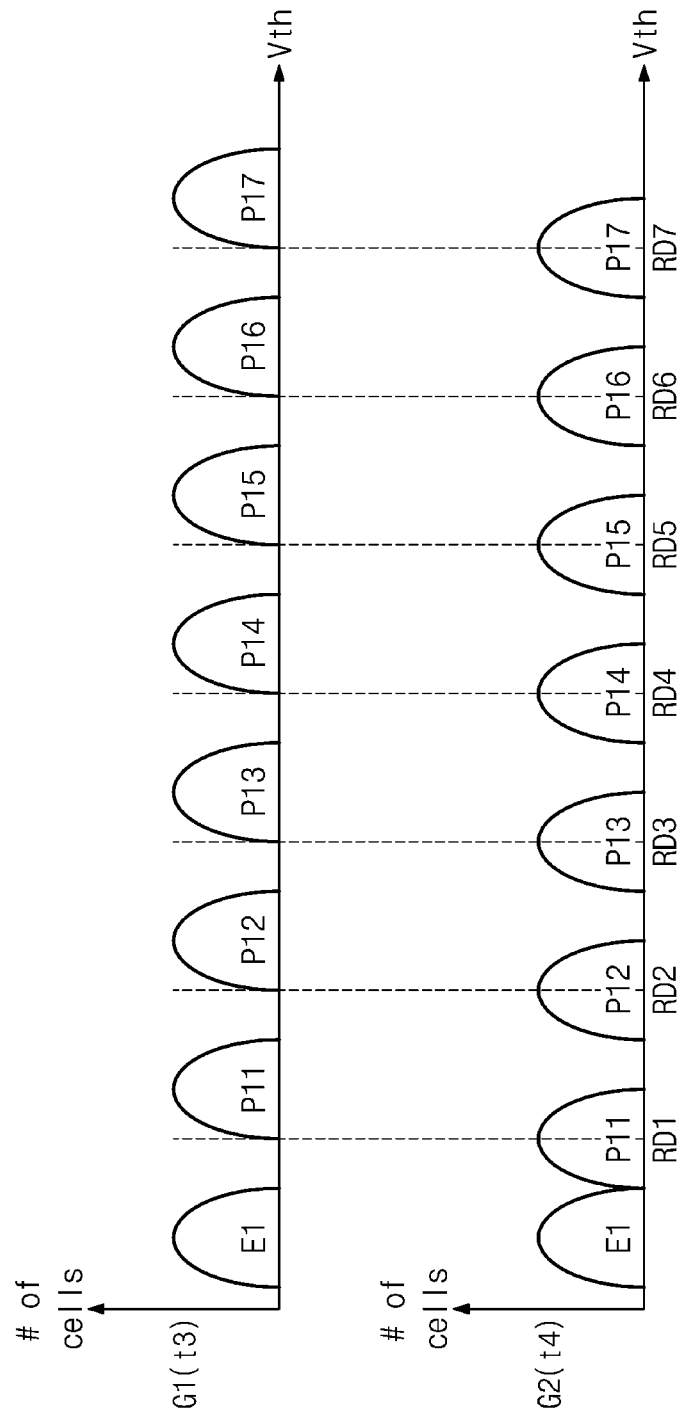
FIG. 17 illustrates distribution diagrams for describing a cell count compare operation of a nonvolatile memory device of FIG. 12 according to example embodiments.

FIG. 17 illustrates distribution diagrams for describing a cell count compare operation of a nonvolatile memory device of FIG. 12 according to example embodiments. In the distribution diagrams of FIG. 17, a horizontal axis represents a threshold voltage Vth of a memory cell, and a vertical axis represents the number of memory cells. In an embodiment, a change in threshold voltages when three bits are written in each memory cell is illustrated in FIG. 17.

Referring to FIGS. 6, 12, and 17, the first graph G1 shows a distribution diagram of the memory cells of the sixth word line WL6 at the third point in time t3, and the second graph G2 shows a distribution diagram of the memory cells of the sixth word line WL6 at the fourth point in time t4.

Referring again to FIG. 13, the nonvolatile memory device 200 may perform the off-cell count operation based on the seventh read voltage RD7 respectively at the third point in time t3 and the fourth point in time t4 and may compare the first cell count CC1 and the second cell count CC2. However, the present disclosure is not limited thereto. The nonvolatile memory device 200 may perform on-cell or off-cell count operations by using a plurality of read voltages RD1 to RD7. For example, the nonvolatile memory device 200 may compare a plurality of first cell counts and a plurality of second cell counts.

Referring to FIG. 17, at the third point in time t3, the cell counter 260 may generate a first cell count CC1_1 by performing the on-cell count operation on the sixth word line WL6 based on the second read voltage RD2 and may generate a first cell count CC1_2 by performing the on-cell count operation on the sixth word line WL6 based on the sixth read voltage RD6. The cell counter 260 may provide the first cell counts CC1_1 and CC1_2 to the cell count compare circuit 251. The cell count compare circuit 251 may store the first cell counts CC1_1 and CC1_2 in the cell count table 252 in association with the sixth word line WL6.

At the fourth point in time t4, the cell counter 260 may generate a second cell count CC2_1 by performing the on-cell count operation on the sixth word line WL6 based on the second read voltage RD2 and may generate a second cell count CC2_2 by performing the on-cell count operation on the sixth word line WL6 based on the sixth read voltage RD6. The cell counter 260 may provide the second cell counts CC2_1 and CC2_2 to the cell count compare circuit 251. The cell count compare circuit 251 may load the first cell counts CC1_1 and CC1_2 from the cell count table 252. The cell count compare circuit 251 may compare the first cell counts CC1_1 and CC1_2 at the third point in time t3 and the second cell counts CC2_1 and CC2_2 at the fourth point in time t4.

The cell count compare circuit 251 may compare a difference between a plurality of cell counts. In detail, the cell count compare circuit 251 may compare a difference "CC1_2−CC1_1" between first cell counts and a difference "CC2_2−CC2_1" between second cell counts. Alternatively, the cell count compare circuit 251 may compare a plurality of first cell counts and a plurality of second cell counts, respectively. In detail, the cell count compare circuit 251 may compare the first cell count CC1_1 and the second cell count CC2_1 and may compare the first cell count CC1_2 and the second cell count CC2_2. This is only an embodiment of the present disclosure. The number of counts targeted for comparison may increase or decrease, and the cell count compare circuit 251 may perform the cell count compare operation by using various comparison methods.

As described above, the nonvolatile memory device 200 may perform the cell count compare operation based on a plurality of first cell counts and a plurality of second cell counts. The nonvolatile memory device 200 may adjust 2-stage verify voltage levels based on a comparison result of the cell count compare operation.

Figure 18:
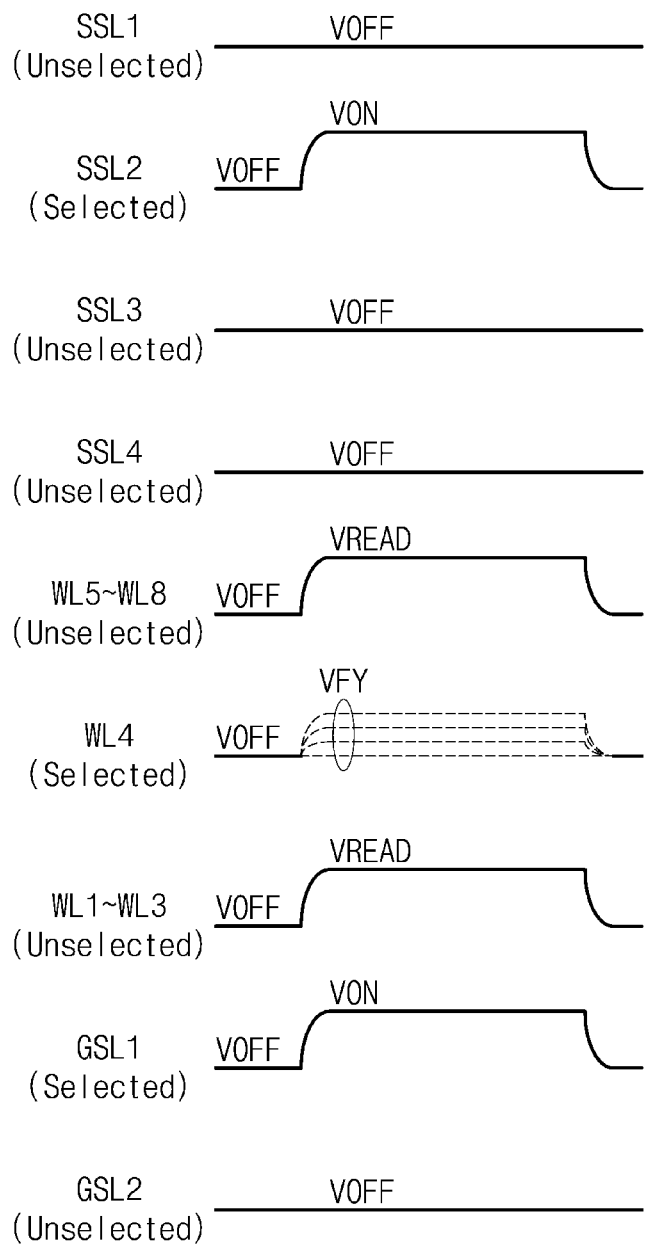
FIG. 18 illustrates an example of voltages applied to a memory block of FIG. 2 in a verify operation according to an embodiment of the present disclosure.

FIG. 18 illustrates an example of voltages applied to the memory block BLKa of FIG. 2 in a verify operation according to an embodiment of the present disclosure. Referring to FIGS. 1, 2, 12, and 18, the fourth word line WL4 and the second string selection lines SSL2 may be selected. That is, memory cells corresponding in common to the fourth word line WL4 and the second string selection lines SSL2 may be selected as a target of a verify operation.

The address decoder 120 or 220 may maintain voltages of unselected first string selection lines SSL1 as an OFF voltage VOFF. The OFF voltage VOFF may turn off the string selection transistors SST connected to the first string selection lines SSL1. For example, the OFF voltage VOFF applied to the string selection transistor SST adjacent to the bit line BL2 and the OFF voltage VOFF applied to the string selection transistor SST adjacent to the eighth memory cell MC8 may be different.

The address decoder 120 or 220 may apply an ON voltage VON to the selected second string selection lines SSL2. The ON voltage VON may turn on the string selection transistors SST connected to the second string selection lines SSL2. For example, the ON voltage VON applied to the string selection transistor SST adjacent to the bit line BL2 and the ON voltage VON applied to the string selection transistor SST adjacent to the eighth memory cell MC8 may be different.

As in the first string selection lines SSL1, the address decoder 120 or 220 may maintain voltages of unselected third string selection lines SSL3 and unselected fourth string selection lines SSL4 as the OFF voltage VOFF. Levels of the OFF voltages VOFF that are applied to the unselected first string selection lines SSL1, the unselected third string selection lines SSL3, and the unselected fourth string selection lines SSL4 may be different from or equal to each other.

The address decoder 120 or 220 may apply a read pass voltage VREAD to unselected first to third word lines WL1 to WL3 and unselected fifth to eighth word lines WL5 and WL8. The read pass voltage VREAD may be a high voltage that is greater than threshold voltages of the first to third memory cells MC1 to MC3 and the fifth to eighth memory cells MC5 to MC8. Levels of the read pass voltages VREAD that are applied to the unselected first to third word lines WL1 to WL3 and the unselected fifth to eighth word lines WL5 and WL8 may be different from or equal to each other.

The address decoder 120 or 220 may apply a verify voltage VFY to the selected fourth word line WL4. The verify voltage VFY may have one of various levels depending on a target to be read, as marked by a dotted line.

The address decoder 120 or 220 may apply the ON voltage VON to a selected first ground selection line GSL1. A level of the ON voltage VON applied to the first ground selection line GSL1 may be different from or equal to the ON voltage VON applied to the second string selection lines SSL2.

The address decoder 120 or 220 may maintain a voltage of an unselected second ground selection line GSL2 as the OFF voltage VOFF. A level of the OFF voltage VOFF applied to the second ground selection line GSL2 may be different from or equal to the OFF voltage VOFF applied to the first, third, and fourth string selection lines SSL1, SSL3, and SSL4.

In an embodiment, the nonvolatile memory device 100 or 200 according to an embodiment of the present disclosure may adjust a 2-stage verify voltage. The nonvolatile memory device 100 or 200 may adjust a level of the verify voltage VFY to be applied to the selected fourth word line WL4. For example, in the 2-stage verify step, the nonvolatile memory device 100 or 200 may apply a verify voltage adjusted based on the delay time DT or the cell count difference CCD.

In an embodiment, the nonvolatile memory device 100 or 200 may adjust a level of the read pass voltage VREAD to be applied to unselected word lines, instead of adjusting a level of a verify voltage to be applied to a selected word line. For example, the nonvolatile memory device 100 or 200 may increase or decrease the level of the read pass voltage VREAD based on the delay time DT or the cell count difference CCD.

Figure 19:
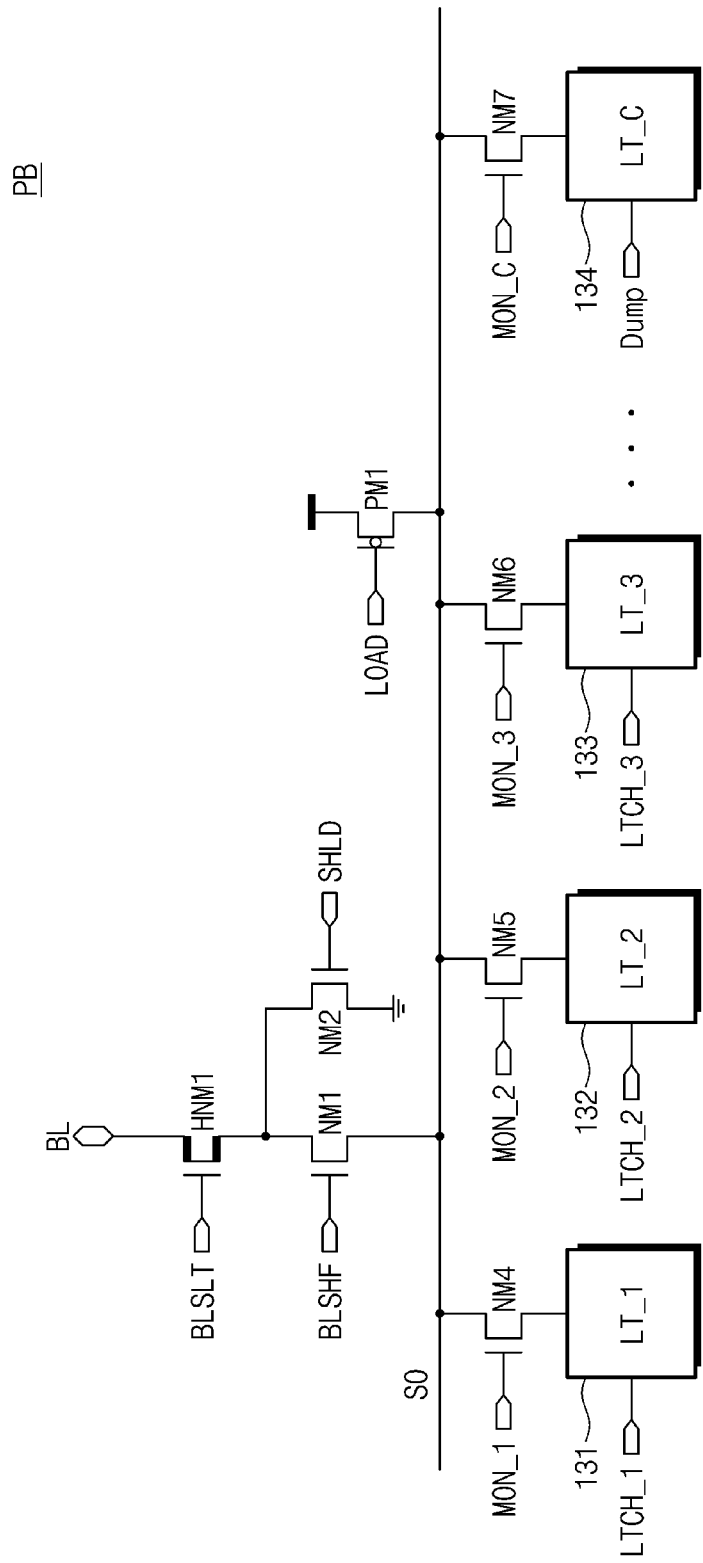
FIG. 19 illustrates an example of one page buffer corresponding to one bit line from among components of a page buffer circuit according to an embodiment of the present disclosure.
Figure 20:
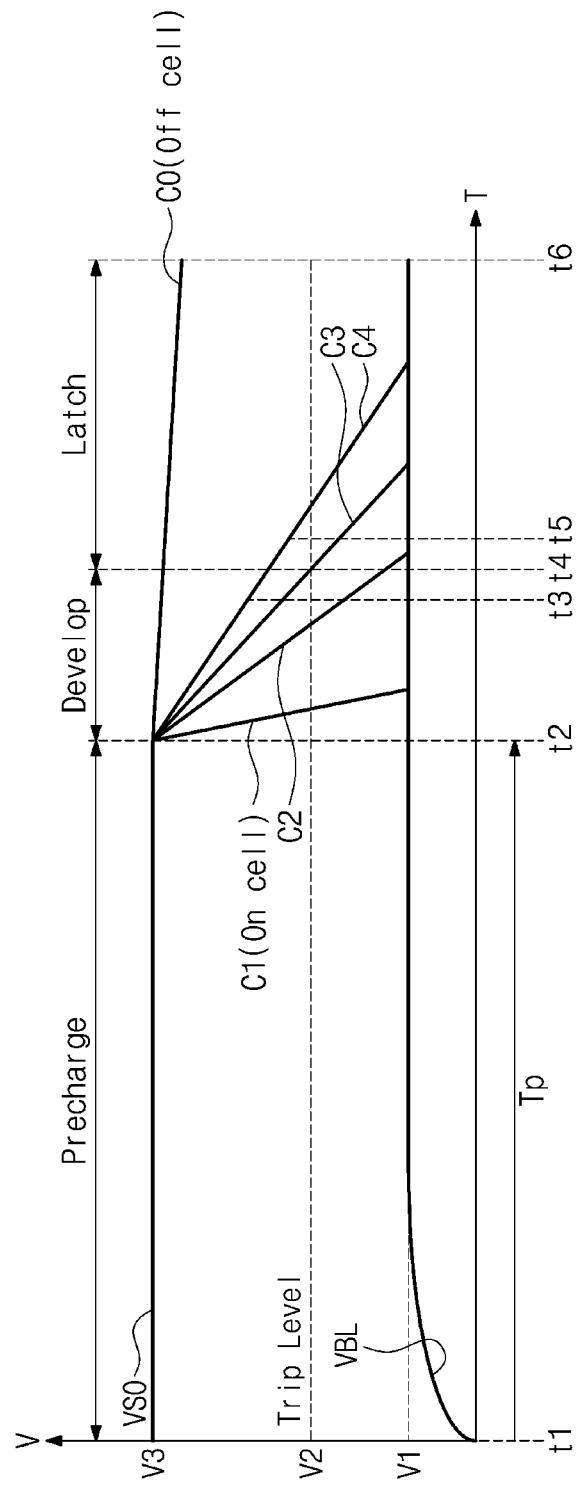
FIG. 20 is a timing diagram illustrating a level change of a sensing node in a verify operation according to an embodiment of the present disclosure.

FIG. 19 illustrates an example of one page buffer PB corresponding to one bit line BL from among components of the page buffer circuit 130 or 230 according to an embodiment of the present disclosure. FIG. 20 is a timing diagram illustrating a level change of a sensing node SO in a verify operation according to an embodiment of the present disclosure. A method that provides an effect similar to applying an adjusted verify voltage to a selected word line will be described with reference to FIGS. 19 and 20.

Referring to FIGS. 1 and 19, a page buffer PB connected to the bit line BL may be connected to memory cells of a cell string. The page buffer PB includes the sensing node SO connected to the bit line BL. The page buffer PB may include a plurality of latches 131, 132, 133, . . . , and 134 connected to the sensing node SO.

In the read operation, the bit line BL may be precharged by the control logic circuit 150 or 250. For example, when a load signal LOAD and a control signal BLSHF are activated, the bit line BL may be precharged to a specific voltage level (e.g., a first voltage V1). In this case, a high voltage transistor HNM1 may maintain a turn-on state by a bit line selection signal BLSLT.

Next, when the load signal LOAD is deactivated, charges precharged at the sensing node SO may flow into the bit line BL through a transistor NM1 which is turned on by the control signal BLSHF. When the selected memory cell is an on-cell, charges precharged at the sensing node SO may be discharged to the common source line CSL through the bit line BL and a channel of the selected cell string. In this case, because a current flowing from the sensing node SO to the bit line BL is relatively great, a speed at which a voltage of the sensing node SO drops may be relatively fast. In contrast, when the selected memory cell is an off-cell, it may be difficult for the charges precharged at the sensing node SO to be discharged to the common source line CSL through the bit line BL. Accordingly, because a current flowing from the sensing node SO to the bit line BL is relatively small, a speed at which a voltage of the sensing node SO drops may be relatively slow.

Latch control signals LTCH_1, LTCH_2, LTCH_3, . . . , and Dump for storing a developed state of the sensing node SO may be provided to the plurality of latches 131, 132, 133, . . . , and 134 of the page buffer PB of the present disclosure.

For example, the latch 131 may be controlled to sequentially only latch the state of the sensing node SO. The plurality of latches 132, 133, . . . , and 134 may be controlled such that the sensed data are copied from the latch 131. The latch 134 may be used to output data of one latch selected from the plurality of latches.

In an embodiment, the nonvolatile memory device 100 or 200 may adjust 2-stage verify voltage levels with respect to all the bit lines BL, based on the delay time DT or the cell count difference CCD. Alternatively, the nonvolatile memory device 100 or 200 may adjust the 2-stage verify voltage levels with respect to a specific bit line BL, based on the delay time DT or the cell count difference CCD. For example, the nonvolatile memory device 100 or 200 may adjust the 2-stage verify voltage levels only with respect to the first bit line BL1 of a plurality of bit lines, based on the delay time DT or the cell count difference CCD. Alternatively, the nonvolatile memory device 100 or 200 may adjust the 2-stage verify voltage levels only with respect to even-numbered bit lines of the plurality of bit lines, based on the delay time DT or the cell count difference CCD. Alternatively, the nonvolatile memory device 100 or 200 may adjust the 2-stage verify voltage levels only with respect to odd-numbered bit lines of the plurality of bit lines, based on the delay time DT or the cell count difference CCD.

FIG. 20 briefly shows a level change of the sensing node SO according to a threshold voltage level of a memory cell and a latch result according to a develop point in time. A time period from a first point in time t1 to a second point in time t2 may be referred to as a "precharge period", or a "precharge time," a time period from the second point in time t2 to a fourth point in time t4 may be referred to as a "develop period", or a "develop time," and a time period after the fourth point in time t4 may be referred to as a "latch period", or a "latch time". In the develop period, the load signal LOAD may be deactivated; in the latch period, the control signal BLSHF may be deactivated.

In the precharge period, both the load signal LOAD and the control signal BLSHF may be activated, and thus, a bit line and a sensing node may be precharged. In the precharge period, a bit line voltage VBL of the bit line BL may be charged to a level of the first voltage V1. In the precharge period, the sensing node SO may be charged to a specific voltage level (e.g., a third voltage V3).

In an embodiment, in the 2-stage verify step, the nonvolatile memory device 100 or 200 may adjust a level of a bit line precharge voltage, instead of adjusting a level of a verify voltage to be applied to a selected word line. For example, the nonvolatile memory device 100 or 200 may adjust the level of the first voltage V1 based on the delay time DT or the cell count difference CCD.

In an embodiment, in the 2-stage verify step, the nonvolatile memory device 100 or 200 may adjust a bit line precharge time, instead of adjusting a level of a verify voltage to be applied to a selected word line. For example, the nonvolatile memory device 100 or 200 may adjust a precharge time Tp based on the delay time DT or the cell count difference CCD.

In an embodiment, in the 2-stage verify step, the nonvolatile memory device 100 or 200 may adjust a voltage level of the sensing node SO, instead of adjusting a level of a verify voltage to be applied to a selected word line. For example, the nonvolatile memory device 100 or 200 may adjust the level of a sensing node voltage VSO of the sensing node SO based on the delay time DT or the cell count difference CCD.

At the second point in time t2 when the develop period starts, the load signal LOAD may be deactivated. In the develop period, the control signal BLSHF may still maintain an activated state. Accordingly, charges precharged at the sensing node SO may move to the bit line BL depending on a threshold voltage state of the selected memory cell.

In the case of a strong off-cell whose threshold voltage is relatively greater than a read voltage, a level change of the sensing node SO may be relatively small. A curve C0 shows a potential change of the sensing node SO associated with the strong-off cell in the develop period. In the case of a strong on-cell whose threshold voltage is relatively smaller than the read voltage, a level change of the sensing node SO may be relatively great. A curve C1 shows a potential change of the sensing node SO associated with the strong on-cell in the develop period. The strong off-cell or strong on-cell may not be significantly affected by a slight change of a develop time.

Curves C2, C3, and C4 show potential changes of the sensing node SO in the case of sensing memory cells whose threshold voltages are close to a verify voltage. The curve C2 shows a develop tendency of a memory cell having a threshold voltage slightly smaller than the verify voltage. The curve C3 shows a develop tendency of a memory cell having a threshold voltage nearly similar to the verify voltage. The curve C4 shows a develop tendency of a memory cell having a threshold voltage slightly greater than the verify voltage.

In an embodiment, in the 2-stage verify step, the nonvolatile memory device 100 or 200 may adjust a develop time, instead of adjusting a level of a verify voltage to be applied to a selected word line. For example, the nonvolatile memory device 100 or 200 may adjust a develop time based on the delay time DT or the cell count difference CCD.

For example, at the third point in time t3, the nonvolatile memory device 100 or 200 may latch voltages of the sensing nodes SO of memory cells. In the case of the strong off-cell (e.g., the curve C0), a logical value corresponding to the off-cell may be stored in a latch; in the case of the strong on-cell (e.g., the curve C1), a logical value corresponding to the on-cell may be stored in a latch. However, in the case of memory cells whose threshold voltages are relatively small (refer to the curve C2), the logical value corresponding to the on-cell may be latched. In contrast, in the case of memory cells corresponding to the curves C3 and C4, the logical value corresponding to the off-cell may be latched in response to the first latch signal LTCH_1.

For example, at the fourth point in time t4, the nonvolatile memory device 100 or 200 may latch a voltage of the sensing node SO. As in the third point in time t3, logic "0" may be latched in the case of the strong off-cell (e.g., corresponding to the curve C0), and logic "1" may be latched in the case of the strong on-cell (e.g., corresponding to the curve C1). However, in the case of memory cells having threshold voltages corresponding to the curve C2, logic "1" corresponding to the on-cell may be latched. In contrast, in the case of memory cells corresponding to the curve C3, a potential of the sensing node SO corresponding to a trip level V2 may be latched in response to the second latch signal LTCH_2. For example, logic "0" and logic "1" may not be clearly distinguished at the trip level V2. In the case of memory cells corresponding to the curve C4, logic "0" corresponding to the off-cell may be latched in response to the second latch signal LTCH_2.

For example, at the fifth point in time t5, the nonvolatile memory device 100 or 200 may latch a voltage of the sensing node SO. As in the third point in time t3, logic "0" may be latched in the case of the strong off-cell (e.g., corresponding to the curve C0), and logic "1" may be latched in the case of the strong on-cell (e.g., corresponding to the curve C1). However, in the case of memory cells having threshold voltages corresponding to the curves C2 and C3, logic "1" corresponding to the on-cell may be latched. In the case of memory cells corresponding to the curve C4, logic "0" corresponding to the off-cell may be latched in response to the third latch signal LTCH_3.

To determine one state, a manner in which a state of the sensing node SO is latched as a logical value at different develop points in time is described above. The above manner may provide the advantage substantially similar to the advantage obtained by applying verify voltages of different levels to a word line depending on develop points in time. For example, the advantage that is obtained by increasing the develop time may be similar to the advantage that is obtained by increasing the verify voltage level, and the advantage that is obtained decreasing the develop time may be similar to the advantage that is obtained by decreasing the verify voltage level.

Figure 21:
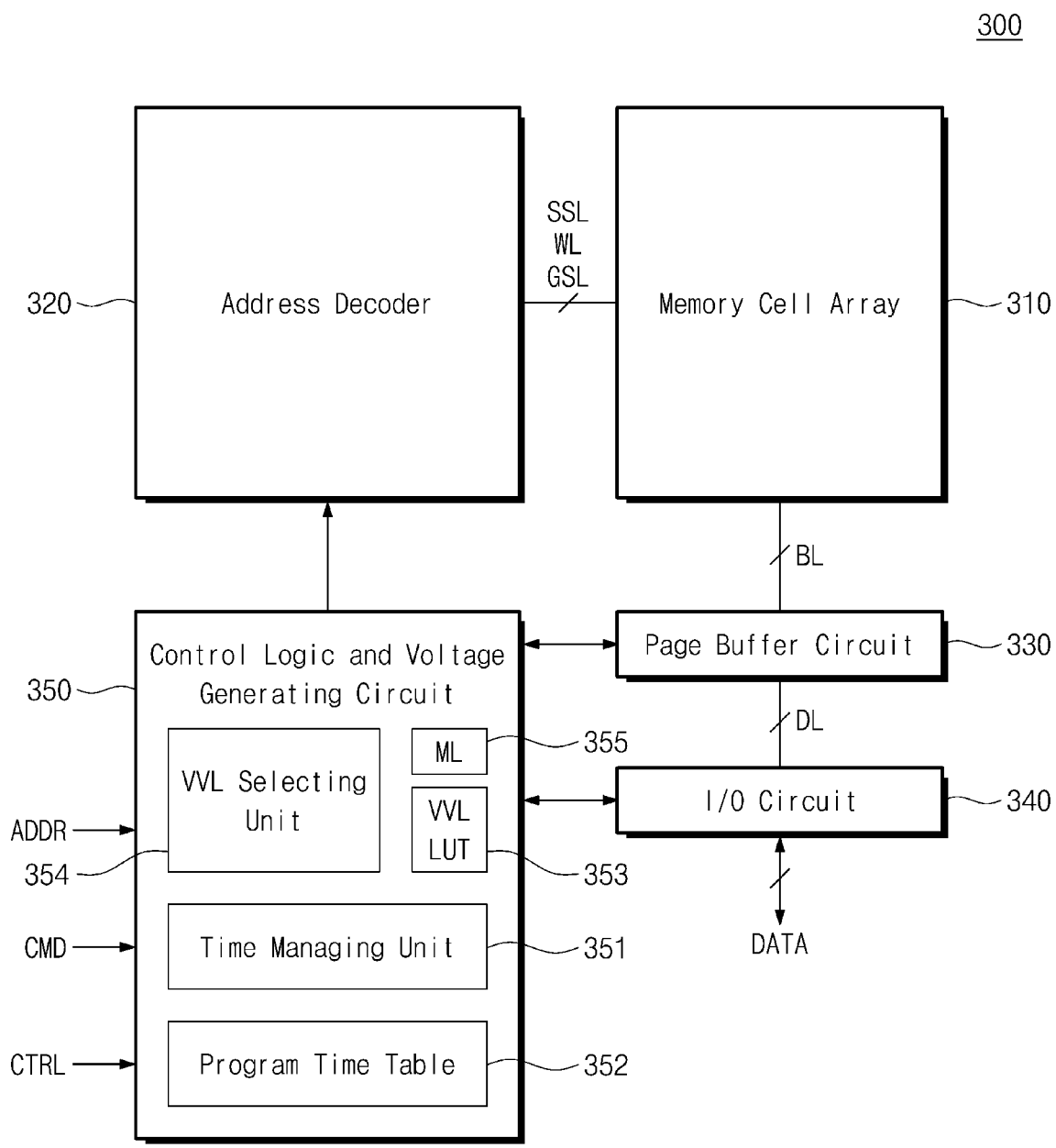
FIG. 21 is a block diagram illustrating a nonvolatile memory device according to an embodiment of the present disclosure.

FIG. 21 is a block diagram illustrating a nonvolatile memory device 300 according to an embodiment of the present disclosure. Referring to FIG. 21, the nonvolatile memory device 300 may include a memory cell array 310, an address decoder 320, a page buffer circuit 330, an input/output circuit 340, and a control logic and voltage generating circuit (hereinafter referred to as a "control logic circuit") 350. The control logic circuit 350 may include a time managing unit 351, a program time table 352, a VVL LUT 353, a VVL selecting unit 354, and machine learning logic 355.

Compared to the nonvolatile memory device 100 of FIG. 1, the control logic circuit 350 of the nonvolatile memory device 300 may further include the machine learning logic 355. The machine learning logic 355 may include a hardware configuration, a software configuration, or a hybrid configuration thereof. For example, the machine learning logic 355 may include a dedicated hardware circuit configured to perform a specific operation. Alternatively, the machine learning logic 355 may include one or more processor cores that execute an instruction set of a program code configured to perform the specific operation.

The machine learning logic 355 may compute a verify voltage level difference based on the delay time DT and access environment information. For example, the access environment information may include at least one of a location of a target block, a location of a target string selection line, a location of a target word line, a temperature (e.g., an operating temperature of the nonvolatile memory device), the number of program/erase cycles, and a cell count. As such, the machine learning logic 355 may accurately compute a verify voltage level difference to be applied to a 2-stage verify voltage. The machine learning logic 355 may provide the computed verify voltage level difference to the VVL selecting unit 354.

In an embodiment, the VVL selecting unit 354 may receive the verify voltage level difference from the VVL LUT 353. Alternatively, the VVL selecting unit 354 may receive the verify voltage level difference computed by the machine learning logic 355. The VVL selecting unit 354 may adjust the 2-stage verify voltage based on the verify voltage level difference.

Figure 22:
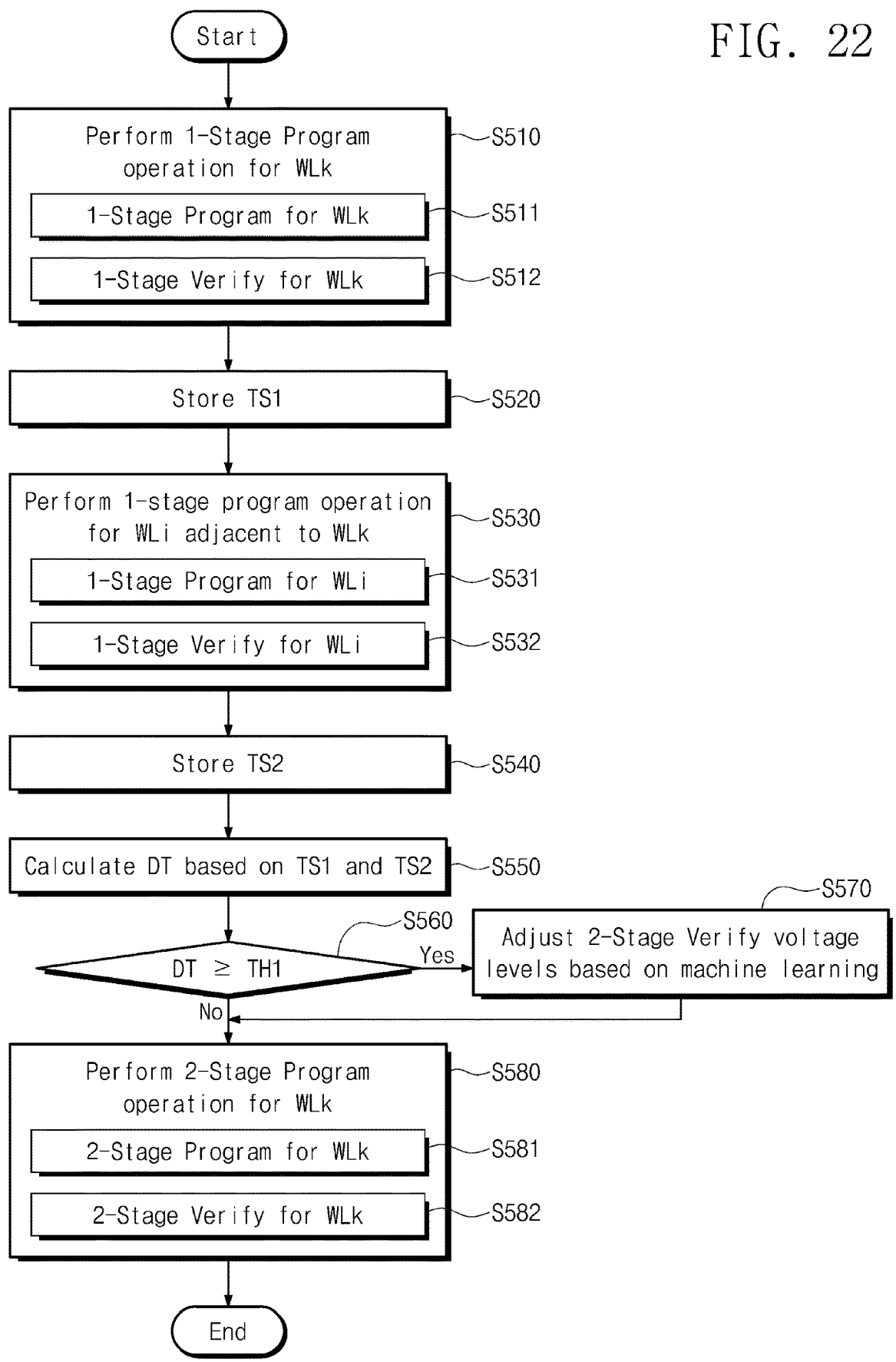
FIG. 22 illustrates an example of a program operation of a nonvolatile memory device of FIG. 21 according to example embodiments.

FIG. 22 illustrates an example of a program operation of the nonvolatile memory device 300 of FIG. 21 according to example embodiments. Referring to FIGS. 21 and 22, operation S510 to operation S560 may be performed to be the same as operation S110 to operation S160 of FIG. 9. Thus, additional description will be omitted to avoid redundancy.

In operation S570, the nonvolatile memory device 300 may adjust a 2-stage verify voltage based on the machine learning. For example, the machine learning logic 355 may compute a verify voltage level difference based on the delay time DT and access environment information. The machine learning logic 355 may provide the verify voltage level difference to the VVL selecting unit 354. The VVL selecting unit 354 may adjust 2-stage verify voltage levels based on the verify voltage level difference. Operation S580 may be performed to be the same as operation S180 of FIG. 9.

Figure 23:
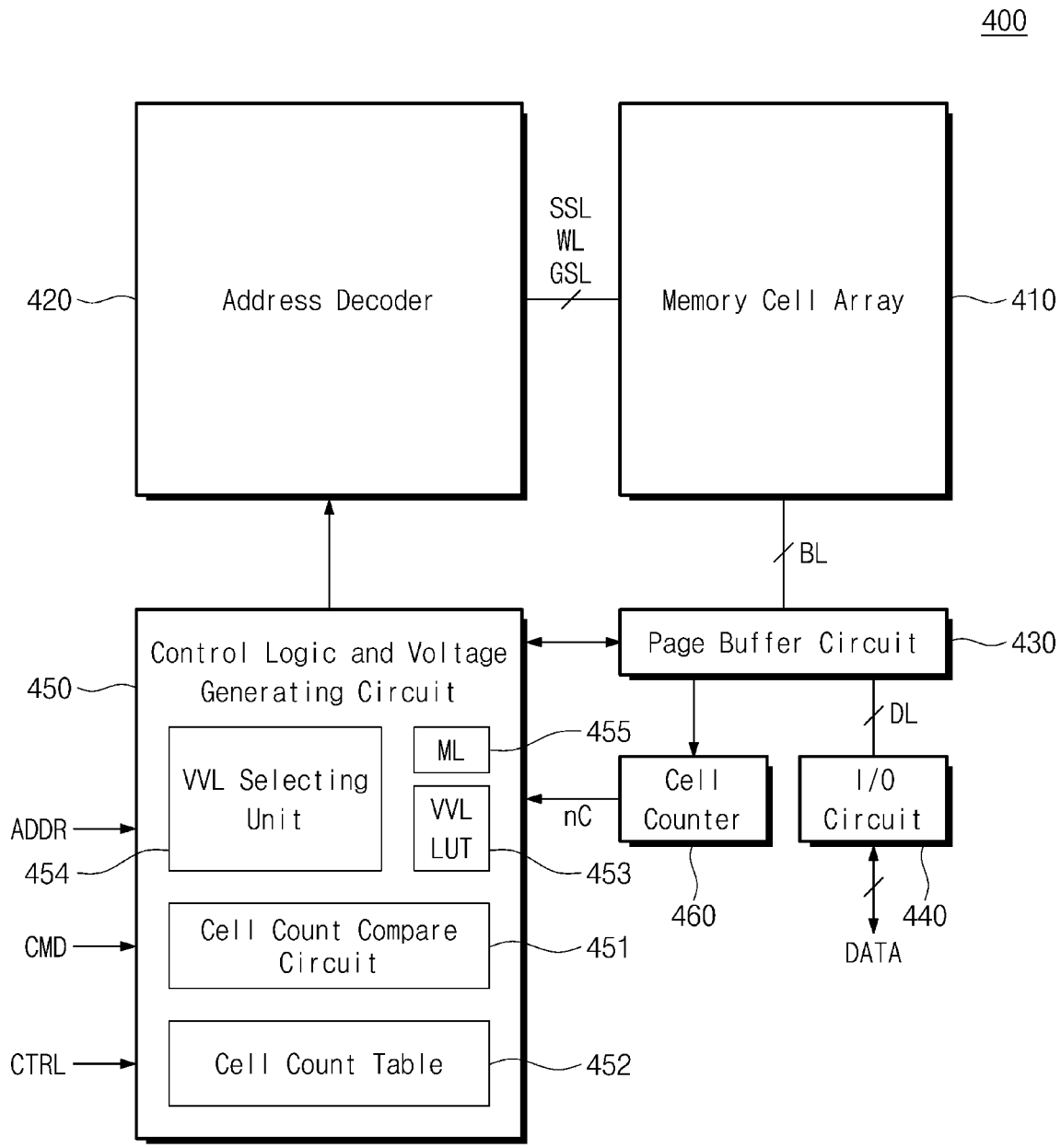
FIG. 23 is a block diagram illustrating a nonvolatile memory device according to an embodiment of the present disclosure.

FIG. 23 is a block diagram illustrating a nonvolatile memory device 400 according to an embodiment of the present disclosure. Referring to FIG. 23, the nonvolatile memory device 400 may include a memory cell array 410, an address decoder 420, a page buffer circuit 430, an input/output circuit 440, a control logic and voltage generating circuit (hereinafter referred to as a "control logic circuit") 450, and a cell counter 460. The control logic circuit 450 may include a cell count compare circuit 451, a cell count table 452, a VVL LUT 453, a VVL selecting unit 454, and machine learning logic 455.

Compared to the nonvolatile memory device 200 of FIG. 12, the control logic circuit 450 of the nonvolatile memory device 400 may further include the machine learning logic 455. The machine learning logic 455 may include a hardware configuration, a software configuration, or a hybrid configuration thereof. For example, the machine learning logic 455 may include a dedicated hardware circuit configured to perform a specific operation. Alternatively, the machine learning logic 455 may include one or more processor cores that execute an instruction set of a program code configured to perform the specific operation.

The machine learning logic 455 may compute a verify voltage level difference based on the cell count difference CCD and access environment information. As such, the machine learning logic 455 may accurately compute a verify voltage level difference to be applied to a 2-stage verify voltage. The machine learning logic 455 may provide the computed verify voltage level difference to the VVL selecting unit 454.

As described above, when the cell count difference CCD is greater than the second threshold value TH2, the nonvolatile memory device 400 may compute a verify voltage level difference based on the cell count difference CCD and the access environment information through the machine learning logic 455 and may adjust a 2-stage verify voltage with reference to the verify voltage level difference.

Figure 24:
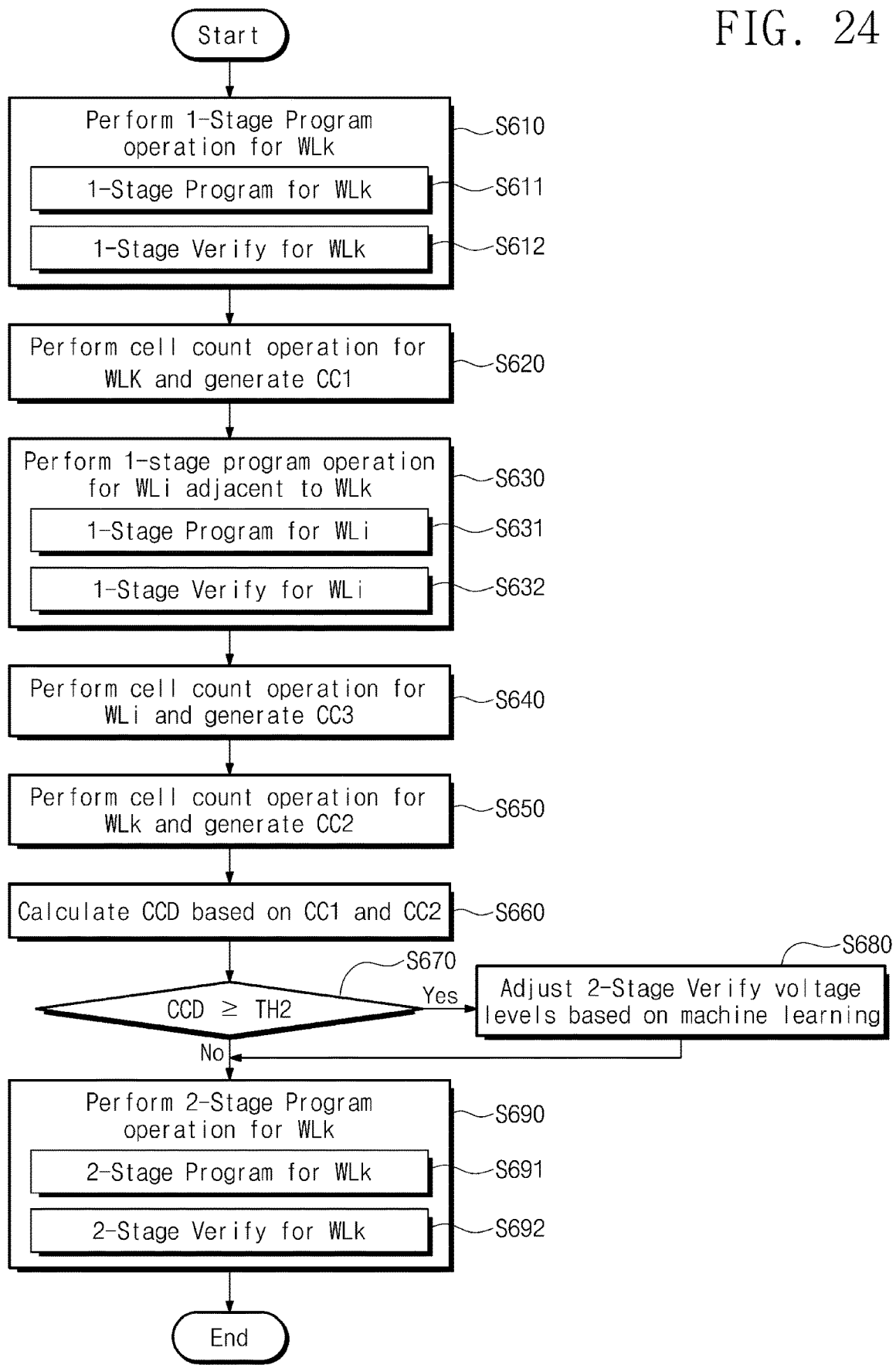
FIG. 24 illustrates an example of a program operation of a nonvolatile memory device of FIG. 23 according to example embodiments.

FIG. 24 illustrates an example of a program operation of the nonvolatile memory device 400 of FIG. 23 according to example embodiments. Referring to FIGS. 23 and 24, operation S610 to operation S670 may be performed to be the same as operation S310 to operation S370 of FIG. 15. Thus, additional description will be omitted to avoid redundancy.

In operation S680, the nonvolatile memory device 400 may adjust a 2-stage verify voltage based on the machine learning. The machine learning logic 455 may compute a verify voltage level difference based on the cell count difference CCD and access environment information. The machine learning logic 455 may provide the verify voltage level difference to the VVL selecting unit 454. The VVL selecting unit 454 may adjust 2-stage verify voltage levels based on the verify voltage level difference. Operation S690 may be performed to be the same as operation S390 of FIG. 15.

Figure 25:
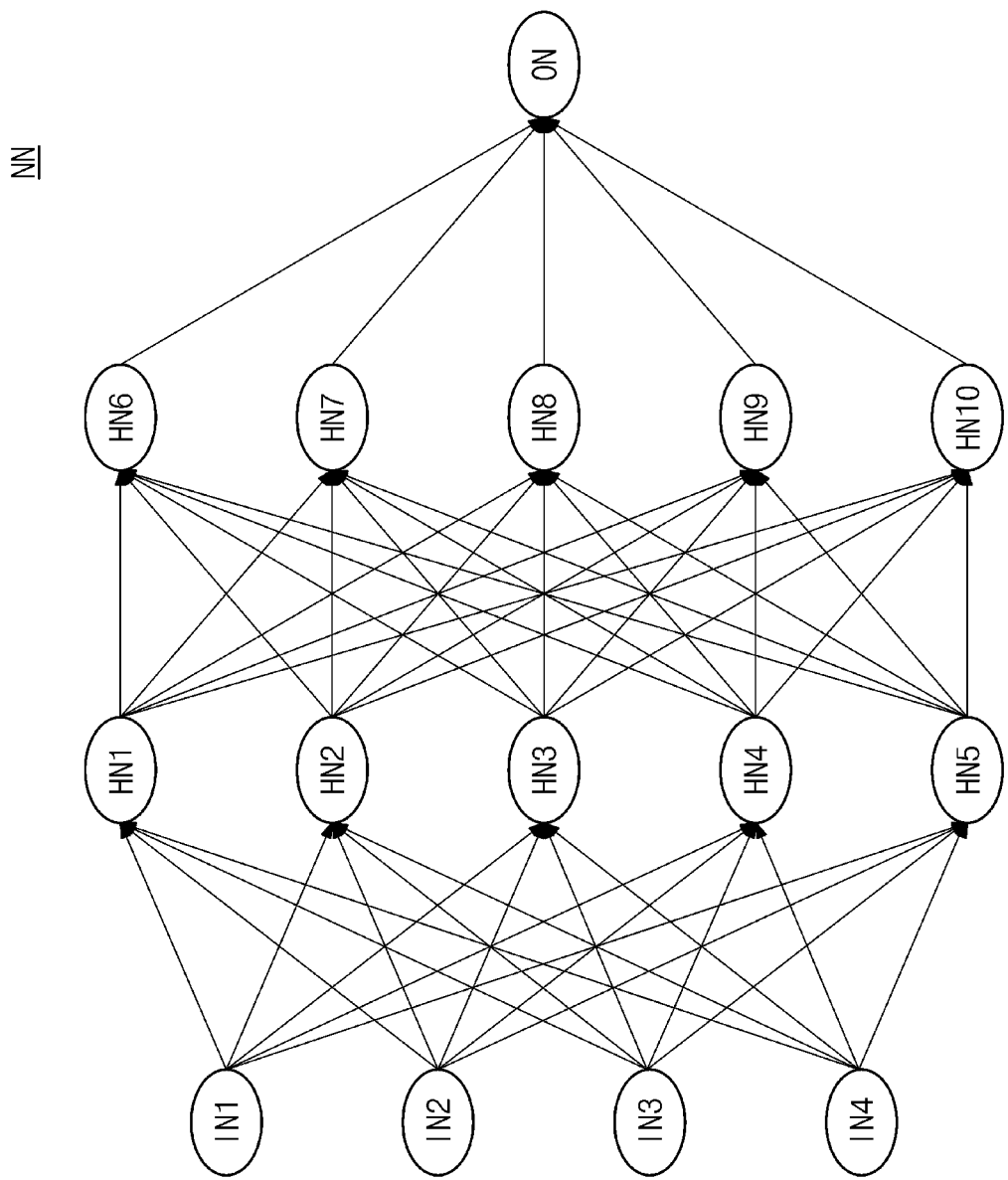
FIG. 25 illustrates a neural network capable of being used as an example of machine learning logic of FIGS. 21 and 23.

FIG. 25 illustrates a neural network NN capable of being used as an example of machine learning logic of FIGS. 21 and 23. For example, the neural network NN may include various derivative implementations such as an artificial neural network (ANN), a convolution neural network (CNN), and a recursive neural network (RNN).

Referring to FIG. 25, the neural network NN includes first to fourth input nodes IN1 to IN4, first to tenth hidden nodes HN1 to HN10, and an output node ON. The number of input nodes, the number of hidden nodes, and the number of output nodes may be determined in advance when constructing the neural network NN.

The first to fourth input nodes IN1 to IN4 form an input layer. The first to fifth hidden nodes HN1 to HN5 form a first hidden layer. The sixth to tenth hidden nodes HN6 to HN10 form a second hidden layer. The output node ON forms an output layer. The number of hidden layers may be determined in advance when constructing the neural network NN.

Data for learning or inference may be input to the first to fourth input nodes IN1 to IN4. A value of each input node is transferred to the first to fifth hidden nodes HN1 to HN5 of the first hidden layer through branches (or synapses). Each of the branches (or synapses) may be designated to have a corresponding synapse value or a corresponding weight. Each input node may perform calculation on (or may multiply) the value input thereto and the synapse value or weight of the corresponding branch (or synapse) so as to be transferred to the first hidden layer.

Each of the first to fifth hidden nodes HN1 to HN5 may perform calculation on the value input thereto and the weight (or synapse value) so as to be transferred to the sixth to tenth hidden nodes HN6 to HN10 of the second hidden layer. Each of the sixth to tenth hidden nodes HN6 to HN10 may perform calculation on the value input thereto and the weight (or synapse value) so as to be transferred to the output node ON. A value of the output node ON may indicate a learning or inference result.

At least one of the delay time DT, the cell count difference CCD, the number of program loops already performed, a level of the program voltage VPGM finally applied, and information of states completely programmed from among program states may be used as the inputs of the neural network NN.

The address ADDR, that is, a physical location of selected memory cells may be used as the inputs of the neural network NN. In an embodiment, external information, which is provided from an external device, such as the number of program/erase cycles associated with selected memory cells and a temperature may be further used as the inputs of the neural network NN. The external information may be received from the external device together with a program command.

As described above, the neural network NN may output a more accurate verify voltage level difference by using a variety of information as well as the delay time DT and the cell count difference CCD. As such, a nonvolatile memory device with improved reliability is provided.

Figure 26:
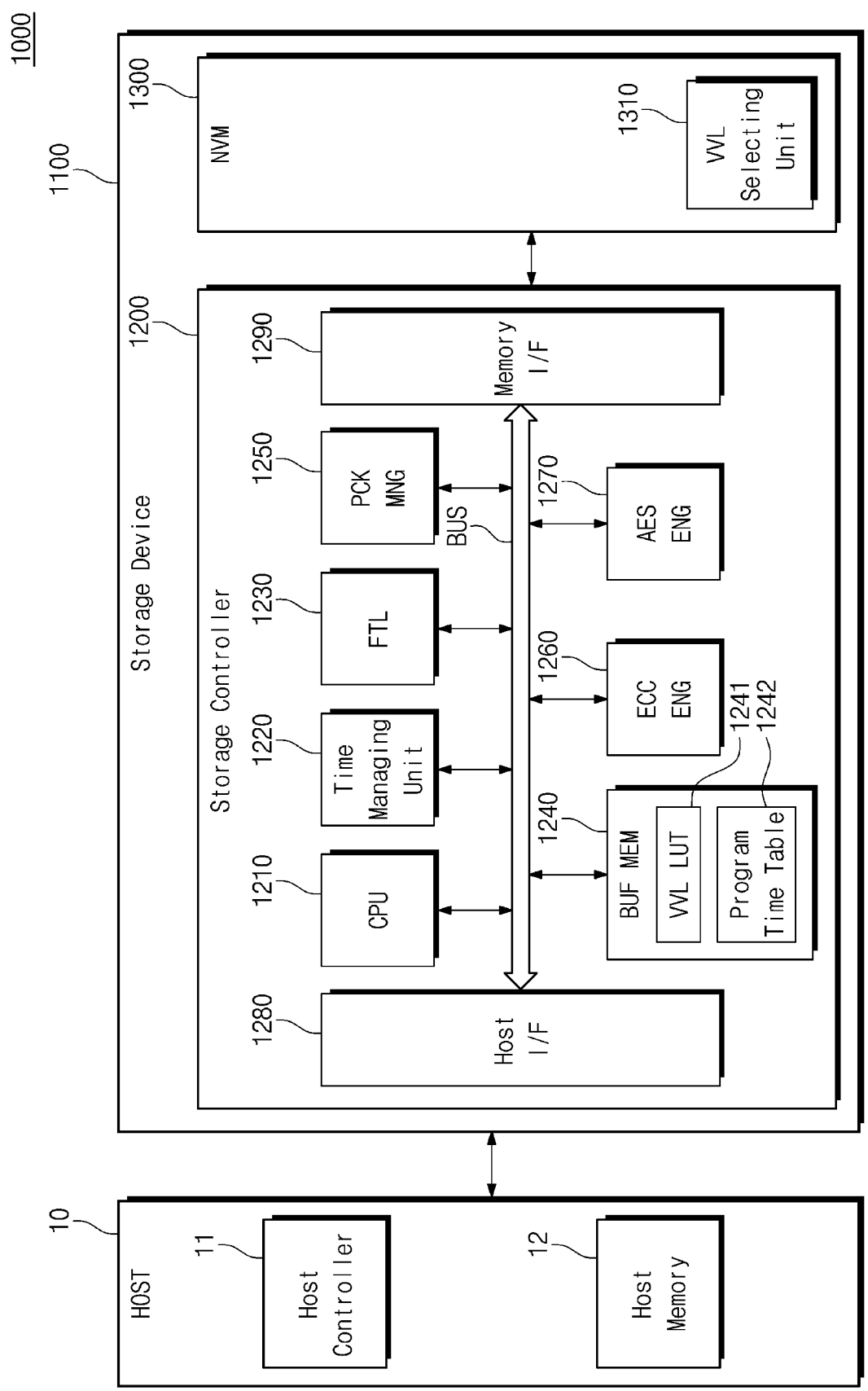
FIG. 26 is a block diagram illustrating a storage system according to an embodiment of the present disclosure.

FIG. 26 is a block diagram illustrating a memory system according to an embodiment of the present disclosure. Referring to FIG. 26, a storage system 1000 may include a host device 10 and a storage device 1100. In an embodiment, the storage system 1000 may be a mobile system such as a mobile phone, a smartphone, a tablet personal computer (PC), a wearable device, a health care device, or an Internet of things (IoT) device. In an embodiment, the storage system 1000 may be a computing device such as a personal computer, a laptop computer, a server, a media player or a system such as an automotive device including a navigation system.

The host device 10 may store data in the storage device 1100 or may read data stored in the storage device 1100. The host device 10 may include a host controller 11 and a host memory 12. The host controller 11 may be configured to control the storage device 1100. In an embodiment, the host controller 11 may communicate with the storage device 1100 through a given interface.

The host memory 12 may be a buffer memory, a working memory, or a system memory of the host device 10. For example, the host memory 12 may be configured to store a variety of information necessary for the host device 10 to operate. The host memory 12 may be used as a buffer memory for temporarily storing data to be transmitted to the storage device 1100 or data received from the storage device 1100. In an embodiment, the host memory 12 may support an access by the storage device 1100.

In an embodiment, the host controller 11 and the host memory 12 may be implemented with separate semiconductor chips. Alternatively, in an embodiment, the host controller 11 and the host memory 12 may be integrated in a single semiconductor chip or may be implemented with a multi-chip package. For example, the host controller 11 may be one of a plurality of modules that an application processor includes. The application processor may be implemented with a system on chip (SoC). The host memory 12 may be an embedded memory included in the application processor, or may be a nonvolatile memory device, a volatile memory device, or a nonvolatile memory module, or a volatile memory module disposed outside the application processor.

The storage device 1100 may be a storage medium configured to store data or to output the stored data, depending on a request of the host device 10. In an embodiment, the storage device 1100 may include at least one of a solid state drive (SSD), an embedded memory, and a removable external memory. In the case where the storage device 1100 is an SSD, the storage device 1100 may be a device complying with the non-volatile memory express (NVMe) standard. In the case where the storage device 1100 is an embedded memory or an external memory, the storage device 1100 may be a device complying with a Universal Flash Storage (UFS) or an Embedded Multi-Media Card (eMMC) standard. Each of the host device 10 and the storage device 1100 may generate a packet complying with a standard protocol applied thereto and may transmit the generated packet.

The storage device 1100 may include a storage controller 1200 and a nonvolatile memory device 1300. The storage controller 1200 may include a central processing unit (CPU) 1210, a time managing unit 1220, a flash translation layer (FTL) 1230, a buffer memory 1240, a packet manager 1250, an error correction code (ECC) engine 1260, an advanced encryption standard (AES) engine 1270, a host interface block 1280, a memory interface block 1290, and a system bus BUS. In an embodiment, each of various components included in the storage controller 1200 may be implemented as an intellectual property (IP) block or a function block, and may be implemented in the form of software, hardware, firmware, or a combination thereof.

In an embodiment, the storage device 1100 may adjust a 2-stage verify voltage level as described with reference to FIGS. 1 to 7, 8A, 8B, and 9 to 25. The storage controller 1200 may transmit a verify voltage level difference to the nonvolatile memory device 1300. The nonvolatile memory device 1300 may adjust 2-stage verify voltage levels based on the received verify voltage level difference.

The CPU 1210 may control an overall operation of the storage controller 1200. For example, the CPU 1210 may be configured to drive a variety of firmware or software running on the storage controller 1200.

The time managing unit 1220 may manage various times according to a physical characteristic of the nonvolatile memory device 1300. For example, the time managing unit 1220 may manage a program completion time or a delay time. The program completion time indicates a time (or point in time) when a program operation is completed. The delay time may indicate a difference between a completion time of the 1-stage program operation for a k-th word line and a completion time of the 1-stage program operation for a (k−1)-th word line. The time managing unit 1220 may store the completion time of the 1-stage program operation in the buffer memory 1240.

In an embodiment, the time managing unit 1220 of FIG. 26 may operate to be similar to the time managing unit 151 of FIG. 1. For example, the time managing unit 1220 may manage the completion time of the 1-stage program operation by using a program time table 1242. The time managing unit 1220 may check a time corresponding to a point in time when the 1-stage program operation for the k-th word line is completed. After the 1-stage program operation for the k-th word line is completed, the time managing unit 1220 may generate a time stamp including a current time. Alternatively, the time managing unit 1220 may generate the first time stamp TS1 corresponding to a point in time when the 1-stage program operation for the k-th word line is completed. The time managing unit 1220 may store the first time stamp TS1 in the program time table 1242 in association with the k-th word line.

The time managing unit 1220 may check a time corresponding to a point in time when the 1-stage program operation for the (k−1)-th word line is completed. After the 1-stage program operation for the k-th word line is completed, the time managing unit 1220 may generate a time stamp including a current time. Alternatively, the time managing unit 1220 may generate the second time stamp TS2 corresponding to a point in time when the 1-stage program operation for the (k−1)-th word line is completed.

The time managing unit 1220 may store the second time stamp TS2 in the program time table 1242 in association with the (k−1)-th word line.

In an embodiment, the time managing unit 1220 may calculate a transfer delay time. For example, the time managing unit 1220 may manage the transfer delay time with reference to the program time table 1242. The time managing unit 1220 may calculate a difference between the first time stamp TS1 and the second time stamp TS2 of the program time table 1242 as a delay time.

In an embodiment, when the delay time is greater than a third threshold value TH3, the time managing unit 1220 may refer to verify voltage level difference information of a VVL LUT 1241 based on the delay time. The time managing unit 1220 may transmit, to the nonvolatile memory device 1300, a program command indicating the execution of the 2-stage program operation for the k-th word line. In this case, the program command may include the verify voltage level difference information. Alternatively, the time managing unit 1220 may transmit a set feature command including the verify voltage level difference information.

In an embodiment, the CPU 1210 and the time managing unit 1220 are illustrated as being separate function blocks, but the present disclosure is not limited thereto. For example, each of the CPU 1210 and the time managing unit 1220 may be implemented with an independent processor core. Alternatively, the CPU 1210 and the time managing unit 1220 may be implemented with one processor core or may be implemented with a multi-core processor including a plurality of processor cores.

The FTL 1230 may perform various maintenance operations for efficiently using the nonvolatile memory device 1300. For example, the maintenance operations may include an address mapping operation, a wear-leveling operation, a garbage collection operation, etc.

The address mapping operation may refer to an operation of making translation or mapping between a logical address managed by the host device 10 and a physical address of the nonvolatile memory device 1300.

The wear-leveling operation may refer to an operation of uniformizing a frequency at which a plurality of memory blocks included in the nonvolatile memory device 1300 are used or the number of times that the plurality of memory blocks are used, and may be implemented through a firmware technology for balancing erase counts of physical blocks or through hardware. In an embodiment, as each of the plurality of memory blocks of the nonvolatile memory device 1300 is uniformly used through the wear-leveling operation, a specific memory block may be prevented from being excessively degraded, and thus, a lifetime of the nonvolatile memory device 1300 may be improved.

The garbage collection operation may refer to an operation of securing an available memory block or a free memory block by copying valid data of a source memory block of the nonvolatile memory device 1300 to a target memory block thereof and then erasing the source memory block.

In an embodiment, the FTL 1230 may be implemented in the form of software or firmware and may be stored in the buffer memory 1240 or in a separate working memory (not illustrated). The CPU 1210 may perform the maintenance operations described above, by driving the FTL 1230 stored in the buffer memory 1240 or the separate working memory (not illustrated). In an embodiment, the FTL 1230 may be implemented through various hardware automation circuits configured to perform the maintenance operations described above. That is, the FTL 1230 may be implemented with hardware, and the maintenance operations described above may be performed through the hardware.

The buffer memory 1240 may be used as a buffer memory or a working memory of the storage controller 1200. For example, the buffer memory 1240 may temporarily store data received from the host device 10 or the nonvolatile memory device 1300. Alternatively, the buffer memory 1240 may be configured to store a variety of information or a program code necessary for the storage controller 1200 to operate. The CPU 1210 may perform various operations based on the information or the program code stored in the buffer memory 1240.

The buffer memory 1240 may include the VVL LUT 1241 and the program time table 1242. The program time table 1242 may include a program completion time associated with a word line. The VVL LUT 1241 may include mapping information about 2-stage verify voltage level differences according to delay times.

For brevity of drawing and for convenience of description, an example in which the buffer memory 1240 is included in the storage controller 1200 is illustrated in FIG. 26, but the present disclosure is not limited thereto. The buffer memory 1240 may be a separate memory module or memory device located outside the storage controller 1200. The storage controller 1200 may further include a memory controller (not illustrated) configured to control the memory module or memory device located on the outside.

The packet manager 1250 may be configured to parse a packet received from the host device 10 or to generate a packet for data to be transmitted to the host device 10. In an embodiment, the packet may be generated based on an interface protocol between the host device 10 and the storage device 1100.

The ECC engine 1260 may perform an error detection and correction function on data read from the nonvolatile memory device 1300. For example, the ECC engine 1260 may generate parity bits with respect to write data to be stored in the nonvolatile memory device 1300. The parity bits thus generated may be stored in the nonvolatile memory device 1300 together with the write data. Afterwards, in the case of reading data from the nonvolatile memory device 1300, the ECC engine 1260 may correct an error of the read data by using the read data and the corresponding parity bits and may output the error-corrected read data.

The AES engine 1270 may perform at least one of an encryption operation and a decryption operation on data input to the storage controller 1200 by using a symmetric-key algorithm.

The storage controller 1200 may communicate with the host device 10 through the host interface block 1280. Below, to describe embodiments of the present disclosure easily, it is assumed that the host interface block 1280 supports an interface complying with the NVMe standard. However, the present disclosure is not limited thereto. For example, the host interface block 1280 may be configured to support at least one of various interfaces such as an ATA (Advanced Technology Attachment) interface, an SATA (Serial ATA) interface, an e-SATA (external SATA) interface, an SCSI (Small Computer Small Interface) interface, an SAS (Serial Attached SCSI) interface, a PCI (Peripheral Component Interconnection) interface, a PCIe (PCI express) interface, an IEEE 1394 interface, an USB (Universal Serial Bus) interface, an SD (Secure Digital) card interface, an MMC (Multi-Media Card) interface, an eMMC (embedded Multi-Media Card) interface, an UFS (Universal Flash Storage) interface, an eUFS (embedded Universal Flash Storage) interface, and a CF (Compact Flash) card interface.

The storage controller 1200 may communicate with the nonvolatile memory device 1300 through the memory interface block 1290. In an embodiment, the memory interface block 1290 may be configured to support a flash interface such as a Toggle interface or an open NAND flash interface (ONFI). However, the present disclosure is not limited thereto.

Various components included in the storage controller 1200 may communicate with each other through the system bus BUS. The system bus BUS may include various system buses such as an Advanced System Bus (ASB), an Advanced Peripheral Bus (APB), an Advanced High Performance Bus (AHB), and an Advanced eXtensible Interface (AXI) bus.

Under control of the storage controller 1200, the nonvolatile memory device 1300 may be configured to store data, to output the stored data, or to erase the stored data. In an embodiment, the nonvolatile memory device 1300 may be a two-dimensional or three-dimensional NAND flash memory device, but the present disclosure is not limited thereto. For example, the nonvolatile memory device 1300 may be a Magnetic RAM (MRAM), a Spin-Transfer Torque MRAM (SST-MRAM), a Conductive bridging RAM (CBRAM), a Ferroelectric RAM (FeRAM), a Phase RAM (PRAM), a Resistive RAM (RRAM), or a memory device that is based on various kinds of memories different from each other. In an embodiment, the nonvolatile memory device 1300 may include a plurality of nonvolatile memories, each of which is implemented with an independent chip or an independent package. The storage controller 1200 may communicate with the plurality of nonvolatile memories of the nonvolatile memory device 1300 through a plurality of channels.

In an embodiment, the nonvolatile memory device 1300 may include a VVL selecting unit 1310. The nonvolatile memory device 1300 may receive a second program command including verify voltage level difference information from the storage controller 1200. Alternatively, the nonvolatile memory device 1300 may receive a set feature command including the verify voltage level difference information from the storage controller 1200.

The nonvolatile memory device 1300 may adjust a 2-stage verify voltage associated with the data corresponding to the first program command based on the received verify voltage level difference information. As such, the nonvolatile memory device 1300 may perform the 2-stage verify step based on the 2-stage verify voltage(s) whose voltage level(s) is adjusted.

Figure 27:
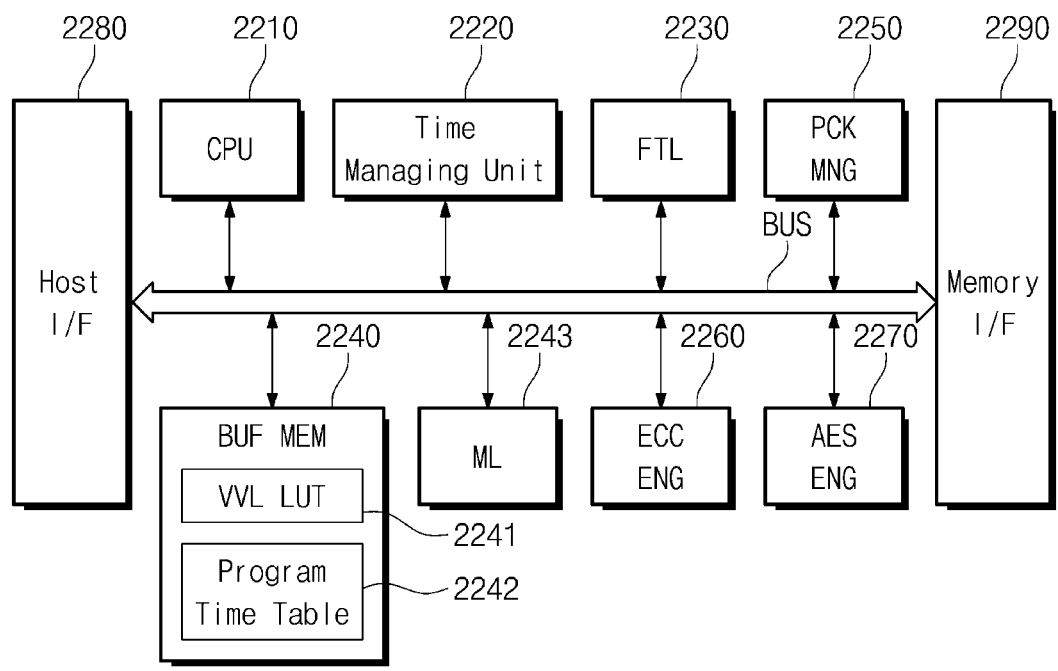
FIG. 27 is a block diagram illustrating a configuration of a storage controller of FIG. 26 according to example embodiments.

FIG. 27 is a block diagram illustrating a configuration of a storage controller of FIG. 26 according to example embodiments. Referring to FIGS. 26 and 27, a storage controller 2200 may include a CPU 2210, a time managing unit 2220, a FTL 2230, a buffer memory 2240, a packet manager 2250, an ECC engine 2260, an AES engine 2270, a host interface block 2280, a memory interface block 2290, a system bus BUS, and machine learning logic 2243. The buffer memory 2240 may include a VVL LUT 2241 and a program time table 2242.

In an embodiment, the buffer memory 2240 may be configured to store data to be used by the machine learning logic 2243 or to store a program code for an application to be driven by the machine learning logic 2243. The machine learning logic 2243 may execute the program code stored in the buffer memory 2240 or may perform various computations (or operations) on data stored in the buffer memory 2240.

Compared with the storage controller 1200 of FIG. 26, the storage controller 2200 may further include the machine learning logic 2243. The machine learning logic 2243 may be configured to perform various computations (or operations) to be processed on the storage controller 2200 or to drive an application or computation program running on the storage controller 2200. In an embodiment, the machine learning logic 2243 may be configured to perform various data processing operations such as a convolution operation for machine learning. The machine learning logic 2243 may compute a verify voltage level difference based on a delay time and access environment information. The machine learning logic 2243 is similar to or the same as the machine learning logic 355 of FIG. 21, and thus, additional description will be omitted to avoid redundancy. The storage controller 2200 may transmit the computed verify voltage level difference to the nonvolatile memory device 1300.

Figure 28:
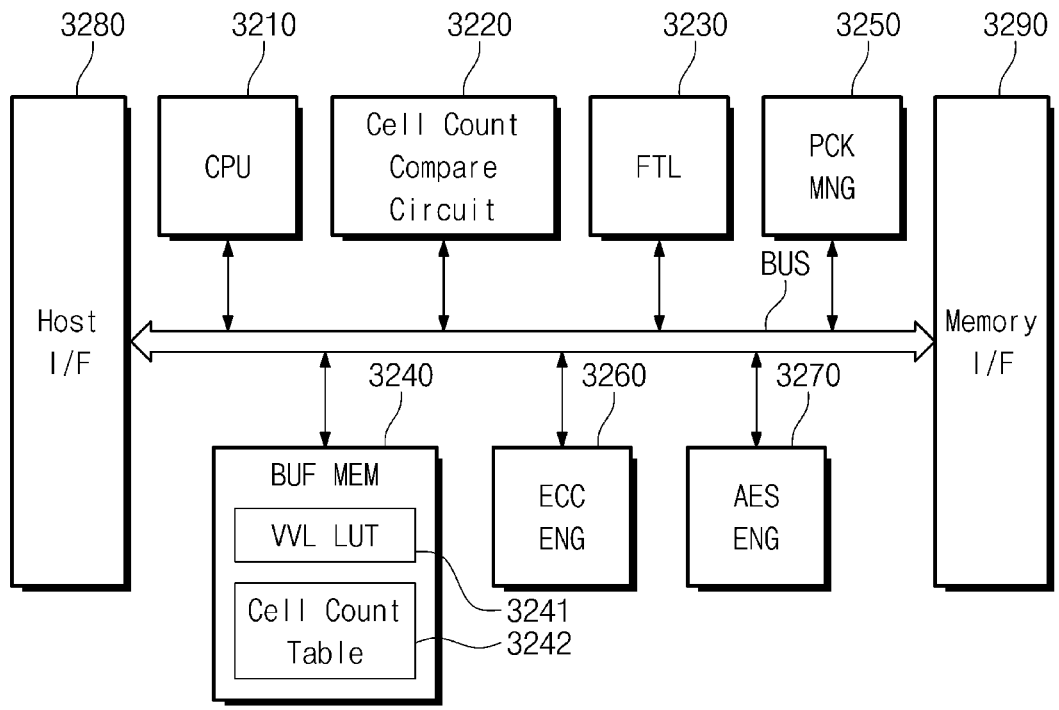
FIG. 28 is a block diagram illustrating a configuration of a storage controller of FIG. 26 according to example embodiments.

FIG. 28 is a block diagram illustrating a configuration of a storage controller of FIG. 26 according to example embodiments. Referring to FIGS. 26 and 28, a storage controller 3200 may include a CPU 3210, a cell count compare circuit 3220, a FTL 3230, a buffer memory 3240, a packet manager 3250, an ECC engine 3260, an AES engine 3270, a host interface block 3280, a memory interface block 3290, and a system bus BUS. The buffer memory 3240 may include a VVL LUT 3241 and a cell count table 3242. The VVL LUT 3241 may include mapping information about 2-stage verify voltage level differences according to the cell count differences CCD. The cell count table 3242 may include a cell count of each of a plurality of word lines.

In an embodiment, the cell count compare circuit 3220 may transmit a program command indicating the 1-stage program operation for the k-th word line and may then transmit a get feature command requesting an off-cell count (or on-cell count) of the k-th word line obtained based on a specific read voltage (e.g., the uppermost read voltage). The cell count compare circuit 3220 may receive the first cell count CC1 being the off-cell count from the nonvolatile memory device 1300. The cell count compare circuit 3220 may store the first cell count CC1 in the cell count table 3242 in association with the k-th word line.

The cell count compare circuit 3220 may transmit the program command indicating the 1-stage program operation for the (k−1)-th word line and may then transmit the get feature command requesting an off-cell count of the (k)-th word line obtained based on the specific read voltage (e.g., the uppermost read voltage). The cell count compare circuit 3220 may receive the second cell count CC2 being the off-cell count from the nonvolatile memory device 1300. The cell count compare circuit 3220 may calculate the cell count difference CCD based on the first cell count CC1 and the second cell count CC2.

When the cell count difference CCD is greater than a fourth threshold value TH4, the cell count compare circuit 3220 may refer to verify voltage level difference information of the VVL LUT 3241 based on the cell count difference CCD. The cell count compare circuit 3220 may transmit the set feature command including the verify voltage level difference information to the nonvolatile memory device 1300. Alternatively, the cell count compare circuit 3220 may transmit, to the nonvolatile memory device 1300, the program command indicating the 2-stage program operation for the k-th word line. In this case, the program command may include the verify voltage level difference information.

The nonvolatile memory device 1300 may perform the cell count operation in response to the get feature command requesting the off-cell count. The nonvolatile memory device 1300 may transmit the cell count to the storage controller 3200. In response to the set feature command including the verify voltage level difference information, the nonvolatile memory device 1300 may adjust a 2-stage verify voltage for data corresponding to a first program command based on the verify voltage level difference information. As such, the nonvolatile memory device 1300 may perform the 2-stage verify step based on the 2-stage verify voltage(s) whose voltage level(s) is adjusted.

Figure 29:
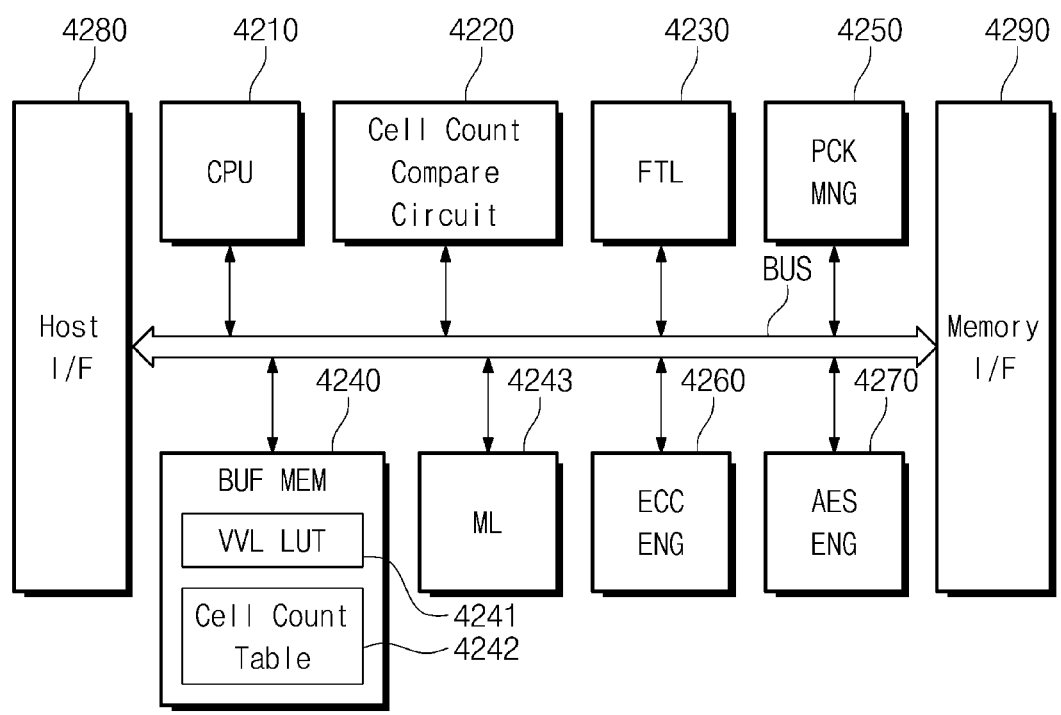
FIG. 29 is a block diagram illustrating a configuration of a storage controller of FIG. 26 according to example embodiments.

FIG. 29 is a block diagram illustrating a configuration of a storage controller of FIG. 26 according to example embodiments. Referring to FIGS. 26 and 29, a storage controller 4200 may include a CPU 4210, a cell count compare circuit 4220, a FTL 4230, a buffer memory 4240, a packet manager 4250, an ECC engine 4260, an AES engine 4270, a host interface block 4280, a memory interface block 4290, a system bus BUS, and machine learning logic 4243. The buffer memory 4240 may include a VVL LUT 4241 and a cell count table 4242.

Compared with the storage controller 3200 of FIG. 28, the storage controller 4200 may further include the machine learning logic 4243. The machine learning logic 4243 may compute a verify voltage level difference based on the cell count difference CCD and access environment information. The storage controller 4200 may transmit a computed verify voltage level difference to the nonvolatile memory device 1300. The machine learning logic 4243 is similar to or the same as the machine learning logic 455 of FIG. 23, and thus, additional description will be omitted to avoid redundancy.

As described above, a storage controller may refer to or calculate a verify voltage level difference based on a delay time or a cell count difference. The storage controller may transmit the verify voltage level difference to a nonvolatile memory device. The nonvolatile memory device may adjust a 2-stage verify voltage level(s) based on the verify voltage level difference.

Figure 30:
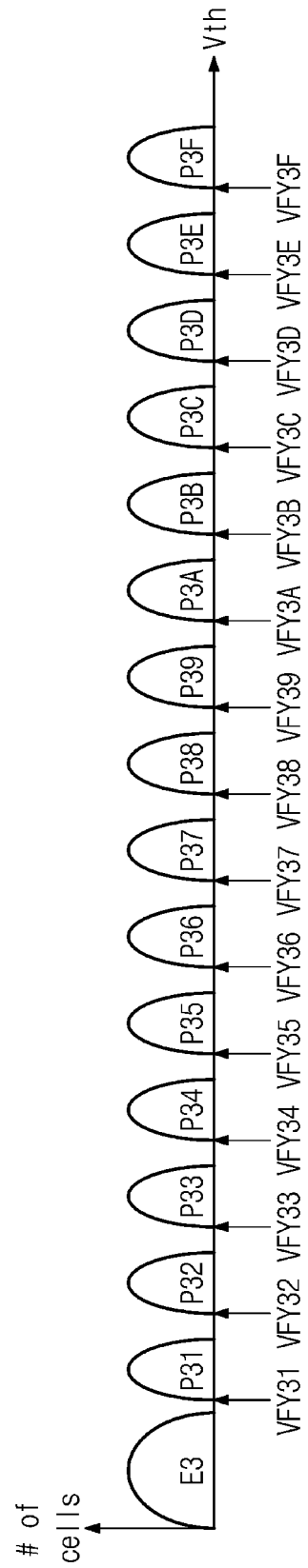
FIG. 30 is a distribution diagram illustrating threshold voltage distributions of memory cells according to an embodiment of the present disclosure.

FIG. 30 is a distribution diagram illustrating threshold voltage distributions of memory cells according to an embodiment of the present disclosure. That each memory cell of the nonvolatile memory device 100 or 200 is a TLC storing 3-bit data is assumed in FIGS. 3, 4, 8A, 8B, 13, and 17. However, the present disclosure is not limited thereto. For example, each memory cell of the nonvolatile memory device 100 or 200 may be a quadruple level cell (QLC) storing 4-bit data.

Each memory cell of the nonvolatile memory device 100 or 200 may be programmed to have one of an erase state E3 and first to fifteenth program states P31 to P39 and P3A to P3F. As in the above description, the nonvolatile memory device 100 or 200 may perform the 2-stage verify step based on first to fifteenth verify voltages VFY31 to VFY39 and VFY3A to VFY3F. That is, the nonvolatile memory device 100 or 200 may adjust the 2-stage verify voltages VFY31 to VFY39 and VFY3A to VFY3F based on the delay time DT or the cell count difference CCD, as described with reference to FIGS. 1 to 7, 8A, 8B, and 9 to 29.

FIGS. 31A to 31D are diagrams for describing a program method of a nonvolatile memory device according to an embodiment of the present disclosure. A shadow program operation of a nonvolatile memory device will be described with reference to FIGS. 31A to 31D.

For example, the nonvolatile memory device may receive a first command CM1, a first address ADD1, a first page PD1, and a second command CM2 from a memory controller. The first and second commands CM1 and CM2 may constitute a command set for the shadow program operation. The first address ADD1 may indicate a physical address (i.e., a selected word line) for the first page PD1. The first page PD1 may indicate one page. In an embodiment, as described above, three pages may be stored at one word line. That is, one page may indicate one of three pages (e.g., an LSB page, a CSB page, and an MSB page) that are stored at one word line.

Figures 31B, 31C:
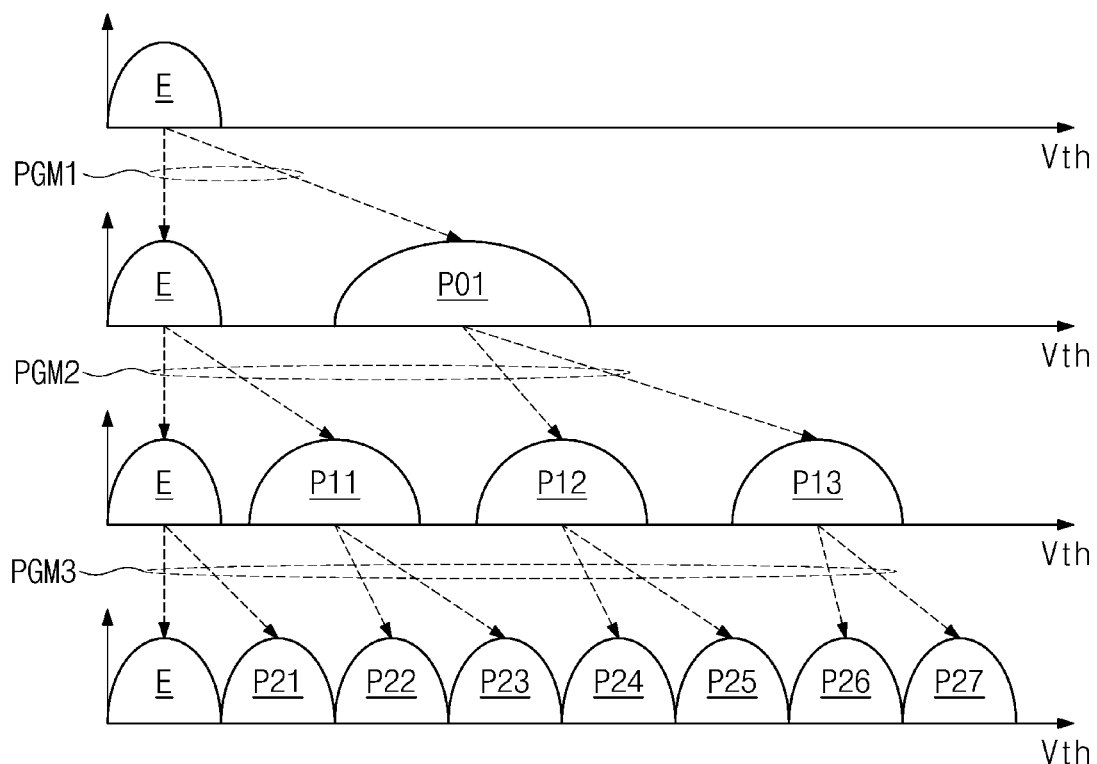

After the first command CM1, the first address ADD1, the first page PD1, and the second command CM2 are received, during the program time tPROG, the nonvolatile memory device may perform a first program operation PGM1 on the selected word line. For example, as illustrated in FIG. 31B, the first program operation PGM1 may indicate a program operation that is performed based on the first page PD1 such that memory cells having the erase state "E" from among memory cells of the selected word line have one of the erase state "E" and a program state P01.

Afterwards, the nonvolatile memory device may receive the first command CM1, a second address ADD2, a second page PD2, and the second command CM2. The nonvolatile memory device may perform a second program operation PGM2 during the program time tPROG in response to the received signals. As illustrated in FIG. 31B, the second program operation PGM2 may indicate a program operation that is performed based on the first and second pages PD1 and PD2 such that memory cells having the erase state "E" from among the memory cells of the selected word line have one of the erase state "E" and a program state P11 and memory cells of the program state P01 have one of program states P12 and P13. That is, after the second program operation PGM2 is completed, the memory cells of the selected word line may store the first and second pages PD1 and PD2.

Afterwards, the nonvolatile memory device may receive the first command CM1, a third address ADD3, a third page PD3, and the second command CM2. The nonvolatile memory device may perform a third program operation PGM3 during the program time tPROG in response to the received signals. As illustrated in FIG. 31B, the third program operation PGM3 may indicate a program operation that is performed based on the first, second, and third pages PD1, PD2, and PD3 such that memory cells having the erase state "E" have one of the erase state "E" and a program state P21, memory cells having the program state P11 have one of a program state P22 and a program state P23, memory cells having the program state P12 have one of a program state P24 and a program state P25, and memory cells having the program state P13 have one of a program state P26 and a program state P27.

In an embodiment, when the program operation is performed on the selected word line, memory cells connected to a word line adjacent to the selected word line may degrade due to the coupling caused by a program voltage being a high voltage. To prevent the degradation of memory cells, the nonvolatile memory device may perform program operations on a plurality of word lines in a program sequence illustrated in FIG. 31C. For example, the nonvolatile memory device may perform the first program operation PGM1 on the first word line WL1. Afterwards, the nonvolatile memory device may sequentially perform program operations in the following sequence: the second program operation PGM2 for the second word line WL2, the second program operation PGM2 for the first word line WL1, the first program operation PGM1 for the third word line WL3, the second program operation PGM2 for the second word line WL2, and the third program operation PGM3 for the first word line WL1. When the third program operation PGM3 for the first word line WL1 is completed, each of memory cells connected to the first word line WL1 may store 3-bit data.

As described above, the degradation of memory cells may decrease by controlling the sequence of program operations associated with a plurality of word lines. In an embodiment, an order of a program operation corresponding to each of a plurality of word lines may be designated by an address (e.g., ADD1, ADD2, and ADD3) provided from the memory controller. That is, the memory controller may provide the nonvolatile memory device with an address corresponding to a word line targeted for a program operation, based on the program sequence described above.

As described above, the nonvolatile memory device receives one page and an address and programs the page at a word line (i.e., a selected word line) corresponding to the address; afterwards, the nonvolatile memory device receives a different page and a different address and programs the different page at a word line (i.e., a different selected word line) corresponding to the different address.

In other words, the nonvolatile memory device performs a page receiving operation and a program operation (e.g., PGM1, PGM2, or PGM3), in the unit of page. In detail, as illustrated in FIG. 31C, at least six program sequences may be required to store all the three pages at the first word line WL1.

Figure 31D:
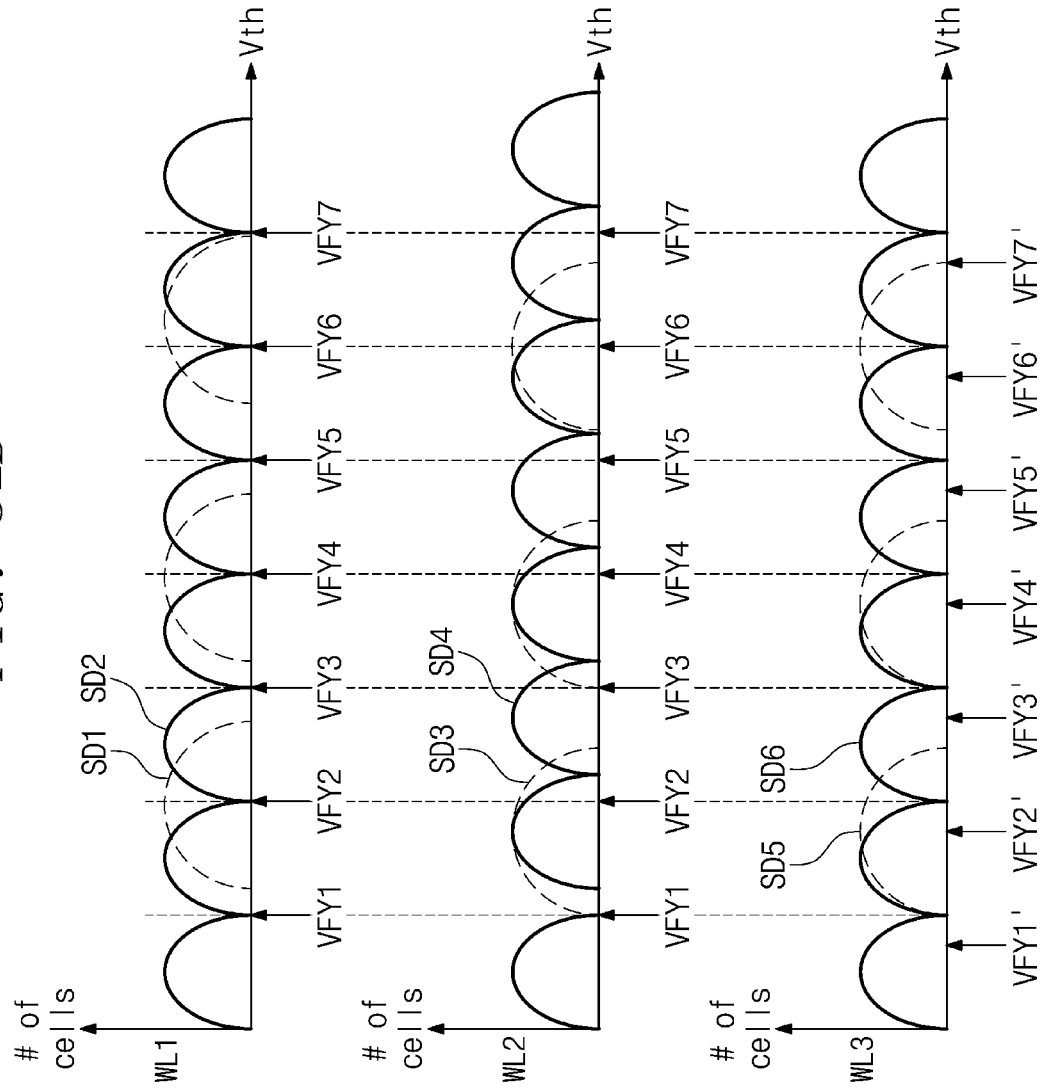

A method for adjusting a verify voltage of the third program operation PGM3 will be described with reference to FIG. 31D. As in the reprogram operation, a delay time may occur between the first program operation PGM1 and the second program operation PGM2, or a delay time may occur between the second program operation PGM2 and the third program operation PGM3. In FIG. 31D, it is assumed that the delay time occurs between the second program operation PGM2 and the third program operation PGM3. For example, a shadow delay time may indicate a delay time occurring between the second program operation PGM2 and the third program operation PGM3.

It is assumed that the first to third program operations PGM1 to PGM3 of each of the first to third word lines WL1 to WL3 are completed. It is assumed that a shadow delay time smaller than a fifth threshold value TH5 occurs with regard to the first word line WL1 and a shadow delay time greater than the fifth threshold value TH5 occurs with regard to the second and third word lines WL2 and WL3. For convenience of description, it is assumed that the nonvolatile memory device 100 applies default verify voltages to the second word line WL2 in the third program operation PGM3 and applies new verify voltages having adjusted voltage levels to the third word line WL3 in the third program operation PGM3.

In each distribution diagram, a dotted line indicates distributions of memory cells before the third program operation PGM3, a solid line indicates distributions of the memory cells after the third program operation PGM3. For example, a first shadow distribution SD1 indicates a distribution of memory cells of the first word line WL1 before the third program operation PGM3; a second shadow distribution SD2 indicates a distribution of the memory cells of the first word line WL1 after the third program operation PGM3; a third shadow distribution SD3 indicates a distribution of memory cells of the second word line WL2 before the third program operation PGM3; a fourth shadow distribution SD4 indicates a distribution of the memory cells of the second word line WL2 after the third program operation PGM3; a fifth shadow distribution SD5 indicates a distribution of memory cells of the third word line WL3 before the third program operation PGM3; a sixth shadow distribution SD6 indicates a distribution of the memory cells of the third word line WL3 after the third program operation PGM3.

The nonvolatile memory device 100 may apply default verify voltages VFY1 to VFY7 to the first and second word lines WL1 and WL2 and may apply new verify voltages VFY1' to VFY7' having adjusted voltage levels to the third word line WL3. For example, the adjusted level of the new verify voltage VFY1' may be lower than the level of the default verify voltage VFY1 corresponding thereto, and the adjusted levels of the remaining new verify voltages VFY2' to VFY7' may be lower than the levels of the default verify voltages VFY2 to VFY7 corresponding thereto.

In the case of the first word line WL1, because the shadow delay time is smaller than the fifth threshold value TH5, the nonvolatile memory device 100 may apply the default verify voltages to the first word line WL1 in the third program operation PGM3. The second shadow distribution SD2 may be formed as intended.

In the case of the second word line WL2, because the shadow delay time is greater than the fifth threshold value TH5, the third shadow distribution SD3 may be shifted in a direction in which a threshold voltage decreases, compared to the first shadow distribution SD1. In this state, when the default verify voltages VFY1 to VFY7 are applied, the fourth shadow distribution SD4 may be shifted in a direction in which a threshold voltage increases, compared to the second shadow distribution SD2.

In the case of the third word line WL3, because the shadow delay time is greater than the fifth threshold value TH5, like the third shadow distribution SD3, the fifth shadow distribution SD5 may be shifted in a direction in which a threshold voltage decreases, compared to the first shadow distribution SD1. In the third program operation PGM3, the nonvolatile memory device 100 may apply, to the third word line WL3, the new verify voltages VFY1' to VFY7' whose voltage levels are adjusted. As such, like the second shadow distribution SD2, the sixth shadow distribution SD6 may be formed as intended. In other words, the shadow delay time of the third word line WL3 may be greater than the fifth threshold value TH5 like the second word line WL2, but unlike the fourth shadow distribution SD4, the sixth shadow distribution SD6 may be formed as intended.

The nonvolatile memory device 100 may adjust a verify voltage level in the third program operation PGM3 based on the shadow delay time. Alternatively, when a cell count difference is greater than a sixth threshold value TH6, the nonvolatile memory device 100 may adjust the verify voltage level in the third program operation PGM3 based on the cell count difference.

Figure 32:
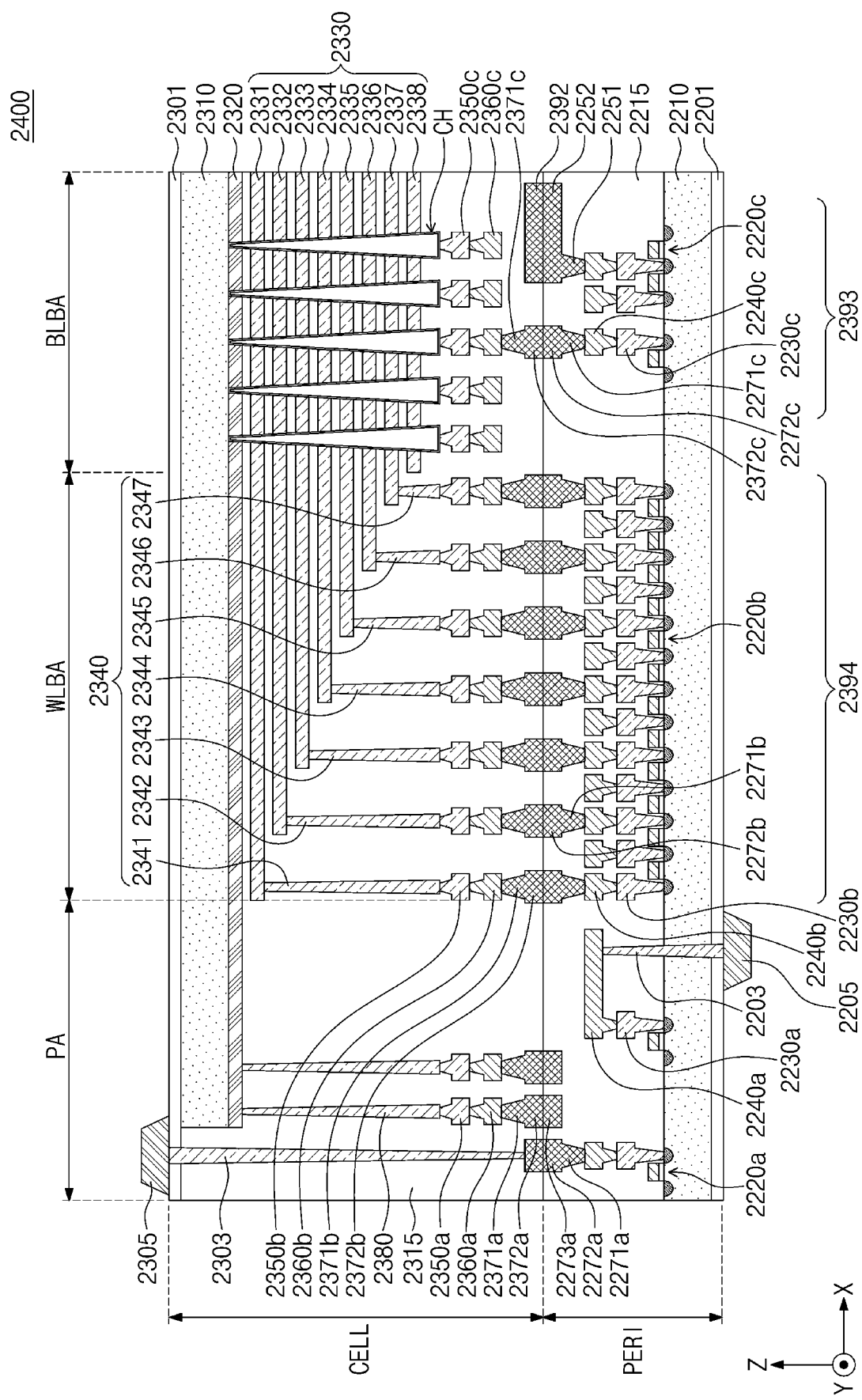
FIG. 32 is a cross-sectional view illustrating a nonvolatile memory device according to an example embodiment of the present disclosure.

FIG. 32 is a cross-sectional view illustrating a nonvolatile memory device according to an embodiment of the present disclosure. Referring to FIG. 32, a nonvolatile memory device 2400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer different from the first wafer, and then connecting the upper chip and the lower chip in a bonding manner. For example, the bonding manner may include a manner of electrically connecting a bonding metal formed on an uppermost metal layer of the upper chip and a bonding metal formed on an uppermost metal layer of the lower chip. For example, in the case where the bonding metal is formed of copper (Cu), the bonding manner may be a Cu-to-Cu bonding manner. Alternatively, the bonding metal may be formed of aluminum (Al) or tungsten (W).

Each of the peripheral circuit region PERI and the cell region CELL of the nonvolatile memory device 2400 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. Each of the circuit elements 2220a, 2220b, and 2220c may include one or more transistors. In an embodiment, the first metal layers 2230a, 2230b, and 2230c may be formed of tungsten having a relatively high resistance, and the second metal layers 2240a, 2240b, and 2240c may be formed of copper having a relatively low resistance.

In the specification, even though the first metal layers 2230a, 2230b, and 2230c and the second metal layers 2240a, 2240b, and 2240c are shown and described, the first metal layers 2230a, 2230b, and 2230c and the second metal layers 2240a, 2240b, and 2240c are not limited thereto, and one or more metal layers may be further formed on the second metal layers 2240a, 2240b, and 2240c. At least a part of the one or more metal layers formed on the second metal layers 2240a, 2240b, and 2240c may be formed of aluminum or the like having a lower resistance than that of copper forming the second metal layers 2240a, 2240b, and 2240c.

The interlayer insulating layer 2215 may be disposed on the first substrate 2210 to cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to upper bonding metals 2371b and 2372b of the cell region CELL by Cu—Cu bonding. The lower bonding metals 2271b and 2272b and the upper bonding metals 2371b and 2372b may be formed of aluminum, copper, or tungsten.

Also, the upper bonding metals 2371b and 2372b in the cell region CELL may be referred as "first metal pads", and the lower bonding metals 2271b and 2272b in the peripheral circuit region PERI may be referred as "second metal pads". Further, the first metal pads and the second metal pads may be connected to each other in the bonding manner.

The cell region CELL may include at least one memory block. The cell region CELL may include a second substrate 2310, an interlayer insulating layer 2315, and a common source line 2320. On the second substrate 2310, a plurality of word lines 2331 to 2338 (i.e., 2330) may be stacked in a direction (i.e., a Z-axis direction) perpendicular to an upper surface of the second substrate 2310. String selection lines and a ground selection line may be arranged on and below the plurality of word lines 2330, respectively, and the plurality of word lines 2330 may be disposed between the string selection lines and the ground selection lines.

Widths of the plurality of word lines 2330 in the X-axis direction may be different. As a distance from the first substrate 2210 of the peripheral circuit region PERI increases, the widths of the plurality of word lines 2330 gradually increase. Likewise, as a distance from the second substrate 2310 of the cell region CELL increases, the widths of the plurality of word lines 2330 gradually decrease.

In the bit line bonding area BLBA, a channel structure CH may extend in a direction perpendicular to the upper surface of the second substrate 2310 and may pass through the plurality of word lines 2330, the string selection lines, and the ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit line contact, and the second metal layer 2360c may be a bit line. In an embodiment, the bit line 2360c may extend in a first direction (i.e., a Y-axis direction) parallel to the upper surface of the second substrate 2310.

The interlayer insulating layer 2315 may be disposed on the second substrate 2310 to cover the common source line 2320, the plurality of word lines 2330, a plurality of cell contact plugs 2340, first metal layers 2350a, 2350b, and 2350c, and second metal layers 2360a, 2360b, and 2360c. The interlayer insulating layer 2315 may include an insulating material such as silicon oxide, silicon nitride, or the like.

In an embodiment illustrated in FIG. 32, an area in which the channel structure CH, the bit line 2360c, and the like are disposed may be defined as the bit line bonding area BLBA. In the bit line bonding area BLBA, the bit line 2360c may be electrically connected to the circuit elements 2220c constituting a page buffer 2393 in the peripheral circuit region PERI. For example, the bit line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word line bonding area WLBA, the plurality of word lines 2330 may extend in a second direction (i.e., an X-axis direction), which is perpendicular to the first direction and parallel to the upper surface of the second substrate 2310, and may be connected to a plurality of cell contact plugs 2341 to 2347 (i.e., 2340). The word lines 2330 and the cell contact plugs 2340 may be connected to each other at pads provided by at least some of the plurality of word lines 2330, which extend in the second direction with different lengths. The first metal layer 2350b and the second metal layer 2360b may be sequentially connected to an upper portion of each of the cell contact plugs 2340 connected to the word lines 2330. The cell contact plugs 2340 may be connected to the peripheral circuit region PERI by the upper bonding metals 2371b and 2372b of the cell region CELL and the lower bonding metals 2271b and 2272b of the peripheral circuit region PERI in the word line bonding area WLBA.

The cell contact plugs 2340 may be electrically connected to the circuit elements 2220b constituting a row decoder 2394 in the peripheral circuit region PERI. In an embodiment, operating voltages of the circuit elements 2220b constituting the row decoder 2394 may be different than operating voltages of the circuit elements 2220c constituting the page buffer 2393. For example, operating voltages of the circuit elements 2220c constituting the page buffer 2393 may be greater than operating voltages of the circuit elements 2220b constituting the row decoder 2394.

A common source line contact plug 2380 may be disposed in the external pad bonding area PA. The common source line contact plug 2380 may be formed of a conductive material such as a metal, a metal compound, polysilicon, or the like and may be electrically connected to the common source line 2320. The first metal layer 2350a and the second metal layer 2360a may be sequentially stacked on an upper portion of the common source line contact plug 2380. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. Referring to FIG. 32, a lower insulating film 2201 covering a lower surface of the first substrate 2210 may be formed below the first substrate 2210, and the first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203 and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

Referring to FIG. 32, an upper insulating film 2301 covering the upper surface of the second substrate 2310 may be formed on the second substrate 2310, and the second input/output pad 2305 may be disposed on the upper insulating film 2301. The second input/output pad 2305 may be connected to at least one of the plurality of circuit elements 2220a, 2220b, and 2220c disposed in the peripheral circuit region PERI through a second input/output contact plug 2303 and lower bonding metals 2271a and 2272a of the peripheral circuit region PERI. In an embodiment, the second input/output pad 2305 may be electrically connected to the circuit element 2220a.

According to embodiments, the second substrate 2310 and the common source line 2320 may not be disposed in an area in which the second input/output contact plug 2303 is disposed. Also, the second input/output pad 2305 may not overlap the word lines 2330 in the third direction (i.e., the Z-axis direction). Referring to FIG. 32, the second input/output contact plug 2303 may be separated from the second substrate 2310 in a direction parallel to the upper surface of the second substrate 2310, may pass through the interlayer insulating layer 2315 of the cell region CELL, and may be connected to the second input/output pad 2305.

According to embodiments, the first input/output pad 2205 and the second input/output pad 2305 may be selectively formed. For example, the nonvolatile memory device 2400 may include only the first input/output pad 2205 disposed on the first substrate 2210 or the second input/output pad 2305 disposed on the second substrate 2310. Alternatively, the nonvolatile memory device 2400 may include both the first input/output pad 2205 and the second input/output pad 2305.

In each of the external pad bonding area PA and the bit line bonding area BLBA respectively included in the cell region CELL and the peripheral circuit region PERI, a metal pattern in the uppermost metal layer may be provided as a dummy pattern, or the uppermost metal layer may be absent.

In the external pad bonding area PA, the nonvolatile memory device 2400 may include a lower metal pattern 2273a in the uppermost metal layer of the peripheral circuit region PERI, and the lower metal pattern 2273a may correspond to an upper metal pattern 2372a formed in the uppermost metal layer of the cell region CELL and may have the same shape as the upper metal pattern 2372a of the cell region CELL. In the peripheral circuit region PERI, the lower metal pattern 2273a formed in the uppermost metal layer of the peripheral circuit region PERI may not be connected to a contact. As in the above description, in the external pad bonding area PA, an upper metal pattern that corresponds to the lower metal pattern 2273a formed in the uppermost metal layer of the peripheral circuit region PERI and has the same shape as the lower metal pattern 2273a of the peripheral circuit region PERI may be formed in the uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371b and 2372b of the cell region CELL by the bonding manner.

Also, in the bit line bonding area BLBA, an upper metal pattern 2392 that corresponds to a lower metal pattern 2252 formed in the uppermost metal layer of the peripheral circuit region PERI and has the same shape as the lower metal pattern 2252 of the peripheral circuit region PERI may be formed in the uppermost metal layer of the cell region CELL. A contact may not be formed on the upper metal pattern 2392 formed in the uppermost metal layer of the cell region CELL.

In an embodiment, a memory cell array or a memory block described with reference to FIGS. 1, 2, 12, 21, and 23 may be included in the cell region CELL. Peripheral circuits (e.g., an address decoder, a page buffer circuit, an input/output circuit, and a control logic circuit) described with reference to FIGS. 1, 12, 19, 21, and 23 may be included in the peripheral circuit region PERI.

As described above, the address decoder, the voltage generator, and the voltage ramper may be included in the peripheral circuit region PERI and may perform the read operation described with reference to FIGS. 1, 12, 19, 21, and 23. For example, a slope of a voltage that is applied to an unselected word line of a memory block included in the cell region CELL may be adjusted. A pre-pulse phase associated with the selected word line of the memory block included in the cell region CELL may be different from a pre-pulse phase of a plurality of selection lines of the memory block included in the cell region CELL. For example, a nonvolatile memory device with improved performance is provided.

In an example embodiment, the nonvolatile memory device 2400, such as described in FIG. 32, can operate and can include device components according to one or more of the example embodiments described in FIGS. 1 to 7, 8A, 8B, and 9 to 30, and 31A to 31D previously.

In the above embodiments, components according to the present disclosure are described by using the terms "first", "second", "third", etc. However, the terms "first", "second", "third", etc. may be used to distinguish components from each other and do not limit the present disclosure. For example, the terms "first", "second", "third", etc. do not involve an order or a numerical meaning of any form.

In the above embodiments, components according to embodiments of the present disclosure are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP).

According to an embodiment of the present disclosure, a nonvolatile memory device may adjust a verify voltage level based on a delay time or a cell count difference. Accordingly, an operation method of a nonvolatile memory device having improved reliability is provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An operation method of a nonvolatile memory device which includes a plurality of memory blocks, each of the plurality of memory blocks including a plurality of strings connected between a bit line and a common source line, each of the plurality of strings including a plurality of memory cells connected in series, and the plurality of memory cells are respectively connected to a plurality of word lines stacked in a direction perpendicular to a substrate, the method comprising:
performing a 1-stage program operation on a first word line of the plurality of word lines, the 1-stage program operation on the first word line including:
a 1-stage program step in which a program voltage is applied to the first word line, and
a 1-stage verify step in which at least one 1-stage verify voltage of a plurality of 1-stage verify voltages is applied to the first word line after performing the 1-stage program step on the first word line;
storing a first time stamp indicating a time at which the 1-stage program operation for the first word line is completed;
after performing the 1-stage program operation, performing the 1-stage program operation on a second word line adjacent to the first word line, the 1-stage program operation on the second word line including:
the 1-stage program step in which a program voltage is applied to the second word line, and
the 1-stage verify step the second word line in which at least one 1-stage verify voltage of a plurality of 1-stage verify voltages is applied to the second word line after performing the 1-stage program step on the second word line;
storing a second time stamp indicating a time at which the 1-stage program operation for the second word line is completed;
calculating a delay time based on the first time stamp and the second time stamp;
determining whether the delay time is greater than or equal to a threshold value;
when it is determined that the delay time is greater than or equal to the threshold value, adjusting at least one 2-stage verify voltage of a plurality of 2-stage verify voltages associated with the first word line from a first voltage level to a second voltage level smaller than the first voltage level based on the delay time; and
after performing the 1-stage program operation on the second word line, performing a 2-stage program operation on the first word line, the 2-stage program operation on the first word line including:
a 2-stage program step in which a program voltage is applied to the first word line, and
a 2-stage verify step in which the adjusted at least one 2-stage verify voltage is applied to the first word line after performing the 2-stage program step on the first word line,
wherein a level of the at least one 1-stage verify voltage is lower than the second voltage level of the adjusted at least one 2-stage verify voltage corresponding to the at least one 1-stage verify voltage.

2. The method of claim 1, wherein at least one memory cell connected to the first word line has one of an erase state and a plurality of program states by performing the 1-stage program operation and the 2-stage program operation,
wherein the plurality of 2-stage verify voltages include a first verify voltage and a second verify voltage,
wherein the first verify voltage is a reference voltage corresponding to a first program state of the plurality of program states and the second verify voltage is a reference voltage corresponding to a second program state different from the first program state,
wherein, when it is determined that the delay time is greater than the threshold value, a magnitude of a voltage level difference of the first verify voltage is different from a magnitude of a voltage level difference of the second verify voltage, and
wherein the voltage level difference of the first or second verify voltage is a difference between one of the plurality of 2-stage verify voltages and a corresponding one of the adjusted 2-stage verify voltages.

3. The method of claim 2, wherein the second verify voltage of the second program state is greater than the first verify voltage of the first program state, and
wherein, when it is determined that the delay time is greater than the threshold value, the magnitude of the voltage level difference of the second verify voltage is greater than or equal to the magnitude of the voltage level difference of the first verify voltage.

4. The method of claim 1, wherein the adjusting of the at least one 2-stage verify voltage for the first word line from the first voltage level to the second voltage level includes:
determining the second voltage level based on the delay time and a location of the first word line.

5. The method of claim 1, wherein the threshold value is a first reference time, further comprising:
when the delay time is greater than or equal to the first reference time and is smaller than a second reference time, adjusting the at least one 2-stage verify voltage for the first word line from the first voltage level to the second voltage level; and
when the delay time is greater than or equal to the second reference time, adjusting the at least one 2-stage verify voltage for the first word line from the first voltage level to a third voltage level lower than the second voltage level and higher than the level of the at least one 1-stage verify voltage.

6. The method of claim 1, wherein the adjusting of the at least one 2-stage verify voltage for the first word line from the first voltage level to the second voltage level includes:
referring to a verify voltage level look-up table including mapping information of the delay time and a 2-stage verify voltage level difference between the first voltage level and the second voltage level.

7. The method of claim 1, wherein the adjusting of the at least one 2-stage verify voltage for the first word line from the first voltage level to the second voltage level includes:
computing, by machine learning logic, a 2-stage verify voltage level difference between the first voltage level and the second voltage level based on the delay time and access environment information; and adjusting the at least one 2-stage verify voltage for the first word line from the first voltage level to the second voltage level based on the computed 2-stage verify voltage level difference.

8. The method of claim 7, wherein the access environment information includes at least one of a location of a target block including the first word line, a location of a target string selection line corresponding to the first word line, a location of the first word line, an operating temperature of the nonvolatile memory device, the number of program/erase cycles, and a cell count.

9. The method of claim 1, wherein the adjusting of the at least one 2-stage verify voltage for the first word line from the first voltage level to the second voltage level includes:
adjusting a develop period during which a voltage level of a sensing node connected to a memory cell connected to the first word line is changed through the bit line based on the delay time.

10. The method of claim 1, wherein the adjusting of the at least one 2-stage verify voltage for the first word line from the first voltage level to the second voltage level includes:
adjusting a level of a read pass voltage to be applied to unselected memory cells based on the delay time.

11. The method of claim 1, wherein the adjusting of the at least one 2-stage verify voltage for the first word line from the first voltage level to the second voltage level includes:
adjusting a precharge voltage level of the bit line connected to a memory cell connected to the first word line based on the delay time.

12. The method of claim 1, wherein the adjusting of the at least one 2-stage verify voltage for the first word line from the first voltage level to the second voltage level includes:
adjusting a precharge time of the bit line connected to a memory cell connected to the first word line based on the delay time.

13. The method of claim 1, wherein the performing of the 1-stage program operation on the first word line includes:
performing a 1-stage shallow erase step on the first word line during a shallow erase period after the 1-stage verify step is completed, and
wherein the 1-stage shallow erase step includes:
applying a word line erase voltage to the first word line;
floating unselected word lines, a string selection line connected to a first cell string including a memory cell connected to the first word line, and a ground selection line connected to the first cell string; and
applying a shallow erase voltage smaller than the word line erase voltage to the bit line connected to the first cell string and the common source line connected to the first cell string.

14. An operation method of a nonvolatile memory device which includes a plurality of memory blocks, each of the plurality of memory blocks including a plurality of strings connected between a bit line and a common source line, each of the plurality of strings includes a plurality of memory cells connected in series, and the plurality of memory cells are respectively connected to a plurality of word lines stacked in a direction perpendicular to a substrate, the method comprising:
performing a 1-stage program operation on a first word line of the plurality of word lines, the 1-stage program operation on the first word line including:
a 1-stage program step in which a program voltage is applied to the first word line, and
a 1-stage verify step in which at least one 1-stage verify voltage of a plurality of 1-stage verify voltages is applied to the first word line after performing the 1-stage program step on the first word line;
after performing the 1-stage program operation on the first word line, generating and storing a first cell count by performing an off-cell count operation on the first word line based on a reference voltage corresponding to an uppermost program state;
after performing the 1-stage program operation on the first word line, performing the 1-stage program operation on a second word line adjacent to the first word line, the 1-stage program operation on the second word line including:
the 1-stage program step in which a program voltage is applied to the second word line, and
the 1-stage verify step in which at least one 1-stage verify voltage of a plurality of 1-stage verify voltages is applied to the second word line after performing the 1-stage program step on the second word line;
after performing the 1-stage program operation on the second word line, generating and storing a third cell count by performing the off-cell count operation on the second word line based on the reference voltage;
after performing the 1-stage program operation on the second word line, generating and storing a second cell count by performing the off-cell count operation on the first word line based on the reference voltage;
calculating a cell count difference based on the first cell count and the second cell count;
determining whether the cell count difference is greater than or equal to a threshold value;
when it is determined that the cell count difference is greater than or equal to the threshold value, adjusting at least one 2-stage verify voltage of a plurality of 2-stage verify voltages associated with the first word line from a first voltage level to a second voltage level smaller than the first voltage level based on the cell count difference; and
after performing the 1-stage program operation on the second word line, performing a 2-stage program operation on the first word line, the 2-stage program operation on the first word line including:
a 2-stage program step in which a program voltage is applied to the first word line, and
a 2-stage verify step in which the adjusted at least one 2-stage verify voltage is applied to the first word line after performing the 2-stage program step on the first word line,
wherein a level of the at least one 1-stage verify voltage is lower than the second voltage level of the adjusted at least one 2-stage verify voltage corresponding to the at least one 1-stage verify voltage.

15. The method of claim 14, wherein at least one memory cell connected to the first word line has one of an erase state and a plurality of program states by performing the 1-stage program operation and the 2-stage program operation,
wherein the plurality of 2-stage verify voltages include a first verify voltage and a second verify voltage,
wherein the first verify voltage is a reference voltage corresponding to a first program state of the plurality of program states and the second verify voltage is a reference voltage corresponding to a second program state different from the first program state,
wherein, when it is determined that the cell count difference is greater than the threshold value, a magnitude of a voltage level difference of the first verify voltage is different from a magnitude of a voltage level difference of the second verify voltage, and wherein the voltage level difference of the first or second verify voltage is a difference between one of the plurality of 2-stage verify voltages and a corresponding one of the adjusted 2-stage verify voltages.

16. The method of claim 15, wherein the second verify voltage of the second program state is greater than the first verify voltage of the first program state, and wherein, when it is determined that the cell count difference is greater than the threshold value, the magnitude of the voltage level difference of the second verify voltage is greater than or equal to the magnitude of the voltage level difference of the first verify voltage.

17. The method of claim 14, wherein the adjusting of the at least one 2-stage verify voltage for the first word line from the first voltage level to the second voltage level includes:

referring to a verify voltage level look-up table including mapping information of the cell count difference and a 2-stage verify voltage level difference between the first voltage level and the second voltage level.

18. The method of claim 14, wherein the adjusting of the at least one 2-stage verify voltage for the first word line from the first voltage level to the second voltage level includes:

computing, by machine learning logic, a 2-stage verify voltage level difference between the first voltage level and the second voltage level based on the cell count difference and access environment information; and adjusting the at least one 2-stage verify voltage for the first word line from the first voltage level to the second voltage level based on the computed 2-stage verify voltage level difference.

19. The method of claim 14, wherein the reference voltage is a first reference voltage, wherein the generating and storing of the first cell count includes:

generating a fourth cell count by performing a cell count operation on the first word line based on a second reference voltage different from the first reference voltage, wherein the generating and storing of the second cell count includes:

generating a fifth cell count by performing the cell count operation on the first word line based on the second reference voltage, and wherein the adjusting of the at least one 2-stage verify voltage for the first word line from the first voltage level to the second voltage level includes:

adjusting the at least one 2-stage verify voltage for the first word line from the first voltage level to the second voltage level further based on the fourth and fifth cell counts.

20. An operation method of a nonvolatile memory device which includes a plurality of memory blocks, each of the plurality of memory blocks including a plurality of strings connected between a bit line and a common source line, each of the plurality of strings including a plurality of memory cells connected in series, and the plurality of memory cells are respectively connected to a plurality of word lines stacked in a direction perpendicular to a substrate, the method comprising:

performing a 1-stage program operation on a first word line of the plurality of word lines, the 1-stage program operation on the first word line including:

a 1-stage program step in which a program voltage is applied to the first word line, a 1-stage verify step in which at least one 1-stage verify voltage of a plurality of 1-stage verify voltages is applied to the first word line after performing the 1-stage program step on the first word line, and a 1-stage shallow erase step in which a word line erase voltage is applied to the first word line after performing the 1-stage verify step on the first word line;

storing a first time stamp indicating a time at which the 1-stage program operation for the first word line is completed;

after performing the 1-stage program operation on the first word line, performing the 1-stage program operation on a second word line adjacent to the first word line, the 1-stage program operation on the second word line including:

the 1-stage program step in which a program voltage is applied to the second word line, the 1-stage verify step in which at least one 1-stage verify voltage of a plurality of 1-stage verify voltages is applied to the second word line after performing the 1-stage program step on the second word line, and the 1-stage shallow erase step in which a word line erase voltage is applied to the second word line after performing the 1-stage verify step on the second word line;

storing a second time stamp indicating a time at which the 1-stage program operation for the second word line is completed;

calculating a delay time based on the first time stamp and the second time stamp;

determining whether the delay time is greater than or equal to a threshold value;

when it is determined that the delay time is greater than or equal to the threshold value, adjusting at least one 2-stage verify voltage of a plurality of 2-stage verify voltages associated with the first word line from a first voltage level to a second voltage level lower than the first voltage level based on the delay time; and after performing the 1-stage program operation on the second word line, performing a 2-stage program operation on the first word line, the 2-stage program operation on the first word line including:

a 2-stage program step in which a program voltage is applied to the first word line, and a 2-stage verify step in which the adjusted at least one 2-stage verify voltage is applied to the first word line after performing the 2-stage program step on the first word line, wherein a level of the at least one 1-stage verify voltage is lower than the second voltage level of the adjusted at least one 2-stage verify voltage corresponding to the at least one 1-stage verify voltage.

* * * * *